United States Patent
Stegers et al.

(10) Patent No.: US 9,030,236 B2
(45) Date of Patent: May 12, 2015

(54) PHASE DETECTOR

(75) Inventors: Marc Gerardus Maria Stegers, Berkel en Rodenrijs (NL); Arie Van Staveren, Hazerswoude-Dorp (NL)

(73) Assignee: National Semiconductor Corporation, Santa Clara, CA (US)

( * ) Notice: Subject to any disclaimer, the term of this patent is extended or adjusted under 35 U.S.C. 154(b) by 432 days.

(21) Appl. No.: 13/206,138

(22) Filed: Aug. 9, 2011

(65) Prior Publication Data
US 2013/0038351 A1    Feb. 14, 2013

(51) Int. Cl.
*H03D 13/00* (2006.01)
*H03H 11/16* (2006.01)
*H03K 5/13* (2014.01)

(52) U.S. Cl.
CPC ................... *H03D 13/007* (2013.01)

(58) Field of Classification Search
CPC .................................. H03K 5/26; G01R 25/00
USPC ...................................... 327/3, 240
See application file for complete search history.

(56) References Cited

U.S. PATENT DOCUMENTS

| | | | | |
|---|---|---|---|---|
| 6,054,883 A | * | 4/2000 | Ishihara | 327/255 |
| 7,206,360 B2 | * | 4/2007 | Ichihara | 375/317 |
| 7,386,286 B2 | * | 6/2008 | Petrovic et al. | 455/165.1 |
| 7,633,325 B2 | * | 12/2009 | Kim et al. | 327/254 |
| 7,952,408 B2 | * | 5/2011 | Eisenstadt et al. | 327/231 |
| 8,138,798 B2 | * | 3/2012 | Nedovic et al. | 327/3 |
| 2003/0030478 A1 | * | 2/2003 | Gilbert | 327/348 |

* cited by examiner

*Primary Examiner* — Lincoln Donovan
*Assistant Examiner* — Colleen O Toole
(74) *Attorney, Agent, or Firm* — Andrew Viger; Frank D. Cimino

(57) ABSTRACT

A phase detection system for providing a phase signal indicative of a phase difference between first and second input signals, with the system including a pair of amplification channels for receiving the input signals, with each channel including a plurality of amplifier stages. The outputs of the two amplification channels are connected to the inputs of a multiplier arrangement, with the arrangement producing an uncompensated phase signal. Compensation circuitry is provided to receive a magnitude signal indicative of the relative magnitudes of the two input signals, with the magnitude signal being used to produce a corrected phase signal indicative of the phase difference between the two input signals.

10 Claims, 43 Drawing Sheets

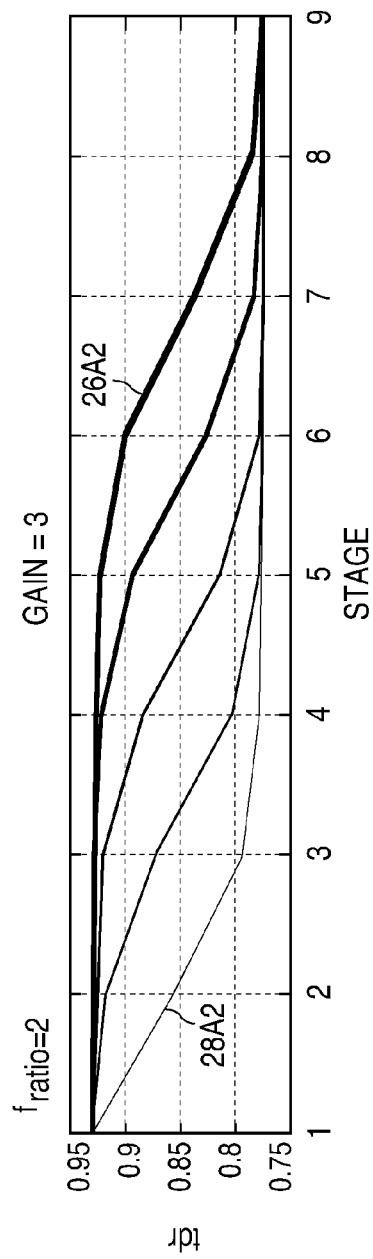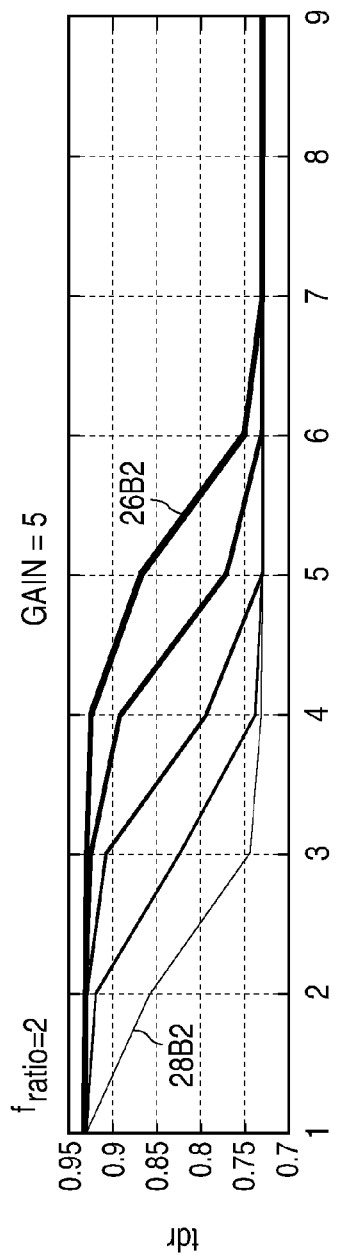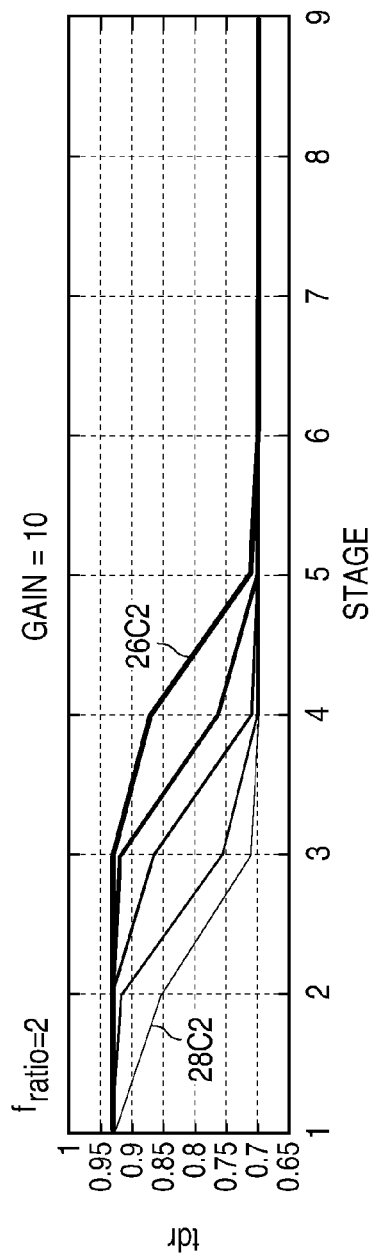

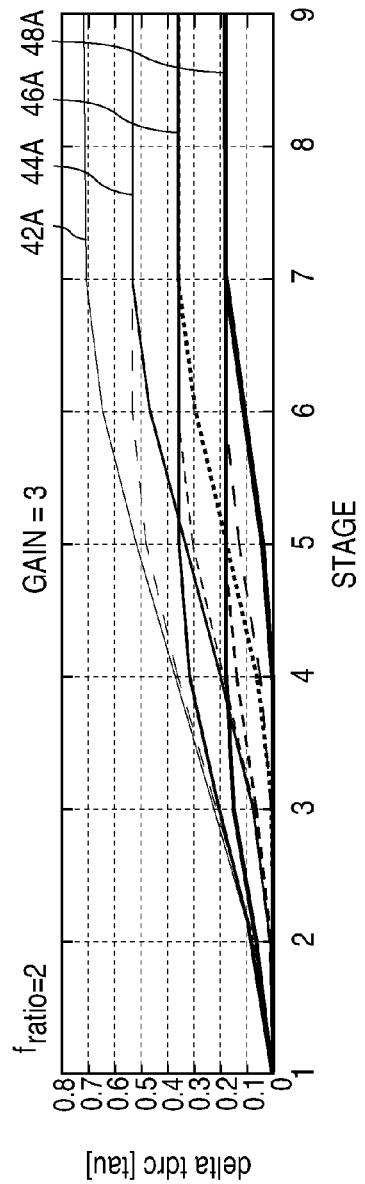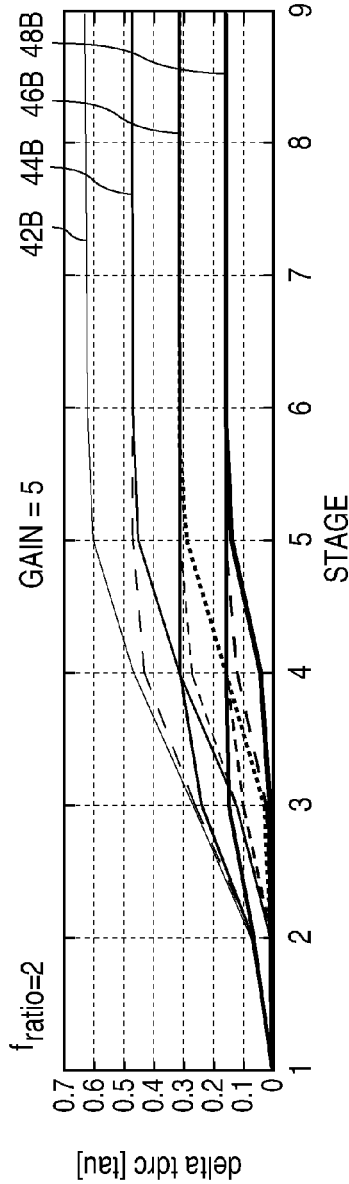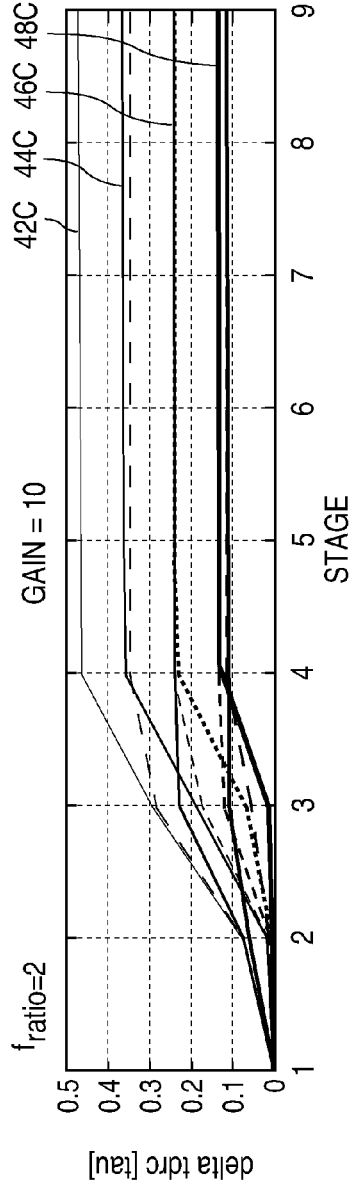

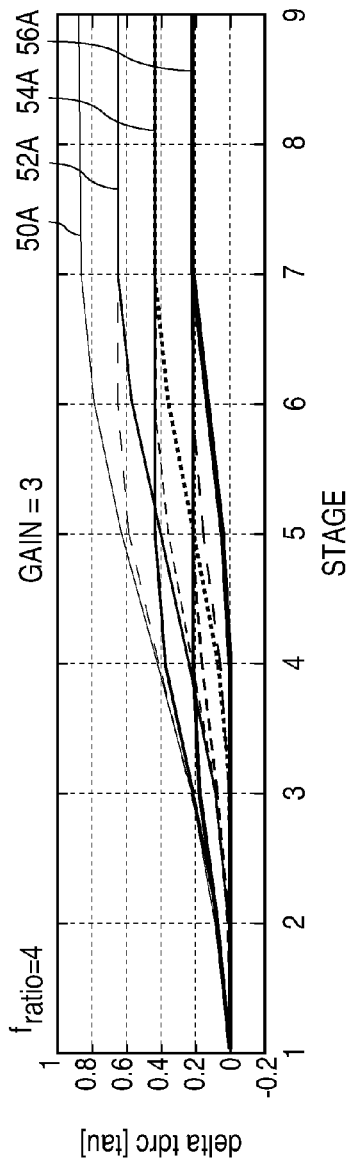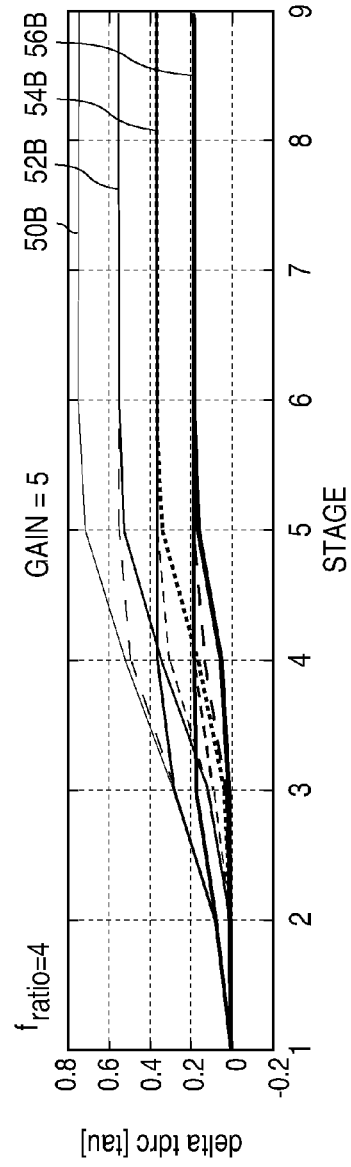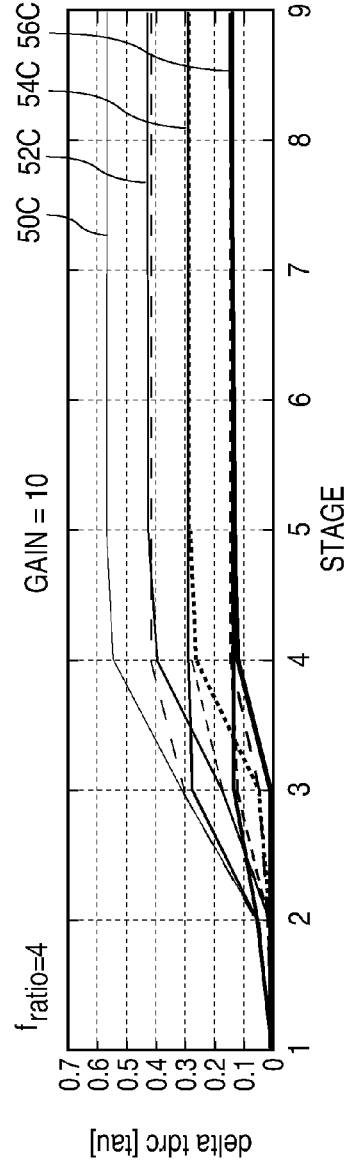

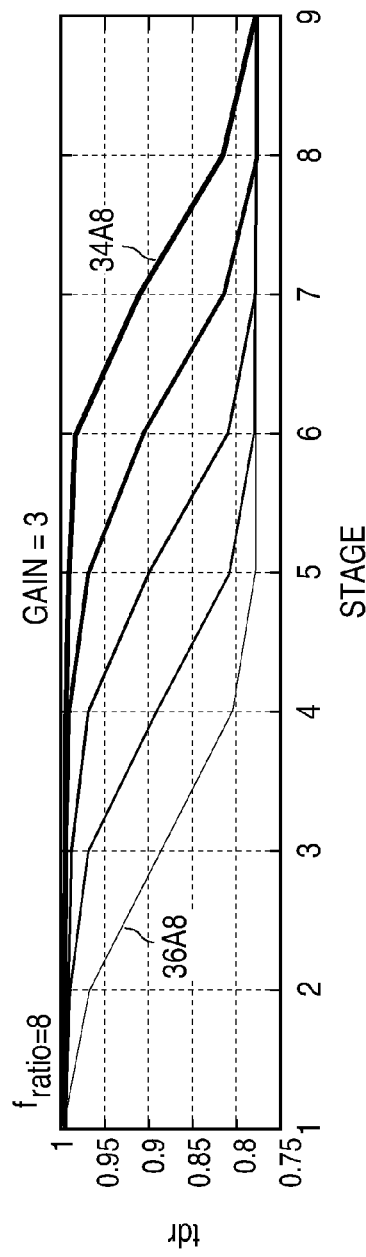
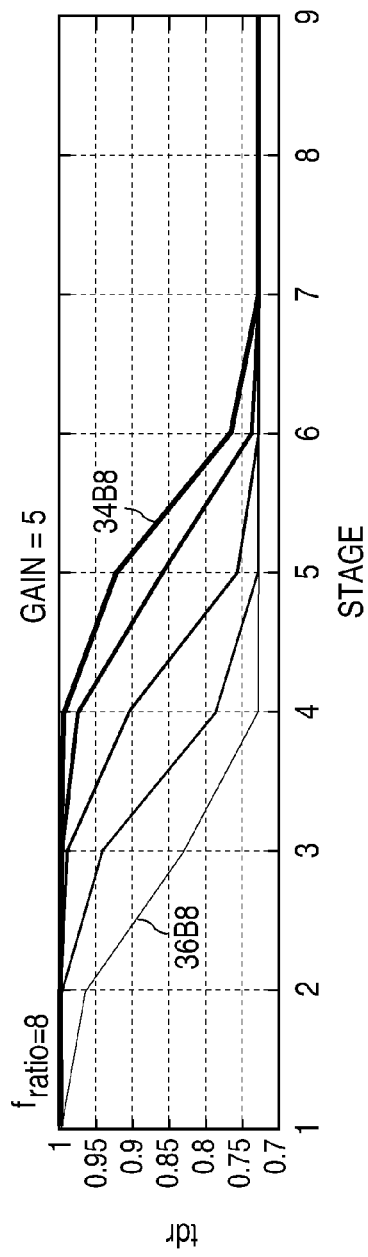
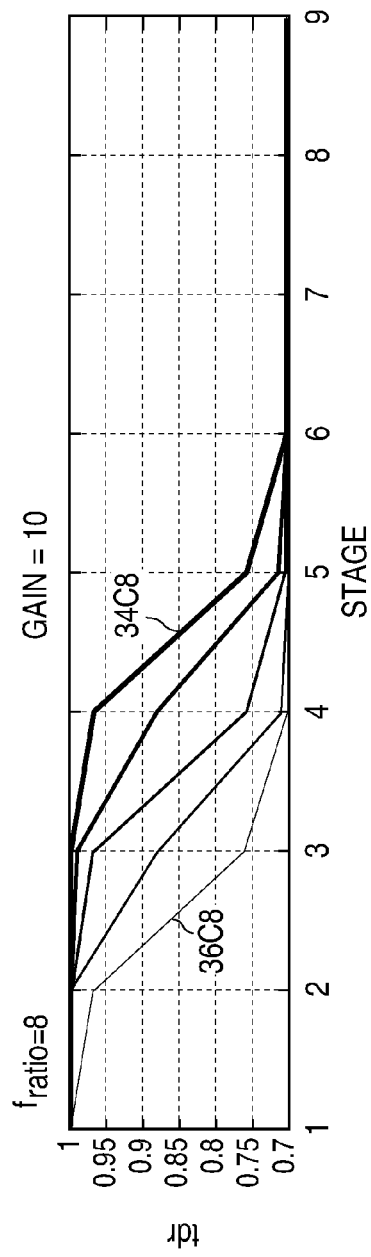
FIG. 10A
FIG. 10B
FIG. 10C

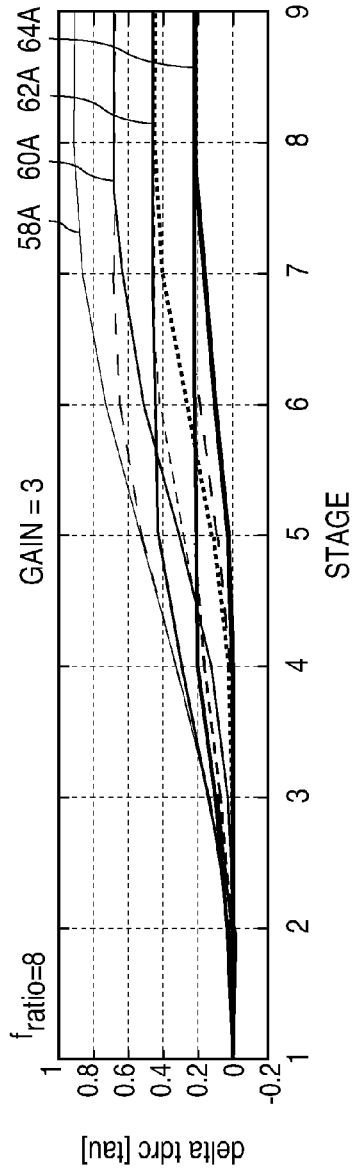
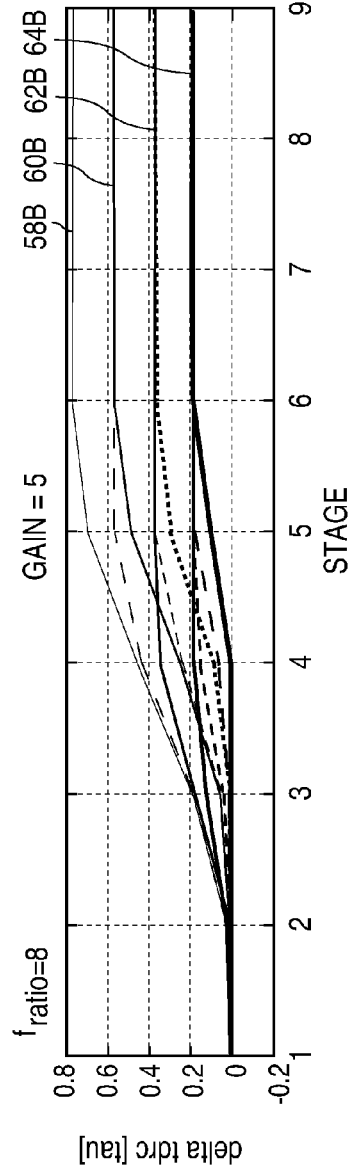
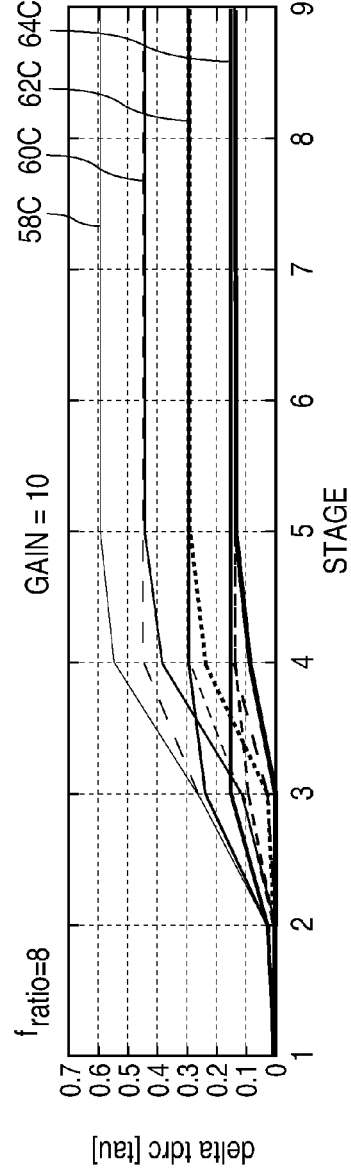
FIG. 11A
FIG. 11B
FIG. 11C

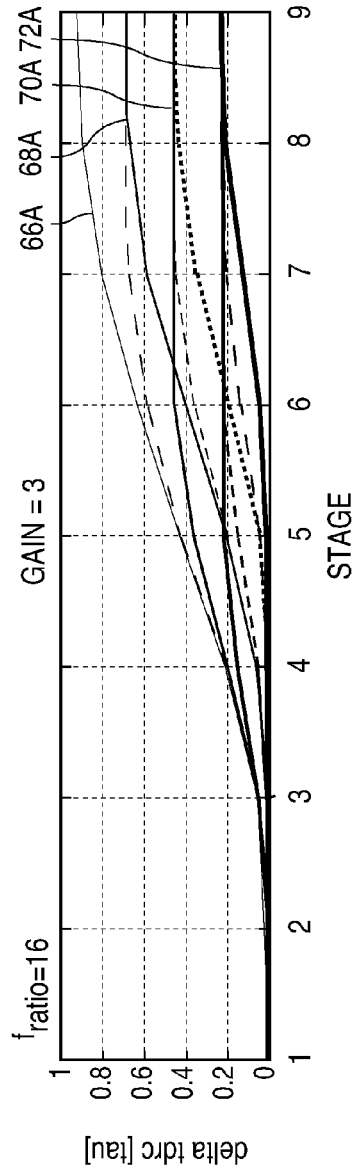
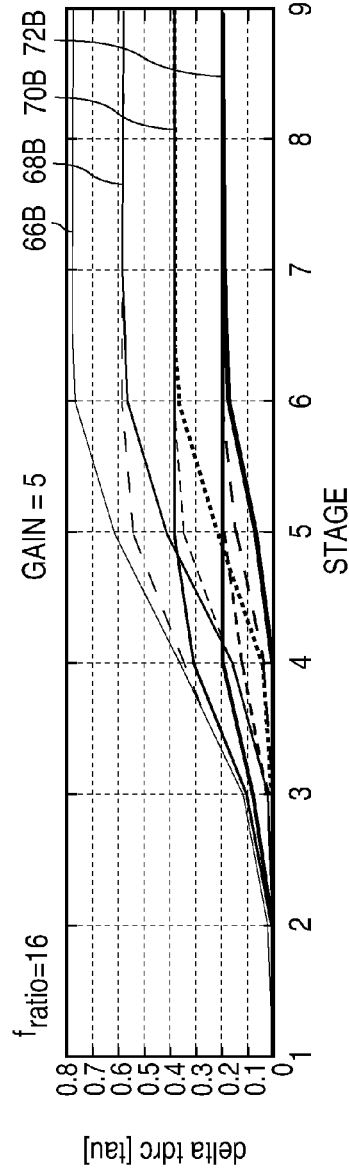
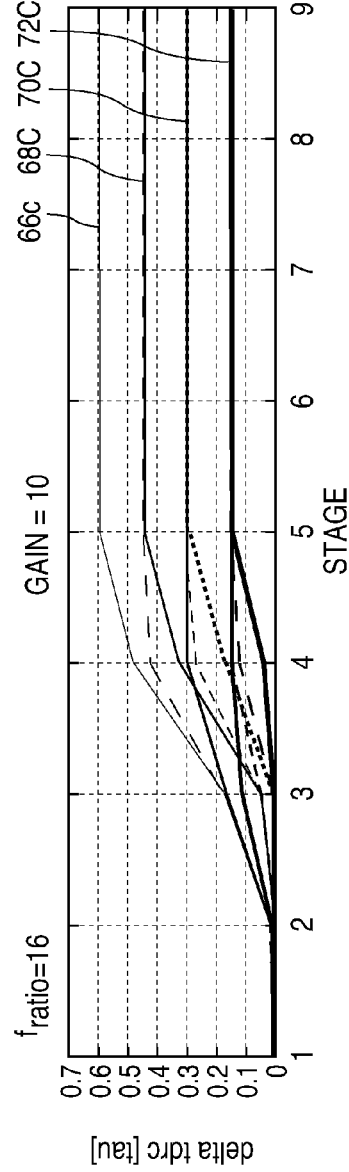
FIG. 13A
FIG. 13B
FIG. 13C

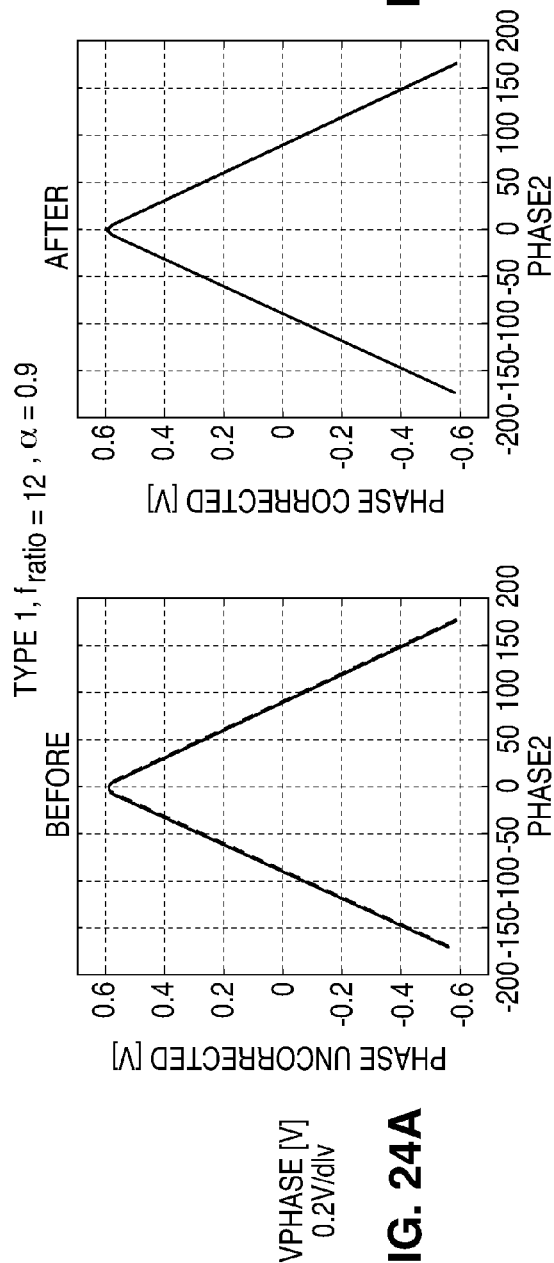
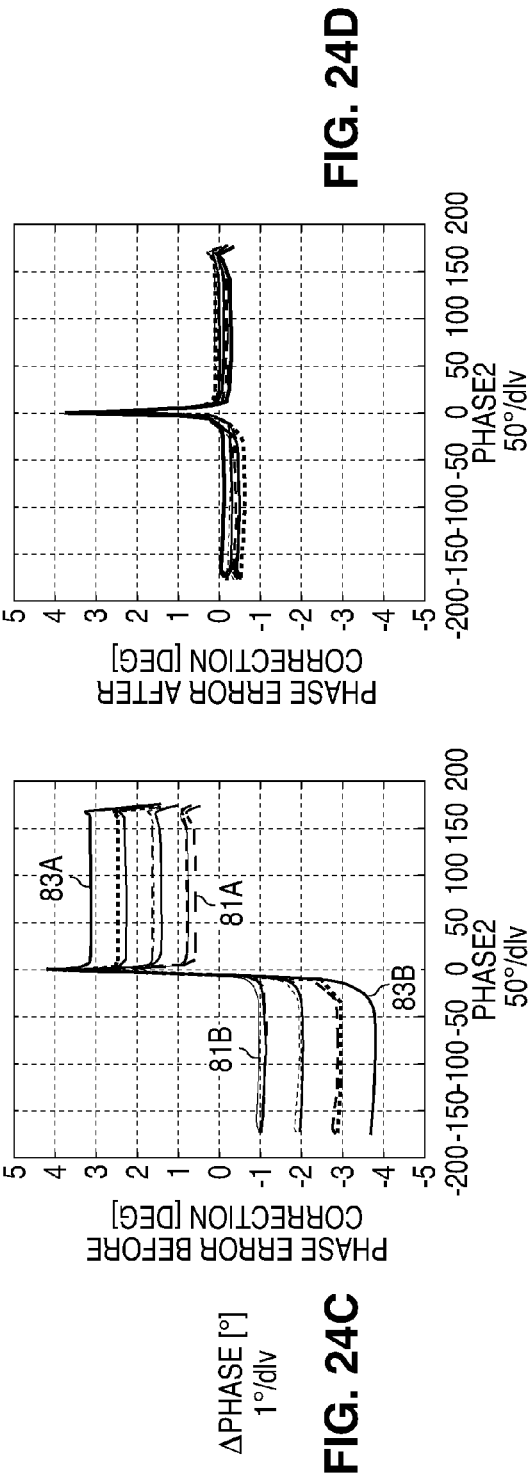

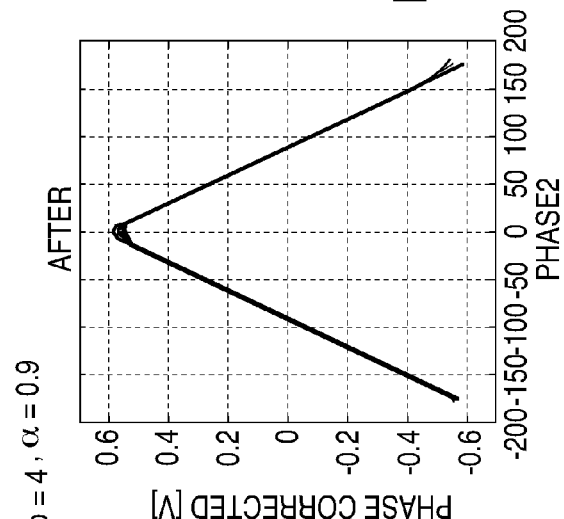
FIG. 24E
FIG. 24F
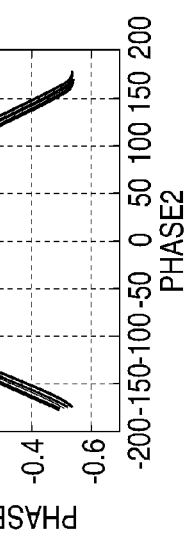
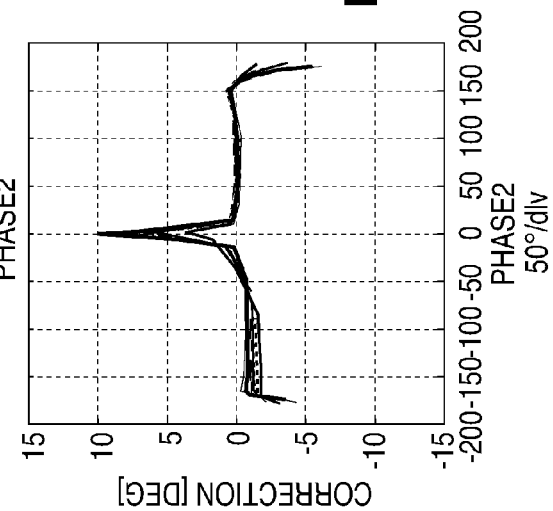
FIG. 24G
FIG. 24H

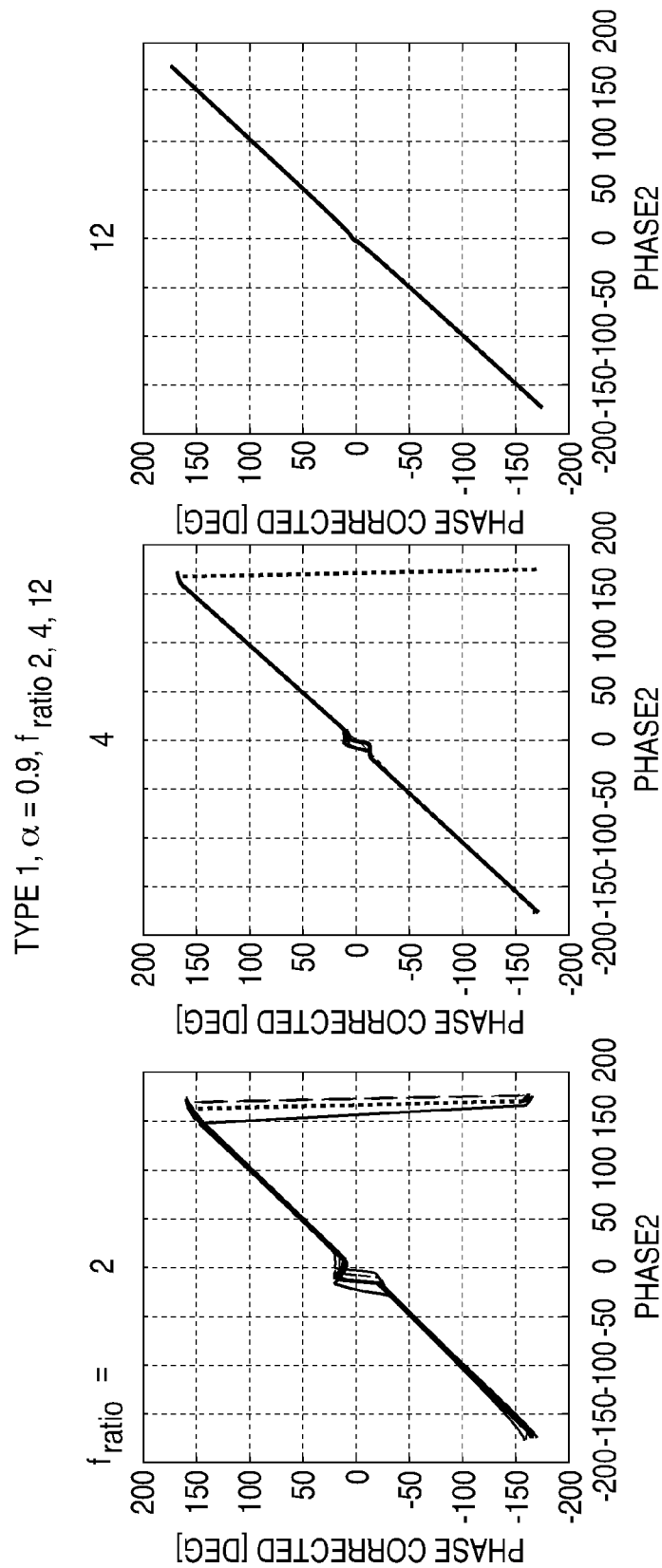

PHASE DETECTOR

BACKGROUND OF THE INVENTION

1. Field of the Invention

The present invention relates generally to phase measurement circuitry and in particular to phase detection circuitry capable of accommodating signal inputs of widely varying amplitudes while maintaining relatively low power consumption.

2. Description of Related Art

Phase detection circuitry has a wide range of applications. FIG. 1 shows two input sinusoidal signals IN1 and IN2 of the same frequency but differing in phase. The two signals IN1 and IN2 can be respectively expressed as $A1*\sin(\omega_0 t+\phi 1)$ and $A2*\sin(\omega_0 t+\phi 2)$, respectively. Assuming that IN2 is leading IN1, the phase difference $\Delta\phi$ is defined as being equal to $\phi 2-\phi 1$. FIG. 2 is a prior art circuit of a standard multiplier 15 sometimes referred to as a Gilbert multiplier. If the two signals IN1 and IN2 are relatively large in magnitude as compared to the thermal voltages $V_T$ of the transistors of the FIG. 2 Gilbert multiplier, the input signals operate to completely turn ON or turn OFF the transistors. In that event, the multiplier 15 operates as a phase detector, with the differential output signal Out switching between $+(I_{EE}*RC)$ and $-(I_{EE}*RC)$ depending upon the phase relationship between the inputs.

The above is illustrated by reference to the timing diagram of FIG. 3. When the two input signals IN1 and IN2 have relatively large magnitudes as compared to $V_T$, the signals can be approximately represented as digital signals as shown in FIG. 3. Multiplier 15 can be considered to operate in a manner similar to an exclusive NOR circuit. If the inputs IN1 and IN2 differ, then signal Out is low, otherwise the output is high. As can be seen, signal IN2 leads signal IN1 in phase by a phase difference of $\Delta\phi$ as also shown in FIG. 1. During the period corresponding to $\Delta\phi$ when IN1 is low and IN2 is high, all of the $I_{EE}$ current is flowing through one of the resistors RC to produce a minimum value of signal Out having an associated area A1. As also indicated, when both signals IN1 and IN2 are high during the remaining portion of the half cycle $\pi$, signal Out is at a maximum value and has an associated area A2.

Inspection of the FIG. 3 plot indicates that the average value of signal Out for the range $0 \leq \Delta\phi \leq \pi$ is as follows:

$$V\text{avg} = (A_2 - A_1)/\pi$$

Taking into consideration of the actual voltages produced at the output of the multiplier, for this same range of $0 \leq \Delta\phi \leq \pi$, the average voltage can also be expressed as follows:

$$V\text{avg} = V_{MULT}[(\pi - \Delta\varphi)/\pi - (\Delta\varphi/\pi)] \text{ or} \quad (1)$$
$$= V_{MULT}[1 - (2\Delta\varphi)/\pi]$$

with the symbol $V_{MULT}[...]$ indicating that the average value is a function of the terms within the brackets.

The average value of signal Out for the range $-\pi \leq \Delta\phi \leq 0$ is as follows:

$$V\text{avg} = (A_2-A_1)/\pi = V_{MULT}[(\pi+\Delta\phi)/\pi + (\Delta\phi/\pi)]$$

or $$V\text{avg} = V_{MULT}[1+(2\Delta\phi)/\pi] \quad (2)$$

A low pass filter is used to obtain $V_{avg}$, the average multiplier output signal, with $V_{avg}$ being a direct measure of the phase difference $\Delta\phi$ between IN1 and IN2.

FIG. 4 illustrates an ideal phase detector output signal 22 after low pass filtering. The reference point is for signal IN1 having a phase $\phi_1$ of 0° with the phase $\phi_2$ of signal IN2 varying from −175° to +175°. The detector output signal is at a maximum value 22A of 621.6 mV when $\phi 2$ is in phase with $\phi 1$ and drops down in a linear fashion to about −0.59 at 22B for −175° and at 22C for +175°.

FIG. 5 depicts a conventional phase detector for detecting a phase difference between sinusoidal inputs IN1 and IN2. Two amplification channels A and B are provided, with each channel having N number of separate differential gain stages. The gain stages function to ensure that the input voltages to the multiplier M1 are sufficiently large. The detector output is theoretically independent of any variations in the magnitudes of inputs IN1 and IN2. A low pass filter F1 is provided to provide the average multiplier output and to remove the ripple at 2× the input frequency. The typical prior art phase detector further includes amplitude mismatch circuitry 24 for measuring the magnitude ratio or gain between the two input signals IN1 and IN2 which has an application generally unrelated to carrying out the phase detection function.

Ideally, the two amplifier channels A and B introduce a small and but equal delay into each channel so that no phase errors are introduced. In order to minimize amplitude dispersion and a resulting phase error, the amplifier stages of each channel must have a very high bandwidth. In order to obtain a phase accuracy of around 1° to 2°, a gain stage bandwidth of 16× to 32× of the maximum input frequency is needed. However, such wide bandwidth requires a lot of power, a big drawback in mobile and other low power applications.

There is a need for an accurate phase detector which can be used in low power applications. As will become apparent to those skilled in the art upon a reading of the following Detailed Description of the Invention together with the drawings, the various disclosed embodiments are capable of providing this capability.

BRIEF DESCRIPTION OF THE DRAWINGS

FIGS. 6A to 6C each show a family of curves illustrating the propagation delay through each stage of a nine stage amplifier channel for differing magnitude input signals, where the amplification stages having a relatively low frequency response.

FIGS. 7A to 7C each show various values of amplitude dispersion for differing ratios of input signal magnitudes for the nine stage amplifiers channels of FIGS. 6A to 6C.

FIGS. 9A to 9C each show various values of amplitude dispersion for differing ratios of input signal magnitudes for the nine stage amplifier channels of FIGS. 8A to 8C.

FIGS. 10A to 10C each show a family of curves illustrating the propagation delay through each stage of a nine stage amplifier channel for differing magnitudes input signals, where the amplification stages having a frequency response somewhat higher than those of FIGS. 8A to 8C.

FIGS. 11A to 11C each show various values of amplitude dispersion for differing ratios of input signal magnitudes for the nine stage amplifier channels of FIGS. 10A to 10C.

FIGS. 13A to 13C each show various values of amplitude dispersion for differing ratios of input signal magnitudes for the nine stage amplifier channels of FIGS. 12A to 12C.

FIGS. 24A to 24L are diagrams illustrating the improved phase measurement accuracy for the FIG. 19 embodiment phase detector for differing input signal magnitude ratios for various values of frequency response ($f_{ratio}$).

FIGS. 25A to 25C show the corrected phase angle measurements made by the FIG. 19 embodiment for three differing values of amplifier gain stage frequency response ($f_{ratio}$).

DETAILED DESCRIPTION OF THE INVENTION

Figure 1:
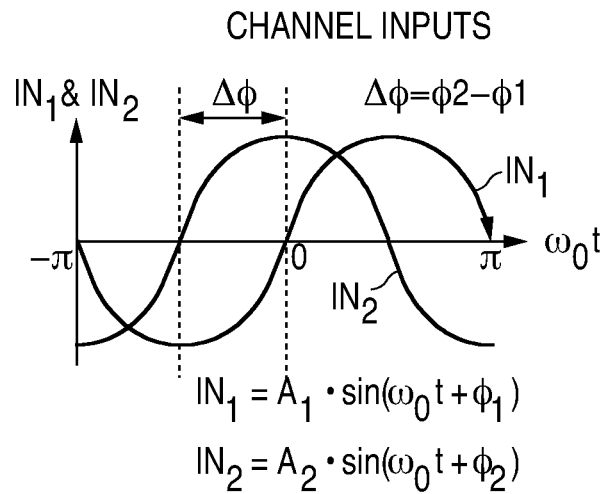
FIG. 1 shows an exemplary phase relationship between two input signals to a conventional phase detector.
Figure 2:
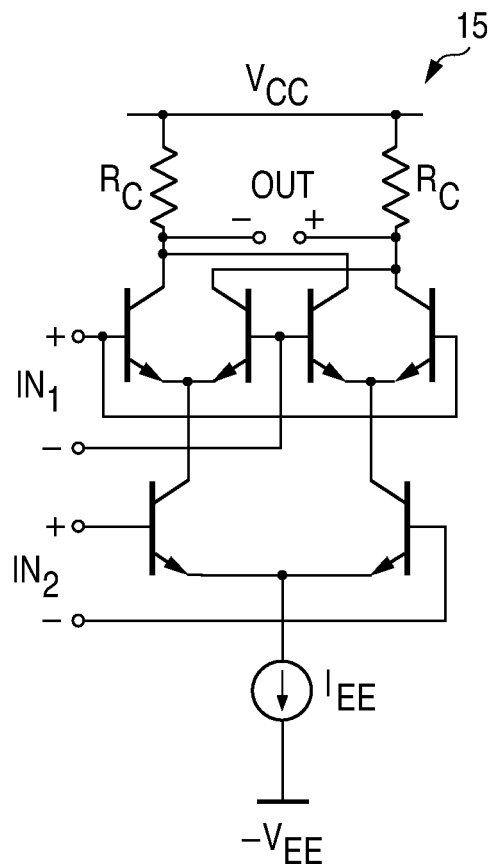
FIG. 2 is an exemplary conventional multiplier circuit diagram for use in phase detectors.
Figure 3:
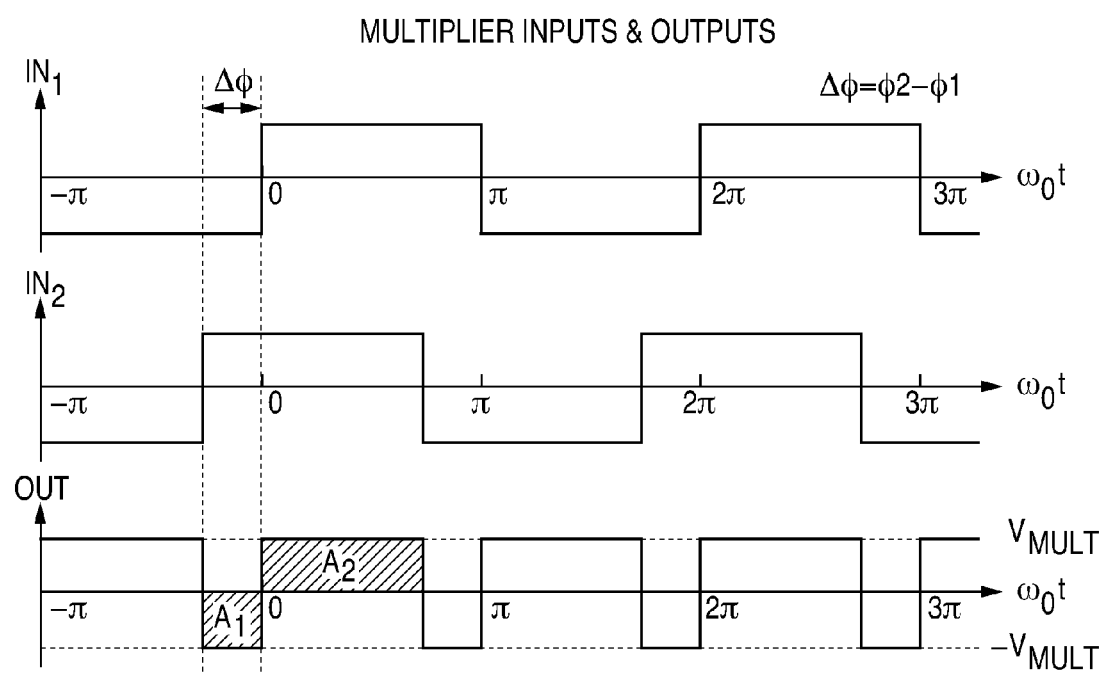
FIG. 3 is a timing diagram showing the two inputs to a conventional phase detector multiplier circuit and the resultant circuit output.

In describing the various embodiments of the present invention, a further analysis of prior art phase detection circuitry is useful. A simulation analysis can be used to demonstrate various characteristics of an amplification channel such as the channel of FIG. 5 which includes stages A1 through AN. One objective is to characterize the propagation delays and amplitude dispersion along an amplification channel under various operating conditions.

For purposes of simulation, it was assumed that the frequency ratio $f_{ratio}$ is defined in terms of gain stage bandwidth and input frequency is as follows:

$$f_{ratio} = f_{3db\_gainstage}/f_{in} \quad (3)$$

In addition, each gain stage has one pole as a first order response. The response time $\tau$ (tau) values are normalized so that $\tau=1$. Further, the voltage output Vout of the amplifier stage is as follows:

$$Vout = I_{load} * R_{load} * \tan h(Vin/2V_T) \quad (4)$$

where Vin is the amplitude of the input; and $V_T$ is the transistor thermal voltage.

The propagation delay tdrc of the rising edge at the output of a gain stage "stage" is expressed as follows:

$$tdrc(stage, Vin) = td(stage, Vin, re) - td(Vin, re)$$

where tdrc is the propagation delay;

td( . . . ) is propagation delay in general;

stage is the stage number;

Vin is the input magnitude of the first stage; and re is the rising edge, the point at which delay is measured.

Ideally, the propagation delay for each gain stage is fixed so that the total delay through each of the amplification channels A and B having equal stages are fixed and equal. If that were the case, then the amplification channels would not introduce errors in the phase measurements. However, the propagation delay tdrc for a gain stage varies as a function of many variables including (1) the gain of the stage; (2) the bandwidth of the stage in comparison to the input frequency (the $f_{ratio}$); and the magnitude of the input Vin. In fact, it is anticipated that the relative magnitudes of inputs IN1 and IN2 to a phase detector can vary considerably.

The amplitude dispersion $\Delta$tdrc at the output of gain stage "stage" is expressed as follows:

$$\Delta tdrc(\text{stage}, Vin1, Vin2) = tdrc(\text{stage}, Vin1) - tdrc(\text{stage}, Vin2) \quad (5)$$

In addition, the propagation delay tdr of a rising edge for a specific gain stage "stage" is expressed as follows:

$$tdr(\text{stage}, Vin) = tdrc(\text{stage}, Vin) - tdrc(\text{stage}-1, Vin) \quad (6)$$

FIG. 6A shows a family of curves illustrating the propagation delay tdr of each stage of a nine stage amplifier channel. Each of the five plots represents a differing magnitude input Vin including 1 mV, 3.16 mV, 10 mV, 31.62 mV and 100 mV. The gain of each stage illustrated in FIG. 6A is fixed at a relatively low value of 3 and the frequency ratio $f_{ratio}$, which as previously noted relates to the bandwidth of the stage relative to the input frequency, is fixed at a relatively low value of 2. Plot 26A2 of FIG. 6A shows the propagation delays along the amplification channel for the smallest magnitude input (1 mV) and plot 28A2 shows the propagation delays for the largest magnitude input (100 mV.) The intermediate and undesignated plots of FIG. 6A are for 3.16 mV, 10 mV and 31.62 mV inputs.

As can be seen, at the output of the first stage, the normalized value of tdr for the largest magnitude (100 mV) input 282A2 starts out at 0.92 (out of one), drops down to about 0.85 at the second stage and then stabilizes at about 0.78 at the third stage and remains at that level for each of the remaining six stages. For the smallest magnitude input of 1 mV, plot 26A2 indicates that value of tdr starts at 0.92, starts to drop from that value at stage 4, drops to 0.90 at stage 6, drops further to 0.84 at stage 7 and does not stabilize at 0.77 until the last or ninth stage.

The plots of FIGS. 6B and 6C are produced under similar circumstances as FIG. 6A except the gain is increased to 5 in FIG. 6B and increased to 10 in FIG. 6C. The 100 mV input plot is designated as 28B2 and 28C2 in respective FIGS. 6B and 6C and the 1 mV input plot is designated as 26B2 and 26C2 in respective FIGS. 6B and 6C. As can be seen in both figures, the value of tdr stabilizes much sooner for all values of inputs, with tdr settling at 0.73 at stage 7 for a gain of 5 and with tdr settling at 0.70 at stage 6.

FIGS. 7A to 7C show the various values of $\Delta$tdrc, the amplitude dispersion for various ratios on inputs. Each figure depicts ten different plots for the ten input ratios of inputs as set forth in Table 1 below. The absolute values of tdrc are taken from the plots of respective FIGS. 6A to 6C. Thus, one plot of FIG. 7A represents an input signal ratio Vin2/Vin1 of 100 mV/10 mV. The respective tdr values of 100 mV and 10 mV are taken from the two corresponding plot of FIG. 6A and subtracted from one another to produce a corresponding $\Delta$tdrc curve.

TABLE 1

| | ($f_{ratio}$ = 2) | | | |
|---|---|---|---|---|
| Input Ratio (Vin2/Vin1) | Log Input Ratio | Final Stage Amplitude Dispersion Level ($\Delta$tdrc) | | |
| (drawing designation) | ($\text{Log}_{10}$(Vin2/Vin1)) | G = 3 (FIG. 7A) | G = 5 (FIG. 7B) | G = 10 (FIG. 7C) |
| 3.16/1 (48A, B, C) | 0.5 | 0.19 | 0.17 | 0.11 |
| 10/3.16 (48A, B, C) | 0.5 | 0.19 | 0.17 | 0.11 |
| 31.6/10 (48A, B, C) | 0.5 | 0.19 | 0.17 | 0.11 |
| 100/31.6 (48A B, C) | 0.5 | 0.19 | 0.17 | 0.11 |
| 10/1 (46A, B, C) | 1.0 | 0.35 | 0.31 | 0.23 |
| 31.6/3.16 (46A, B, C) | 1.0 | 0.35 | 0.31 | 0.23 |
| 100/10 (46A, B, C) | 1.0 | 0.35 | 0.31 | 0.23 |
| 31.6/1 (44A, B, C) | 1.5 | 0.52 | 0.48 | 0.36 |
| 100/3.16 (44A, B, C) | 1.5 | 0.52 | 0.48 | 0.36 |
| 100/1 (42A, B, C) | 2.0 | 0.71 | 0.61 | 0.49 |

When the two tdr plots each have reached a saturation level ($tdr_{saturated}$) at the final gain stage is approached, the difference between the propagation delays ($\Delta$tdrc) will reach some constant level as shown in FIG. 7A and Table 1. By way of example, plot 42A of FIG. 7A represents a $\Delta$tdrc associated with an input ratio Vin2/Vin1 of 100/1. At about the seventh gain stage, this $\Delta$tdrc value becomes constant at a normalized value of 0.71 out of one. (Note the Table 1 has a somewhat better resolution as compared to the plot of FIGS. 7A to 7C for showing the final $\Delta$tdrc levels.) Thus, if a phase detector system having amplification channels A and B using amplifiers having a $f_{ratio}$ of two and a gain of three and having respective inputs that have a magnitude ratio of 100/1, the difference in propagation delay in the two amplification channels will produce a phase difference measurement error that corresponds to a normalized $\Delta$tdrc value of 0.71. Two plots of FIG. 7A designated by 44A are for input magnitude ratios of 100/3.16 and 31.6/1 converge at a final stabilized value of $\Delta$tdrc of 0.52. Three plots 46A are for input magnitude ratios of 100/10, 31.6/3.16 and 10/1 and converge at a final value of $\Delta$tdrc of 0.35. Finally, four plots 48A for input magnitude ratios of 100/31.6, 31.6/10, 10/3.16 and 3.16/1 all converge as a final value of $\Delta$tdrc of 0.19. Thus, as the ratio of input magnitudes is reduced, the potential phase error measurement becomes smaller. Unfortunately, it usually not possible to control this ratio, so differing ratios must be taken into account.

FIG. 7B shows the changes in $\Delta$tdrc that result when the gain is increased from three to five. As also shown in Table 1, the single plot designated by 42B (100/1) stabilizes at a final value 0.61, the two plots designated by 44B (100/3.16 and 31.6/1) stabilizes at 0.48, the three plots designated by 46B (100/10, 31.6/3.16 and 10/1) stabilizes at 0.31 and finally the four plots designated by 48B saturate at 0.17.

When the gain is increased from five to ten, FIG. 7C shows the changes in $\Delta$tdrc that result. As also shown in Table 1, the single plot designated by 42C (100/1) stabilizes at 0.49, the two plots designated by 44C (100/3.16 and 31.6/1) stabilizes at 0.36, the three plots designated by 46C (100/10, 31.6/3.16 and 10/1) saturate at 0.23 and finally the four plots designated by 48C stabilizes at a final value of 0.11.

Figure 8A:
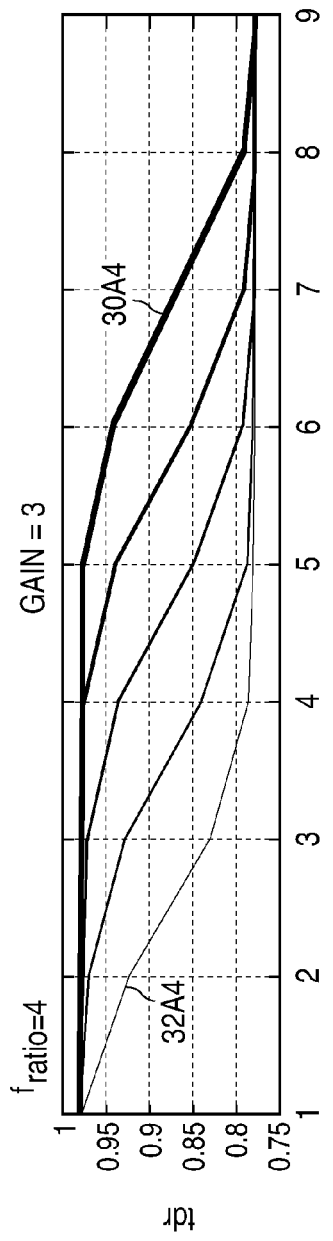
FIGS. 8A to 8C each show a family of curves illustrating the propagation delay through each stage of a nine stage amplifier channel for differing magnitude input signals, with the amplification stages having a frequency response somewhat higher than those of FIGS. 6A to 6C.
Figure 8B:
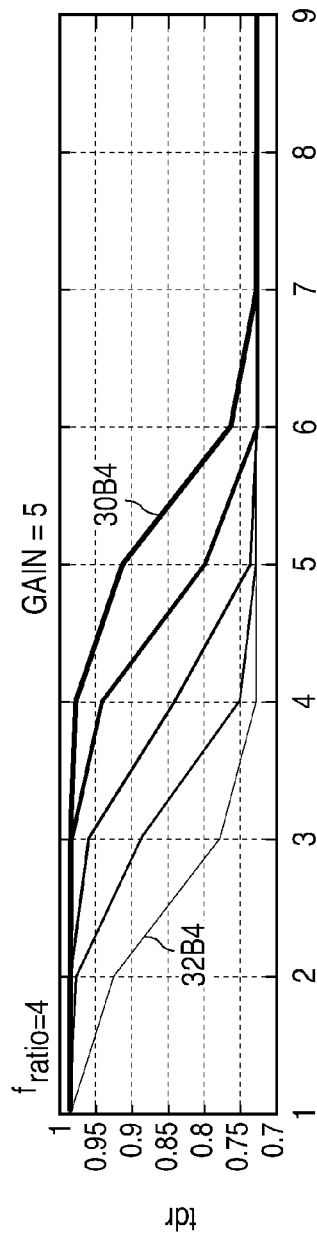
Figure 8C:
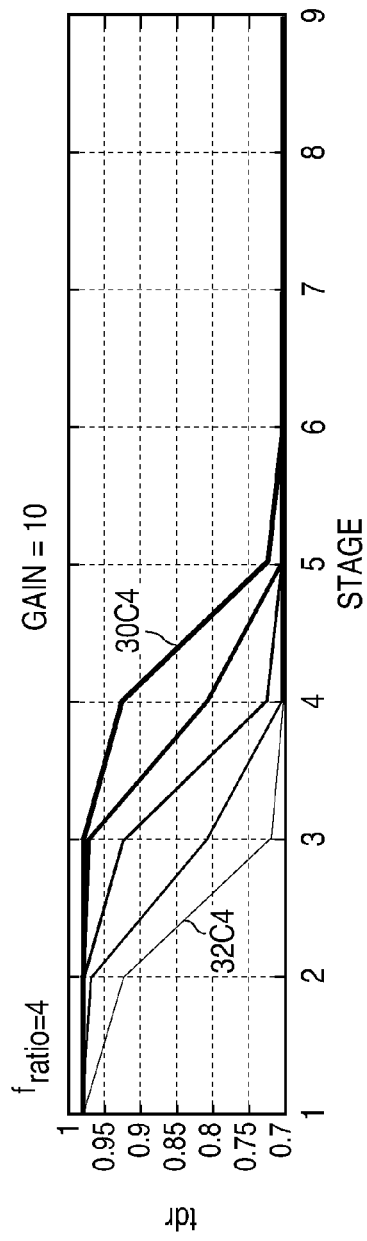

FIGS. 8A to 8C are similar to respective FIGS. 6A to 6C except to value of $f_{ratio}$ is increased from 2 to 4. Each of these figures includes five plots of tdr representing five differing input magnitudes including plots 30A4, 30B4 and 30C4 associated with an input of 1 mV and including plots 32A4, 32B4 and 32C4 associated with an input of 100 mV.

The plots of FIGS. 9A to 9C are similar to those of FIGS. 7A to 7C except that the value of $f_{ratio}$ is increased from 2 to 4. The data of the FIG. 9A to 9C plots are derived from the plots of FIG. 8A to 8C. The plots of FIGS. 9A to 9C along with Table 2 below show the characteristics of Δtdrc under these new conditions, including the differing stabilized final values. The single plot designated by 50A, B, and C (input ratio 100/1) in each of the three figures stabilizes at the various levels best seen in Table 2, the two plots designated by 52A, B and C (input ratios 100/3.16 and 31.6/1) in each of the three figures stabilize at the various levels best seen in Table 2. In addition, the three plots designated by 54A, B and C (input ratios 100/10, 31.6/3.16 and 10/1) in each of the three figures stabilize at the various levels best seen in Table 2 and finally, the four plots designated as 56A, B and C (input ratios 100/31.6, 31.6/10, 10/3.16 and 3.16/1) in each of the three figures stabilize at the various levels best seen in Table 2.

TABLE 2

($f_{ratio}$ = 4)

| Input Ratio (Vin2/Vin1) (drawing designation) | Log Input Ratio ($Log_{10}$(Vin2/Vin1)) | Final Stage Amplitude Dispersion Level (Δtdrc) | | |
|---|---|---|---|---|
| | | G = 3 (FIG. 9A) | G = 5 (FIG. 9B) | G = 10 (FIG. 9C) |
| 3.16/1 (56A, B, C) | 0.5 | 0.21 | 0.19 | 0.14 |
| 10/3.16 (56A, B, C) | 0.5 | 0.21 | 0.19 | 0.14 |
| 31.6/10 (56A, B, C) | 0.5 | 0.21 | 0.19 | 0.14 |
| 100/31.6 (56A, B, C) | 0.5 | 0.21 | 0.19 | 0.14 |
| 10/1 (54A, B, C) | 1.0 | 0.43 | 0.36 | 0.29 |
| 31.6/3.16 (54A, B, C) | 1.0 | 0.43 | 0.36 | 0.29 |
| 100/10 (54A, B, C) | 1.0 | 0.43 | 0.36 | 0.29 |
| 31.6/1 (52A, B, C) | 1.5 | 0.65 | 0.55 | 0.42 |
| 100/3.16 (52A, B, C) | 1.5 | 0.65 | 0.55 | 0.42 |
| 100/1 (50A B, C) | 2.0 | 0.87 | 0.74 | 0.58 |

FIGS. 10A to 10C are similar to respective FIGS. 6A to 6C except to value of $f_{ratio}$ is increased from 2 to 8. Each of these figures includes five plots of tdr representing five differing input magnitudes, including plots 34A8, 34B8 and 34C8 associated with an input of 1 mV and including plots 36A8, 36B8 and 36C8 associated with an input of 100 mV.

FIGS. 11A to 11C are also similar to that of FIGS. 7A to 7C except that the value of $f_{ratio}$ is increased from 2 to 8. The data for the FIG. 11A to 11C plots is taken from FIGS. 10A to 10C. The plots of FIGS. 7A to 7C along with Table 3 below show the characteristics of Δtdrc under these new conditions, including the differing final stabilized levels.

TABLE 3

($f_{ratio}$ = 8)

| Input Ratio (Vin2/Vin1) (drawing designation) | Log Input Ratio ($Log_{10}$(Vin2/Vin1)) | Final Stage Amplitude Dispersion Level (Δtdrc) | | |
|---|---|---|---|---|
| | | G = 3 (FIG. 11A) | G = 5 (FIG. 11B) | G = 10 (FIG. 11C) |
| 3.16/1 (64A, B, C) | 0.5 | 0.22 | 0.20 | 0.15 |
| 10/3.16 (64A, B, C) | 0.5 | 0.22 | 0.20 | 0.15 |
| 31.6/10 (64A, B, C) | 0.5 | 0.22 | 0.20 | 0.15 |
| 100/31.6 (64A, B, C) | 0.5 | 0.22 | 0.20 | 0.15 |
| 10/1 (62A, B, C) | 1.0 | 0.44 | 0.39 | 0.30 |
| 31.6/3.16 (62A, B, C) | 1.0 | 0.44 | 0.39 | 0.30 |
| 100/10 62A, B, C) | 1.0 | 0.44 | 0.39 | 0.30 |
| 31.6/1 (60A, B, C) | 1.5 | 0.68 | 0.58 | 0.44 |
| 100/3.16 (60A, B, C) | 1.5 | 0.68 | 0.58 | 0.44 |
| 100/1 (58A, B, C) | 2.0 | 0.92 | 0.78 | 0.59 |

Figure 12A:
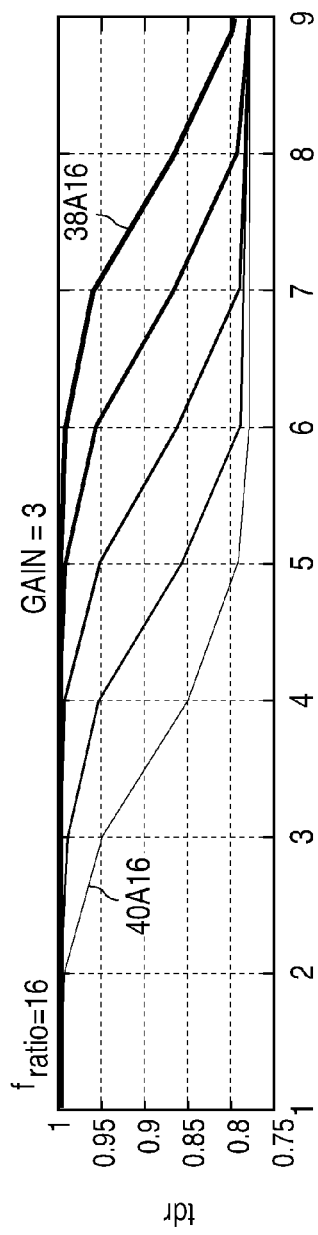
FIGS. 12A to 12C each show a family of curves illustrating the propagation delay through each stage of a nine stage amplifier channel for differing magnitude input signals, where the amplification stages having a frequency response somewhat higher than those of FIGS. 10A to 10C.
Figure 12B:
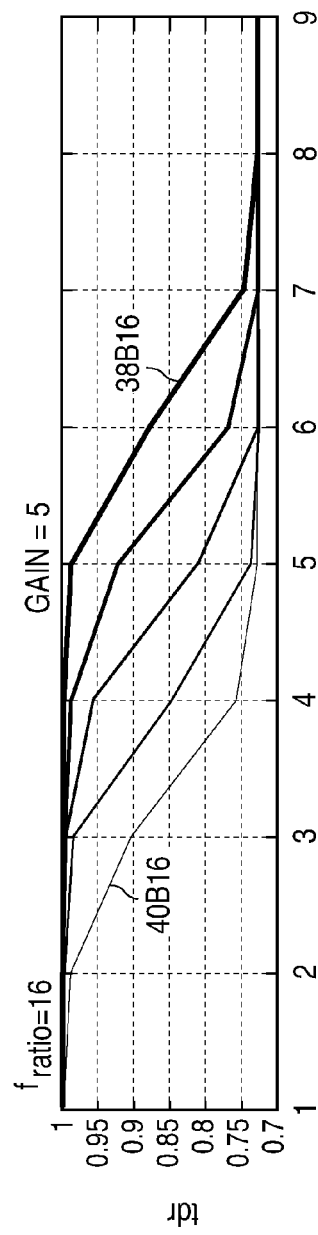
Figure 12C:
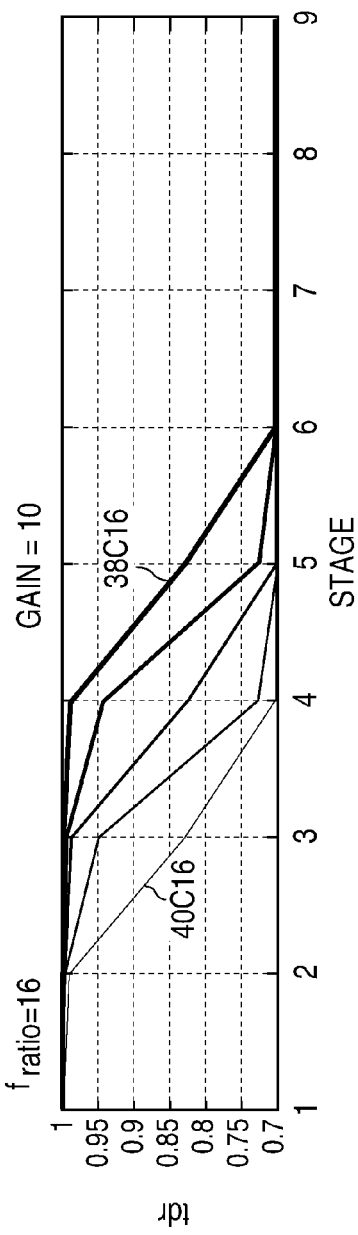

Continuing, FIGS. 12A to 12C are similar to respective FIGS. 6A to 6C except to value of $f_{ratio}$ is increased from 2 to 16. Once again, each of these figures includes five plots of tdr representing five differing input magnitudes including plots 38A16, 38B16 and 38C16 associated with an input of 1 mV and including plots 40A16, 40B16 and 40C16 associated with an input of 100 mV.

FIGS. 13A to 13C are also similar to that of FIGS. 7A to 7C except that the value of $f_{ratio}$ is increased from 2 to 16. The data for plots 13A to 13C are taken from the tdr plots of FIGS. 12A to 12C. The plots of FIGS. 13A to 13C along with Table 4 below show the characteristics of Δtdrc under these new conditions, including the differing final stabilized levels.

TABLE 4

($f_{ratio}$ = 16)

| Input Ratio (Vin2/Vin1) (drawing designation) | Log Input Ratio ($Log_{10}$(Vin2/Vin1)) | Final Stage Amplitude Dispersion Level (Δtdrc) | | |
|---|---|---|---|---|
| | | G = 3 (FIG. 13A) | G = 5 (FIG. 13B) | G = 10 (FIG. 13C) |
| 3.16/1 (72A, B, C) | 0.5 | 0.23 | 0.20 | 0.16 |
| 10/3.16 (72A, B, C) | 0.5 | 0.23 | 0.20 | 0.16 |
| 31.6/10 (72A, B, C) | 0.5 | 0.23 | 0.20 | 0.16 |
| 100/31.6 (72A, B, C) | 0.5 | 0.23 | 0.20 | 0.16 |
| 10/1 (70A, B, C) | 1.0 | 0.45 | 0.39 | 0.30 |
| 31.6/3.16 (70A, B, C) | 1.0 | 0.45 | 0.39 | 0.30 |
| 100/10 (70A, B, C) | 1.0 | 0.45 | 0.39 | 0.30 |
| 31.6/1 (68A, B, C) | 1.5 | 0.70 | 0.59 | 0.45 |
| 100/3.16 (68A, B, C) | 1.5 | 0.70 | 0.59 | 0.45 |
| 100/1 (66A, B, C) | 2.0 | 0.92 | 0.78 | 0.60 |

Figure 14:
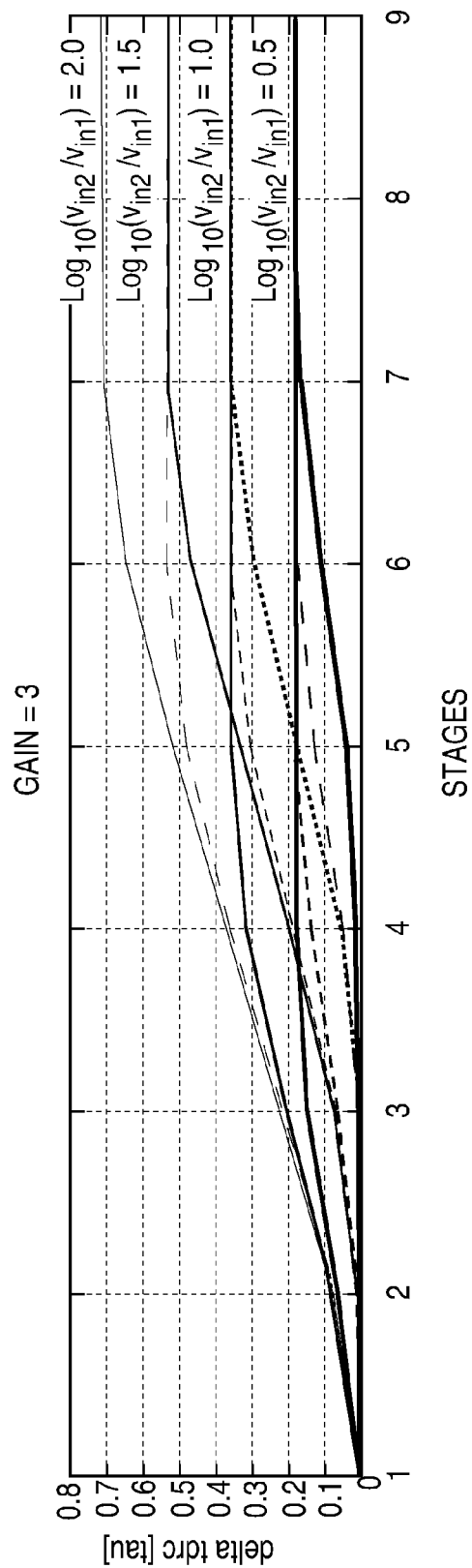
FIG. 14 is another version of FIG. 7A with annotations added illustrating that for every 10× increase in amplitude ratio the amplitude dispersion essentially doubles.

The plots of FIGS. 6A-6C to FIGS. 13A-13C, along with Tables 1-4 confirm that there is a logarithmic dependency of the amplitude dispersion Δtdrc (stage, Vin1, Vin2) on the amplitude ratio Vin2/Vin1. This is also illustrated by FIG. 14 which is another version of FIG. 7A with annotations added. For a 10× increase in the amplitude ratio the amplitude dispersion essentially doubles. Using this fact in combination with the knowledge that a saturated gain stage will have a constant propagation delay ($tdr_{saturated}$), it is possible to correct the phase error resulting from amplitude dispersion as long as the amplitude ratio is known.

Figure 5:
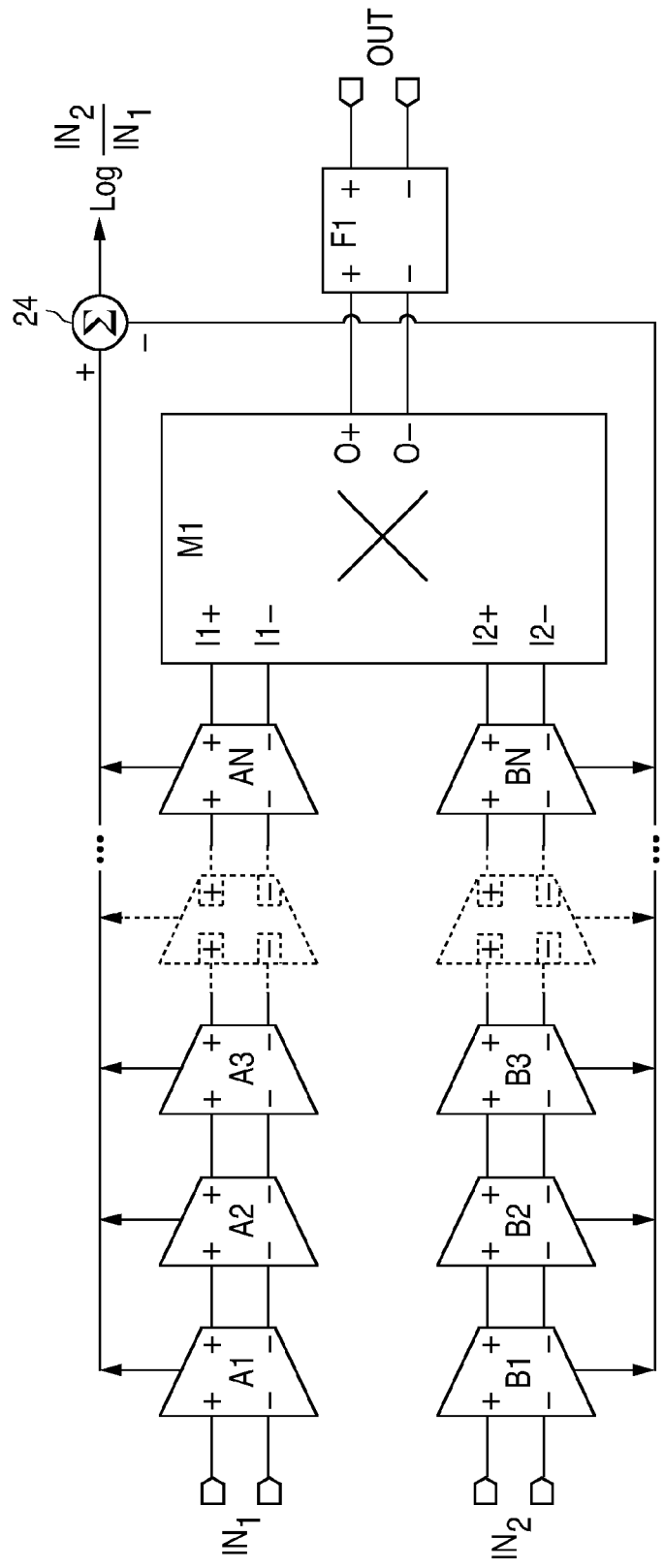
FIG. 5 is a conventional phase detector which includes two amplification channels followed by a multiplier circuit.

As previously noted in connection with the prior art phase detector of FIG. 5, such phase detectors commonly provide circuitry for generating a signal relating to the ratio of the two inputs IN2 and IN1. The actual computed ratio of the mismatch detector is logarithmic and is equal to $\beta*Log_{10}$ (Vin2/Vin1). In that case, a constant α can be found such that:

$$\Delta tdrc(stage, Vin1, Vin2) = \alpha*\beta*Log_{10}(Vin2/Vin1)*tdr_{saturated} \quad (7)$$

Figure 15A:
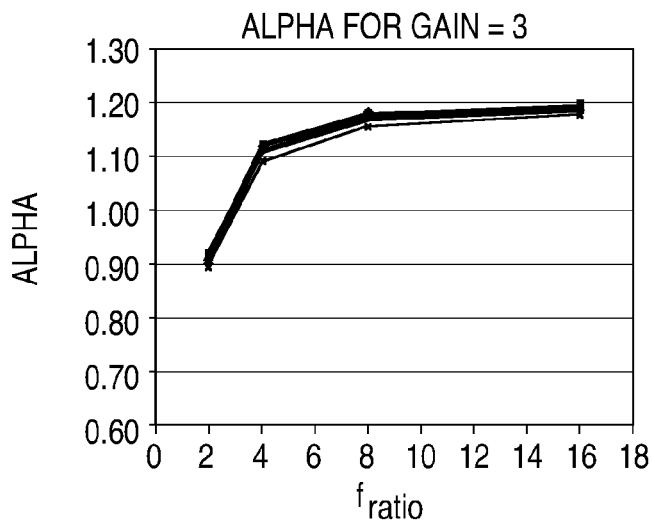
FIGS. 15A to 15C illustrate that a constant alpha for use in phase error correction can be determined for a wide range of amplifier stage frequency responses ($f_{ratio}$).
Figure 15B:
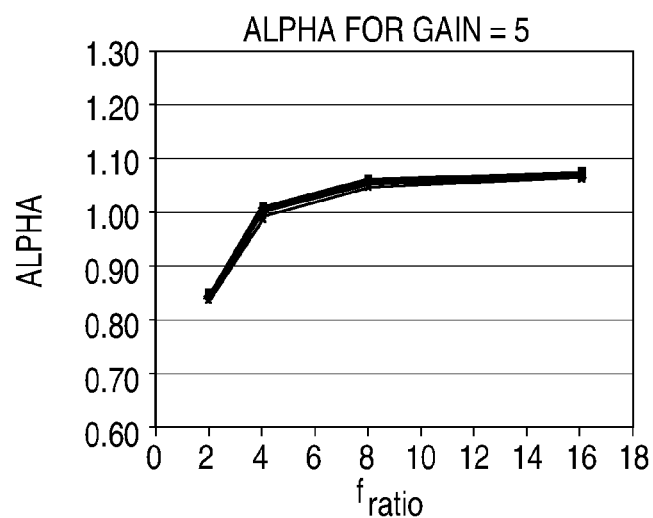
Figure 15C:
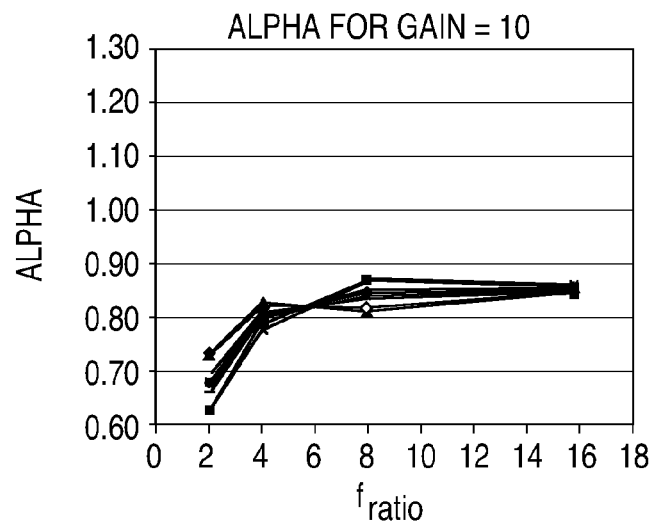

The constant α or alfa can be determined given that the amplitude dispersion numbers and propagation delay numbers are known for differing values of $f_{ratio}$ and stage gains. By way of example, FIG. 15A to 15C each show family of ten plots, one for each of the ten Vin2/Vin1 magnitude ratios set forth, by way of example, in the left hand column of Table 1. The plots of FIG. 15A were made with the assumption that the gain of the amplification stages are each 3. (The drawing resolution is insufficient to show each of the separate plots.) The vertical axis of FIG. 15A represents the various values of factor α or alfa and the horizontal axis is for various values of $f_{ratio}$. Thus, the 10 plots of FIG. 15A are derived from FIGS. 6A, 7A (G=3, $f_{ratio}$=2), FIGS. 8A, 9A (G=3, $f_{ratio}$=4), FIGS. 10A, 11A (G=3, $f_{ratio}$=8), FIGS. 12A, 13A (G=3, $f_{ratio}$=16). As can be seen in FIG. 15A, the value of factor α remains fairly constant around 1.1 to 1.2 for a gain of 3 but drops significantly in the input frequency approaches the gain bandwidth where $f_{ratio}$=2. FIG. 15B is ten plots for a gain of 5 and shows that the value of α is fairly constant around 1.0 to 1.05, again disregarding the low bandwidth condition. Finally, 15C shows that the value of factor α is fairly constant around 0.79-0.86 for a gain of 10 assuming that the low bandwidth condition is disregarded.

The foregoing shows that factor α is relatively constant over a wide range of frequencies, but drops significantly if the input frequency approaches the gain stage bandwidth ($f_{ratio}$=1). This means that the phase error due to amplitude dispersion can be fairly well compensated as long as a measure of the amplitude ratio can be found and the delay of the saturated stage ($tdr_{saturated}$) can be found. Below are the equations for the uncorrected phase error ($\Delta Phase_{uncorrected}$) and the corrected phase error ($\Delta Phase_{corrected}$) which show the improvement in phase error.

$$\Delta Phase_{uncorrected} = [\Delta tdrc(stage, Vin1, Vin2)]*(180)/(f_{ratio}*\pi)[°] \quad (8)$$

where converting τ back to ° is carried out using $\Delta Phase = (180)\Delta t/(f_{ratio}*\pi)[°]$.

$$\Delta Phase_{corrected} = [[\Delta tdrc(stage, Vin1, Vin2)] - [\alpha*\beta*Log_{10}(Vin2/Vin1)*tdr_{saturated}]]*180/(f_{ratio}*\pi)[°] \quad (9)$$

where the polarity of Δtdrc depends on which of Vin1 and Vin2 is larger, since the sign of the "$Log_{10}$ (Vin/Vin)" term depends upon this relationship.

The differences in ($\Delta Phase_{uncorrected}$) and $\Delta Phase_{corrected}$ for various values of gain and $f_{ratio}$ are depicted in FIGS. 16A-16C, FIGS. 17A-17C and FIGS. 18A-18C. Each figure includes a vertical axis for the value of phase error and a horizontal axis for the values of $f_{ratio}$ and depicts ten different plots for each of the ten different Vin2/Vin1 ratios as set forth, by way of example, in the left hand column of Table 1. The resolution of the drawings is generally insufficient to show each of the ten plots, but it can be seen that the plots fall into four separate groupings based upon the $Log_{10}$ of the Vin2/Vin1 ratios (2.0, 1.5, 1.0 and 0.5) as also shown in Table 1.

Figure 16A:
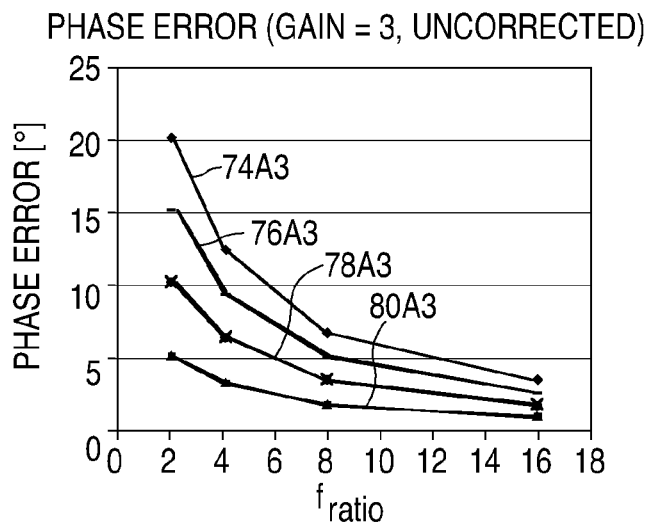
FIGS. 16A to 16C illustrate how phase errors can be corrected using a particular value of alpha for differing amplifier stage frequency responses ($f_{ratio}$) when the amplifier stage gain is three.

Referring to FIG. 16A, this shows the uncorrected phase error ($\Delta Phase_{uncorrected}$) when the gain of the amplifier stages is only 3. Grouping 74A3 is for the largest input ratio ($Log_{10}$ ratio=2.0) for a single plot, grouping 76A3 is for the second largest input ratio ($Log_{10}$ ratio=1.5) and represents two different plots, grouping 78A3 is for the next larger input ratio ($Log_{10}$ ratio=1.0 and represents three different plots, with grouping 80A3 representing the remaining four plots ($log_{10}$ ratio=0.5) As expected, for relatively low bandwidth amplifier channels ($f_{ratio}$=2) and a wide difference in inputs Vin2 and Vin1, grouping 74A3 of FIG. 16A shows that the uncorrected phase error is about 20°. That error is reduced to about 4° in the event the bandwidth is increased so that $f_{ratio}$ is equal to 16. Such a bandwidth requires a large consumption of power. The groupings for lower ratio inputs, 76A3, 78A3 and 80A3, show a smaller phase error, but amplifiers with a wide bandwidth are still required to reduce the phase error to a relatively low value.

Figure 16B:
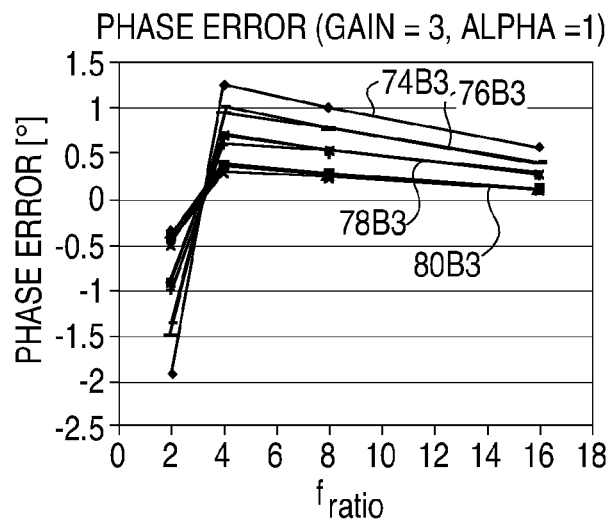
Figure 16C:
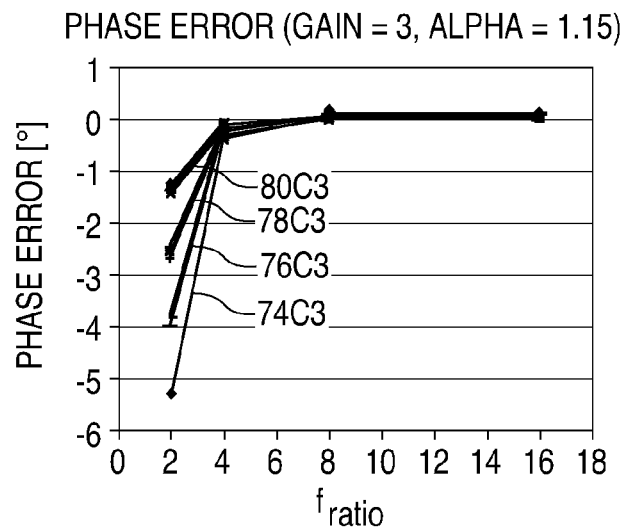

FIG. 16B shows the corrected phase error after the phase is corrected in accordance with equation (9) above. Once again, four groupings are shown (74B3, 76B3, 78B3 and 80B3) for the ten differing input ratios. In this case, the factor α is set to 1.0. This results in a substantial reduction in the phase error measurement. The phase error measurement is almost eliminated as shown in FIG. 16C if α is increased from 1.0 to 1.15. This is consistent with FIG. 15A which shows that a higher value of α is a better fit for a gain of 3 and where the values of $f_{ratio}$ is greater than four.

Figure 17A:
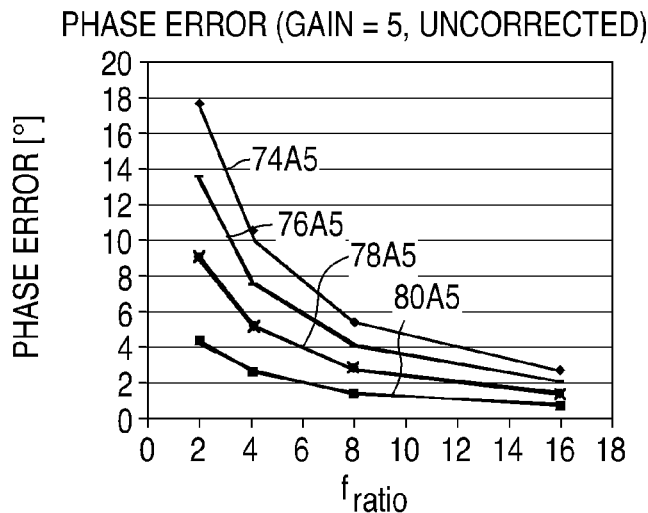
FIGS. 17A to 17C are similar to FIGS. 16A to 16C and illustrate how phase errors can be corrected using a particular value of alpha for differing amplifier stage frequency responses ($f_{ratio}$) when the amplifier stage gain is increased from three to five.
Figure 17B:
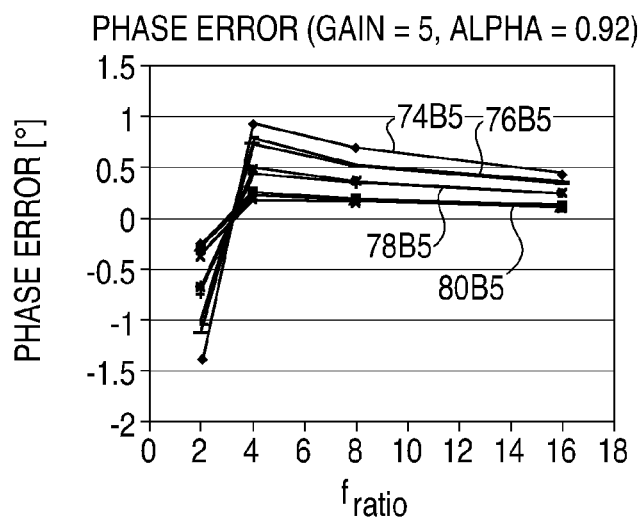
Figure 17C:
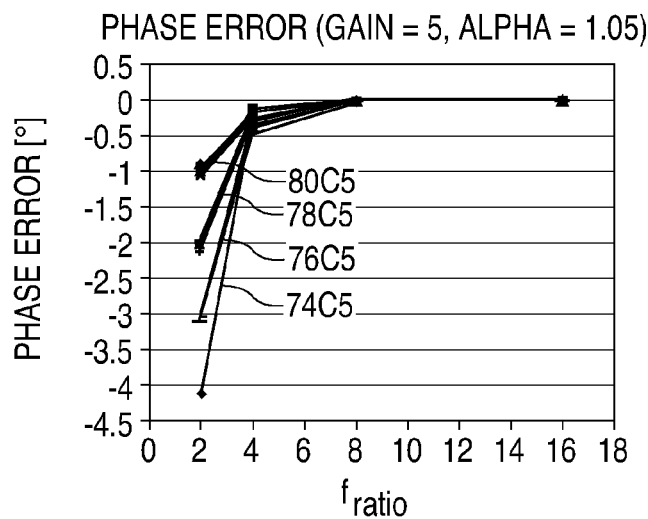
Figure 18A:
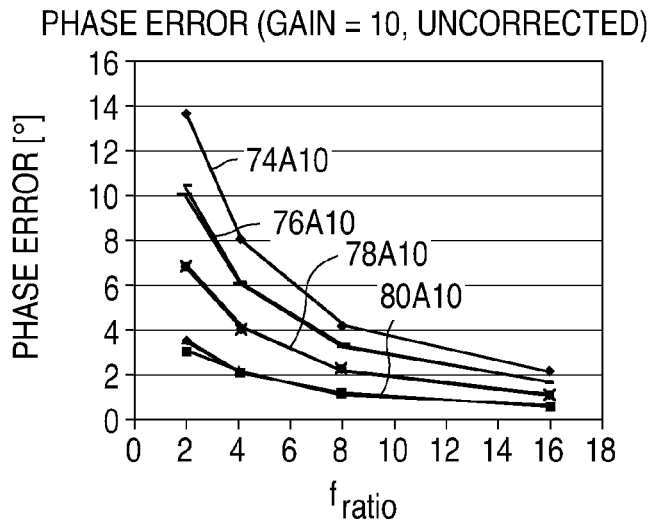
FIGS. 18A to 18C are similar to FIGS. 16A to 16C and illustrate how phase errors can be corrected using a particular value of alpha for differing amplifier stage frequency responses ($f_{ratio}$) when the amplifier stage gain is increased from three to ten.
Figure 18B:
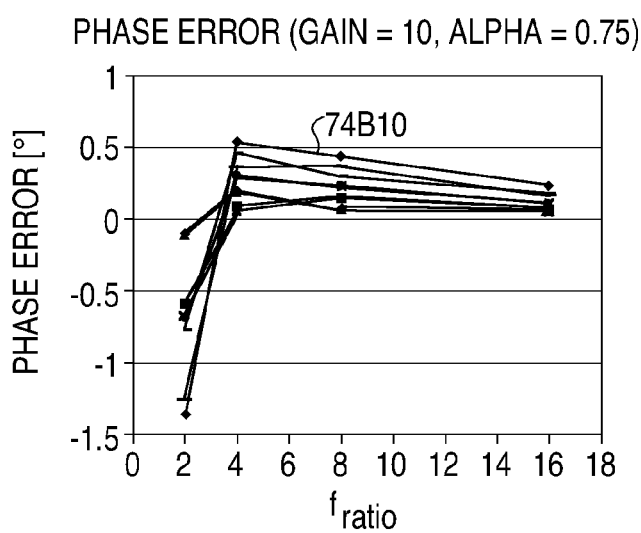
Figure 18C:
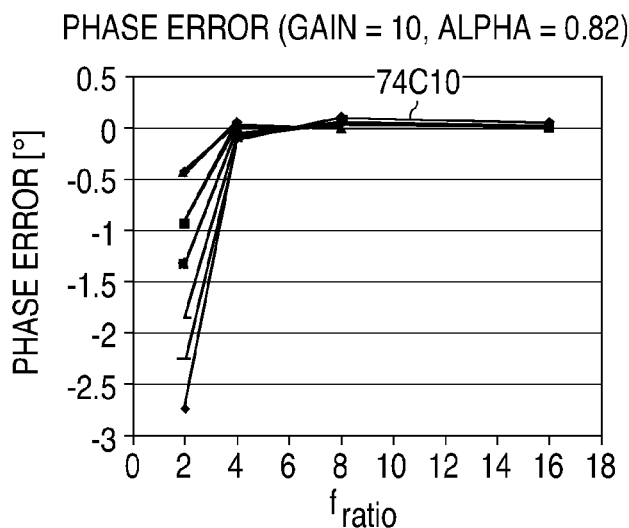

FIGS. 17A and 18A show the uncorrected phase error when the gain is increased to 5 and to 10, respectively. The phase errors are only slightly improved over that of FIG. 16A. FIGS. 17B and 17C show the corrected phase errors for a gain of 5 where α is 0.92 and 1.05, respectively. FIGS. 18B and 18C are each for a gain of 10 where only the maximum input ratio Vin2/Vin1 is depicted (74B10 of FIGS. 18B and 74C10 of FIG. 18C). It can be seen from FIG. 18B, where the α value is 0.75 that the phase error is fairly good even for a minimum value of $f_{ratio}$=2. FIG. 18C shows a very accurate phase measurement using an a value of 0.82 if the minimum value of $f_{ratio}$ is 4.

Although there is still a tradeoff between power and accuracy, it can be seen that good accuracy can be achieved at relatively low power consumption. Recalling that $f_{ratio} = f_{3dB\_ganistage}/f_{in}$, an amplifier stage bandwidth of only 2× to 4× of the input frequency is sufficient to achieve good phase accuracy. This is compared to the standard prior art phase detector where 16× to 32× is usually required.

As indicated by equation (9), two items of information are needed to provide this level of accuracy. First, the value of "$Log_{10}$ (Vin2/Vin1)" needs to be determined since this is a major unknown and cannot be controlled. Second, the value of "$tdr_{saturated}$" needs to be ascertained. As previously described, the "$Log_{10}$ [Vin2/Vin1]" term is typically already generated by other circuitry as shown by circuitry 24 of FIG. 5. Further, the value of $tdr_{saturated}$ can be extracted from the amplifier channels by deliberating adding a delay in one of the channel before multiplying as will be described.

Figure 19:
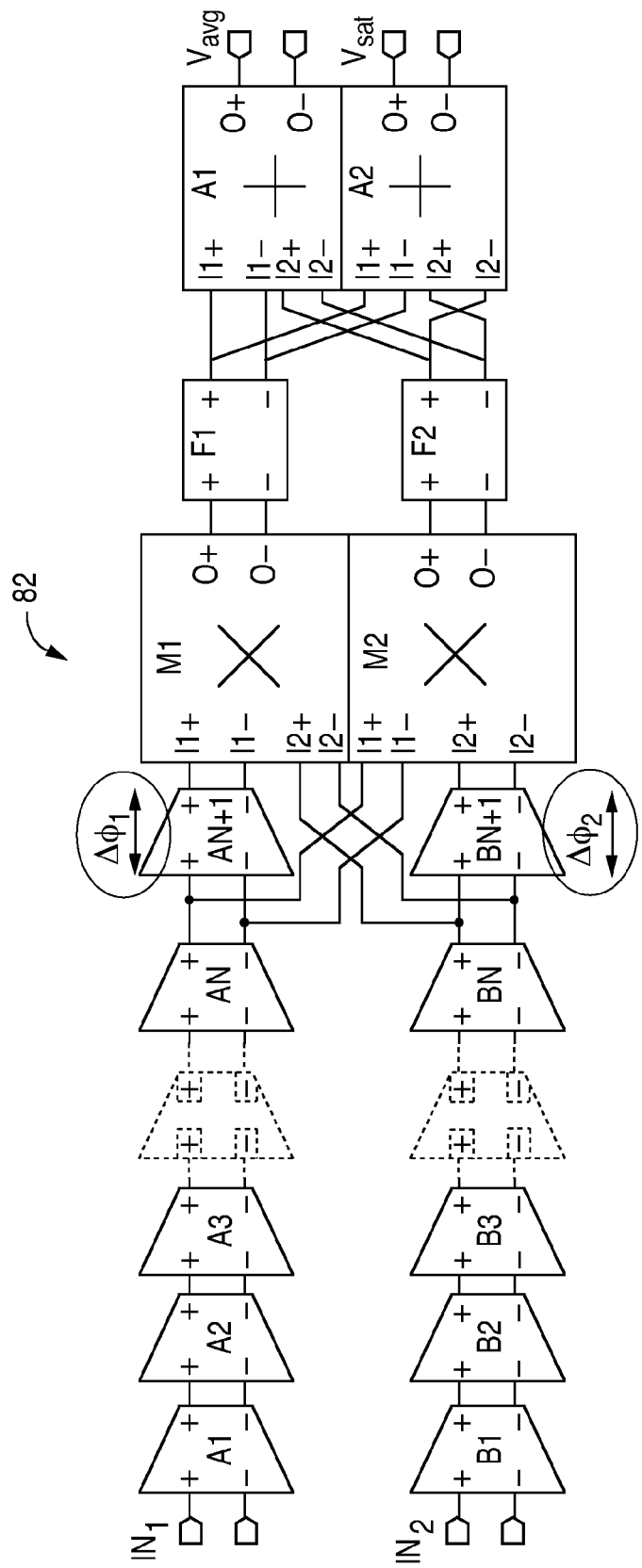
FIG. 19 is a diagram of a first embodiment phase detector in accordance with one aspect of the present invention.

FIG. 19 depicts one embodiment 82 of the present invention. A first amplification channel is provided which includes gain stages A1 to AN followed by a delay stage AN+1 that introduces a phase shift $\Delta\phi_1$. A second amplification channel is provided which includes gain stages B1 to BN followed by a delay stage BN+1 that introduces a phase shift Δϕ2. A multiplication stage M1 functions to multiply the output of stage AN+1 with the output of stage BN. Another multiplication stage M2 functions to multiply the output of stage BN+1 with the output of stage AN. The phase shift introduced by stage AN+1 is defined as follows:

$$\Delta\phi_1 = [tdr(AN+1, IN1)/f_{ratio}][rad] \qquad (10)$$

The phase shift introduced by stage BN+1 is defined as follows:

$$\Delta\phi_2 = [tdr(BN+1, IN2)/f_{ratio}][rad] \qquad (11)$$

Figure 20A:
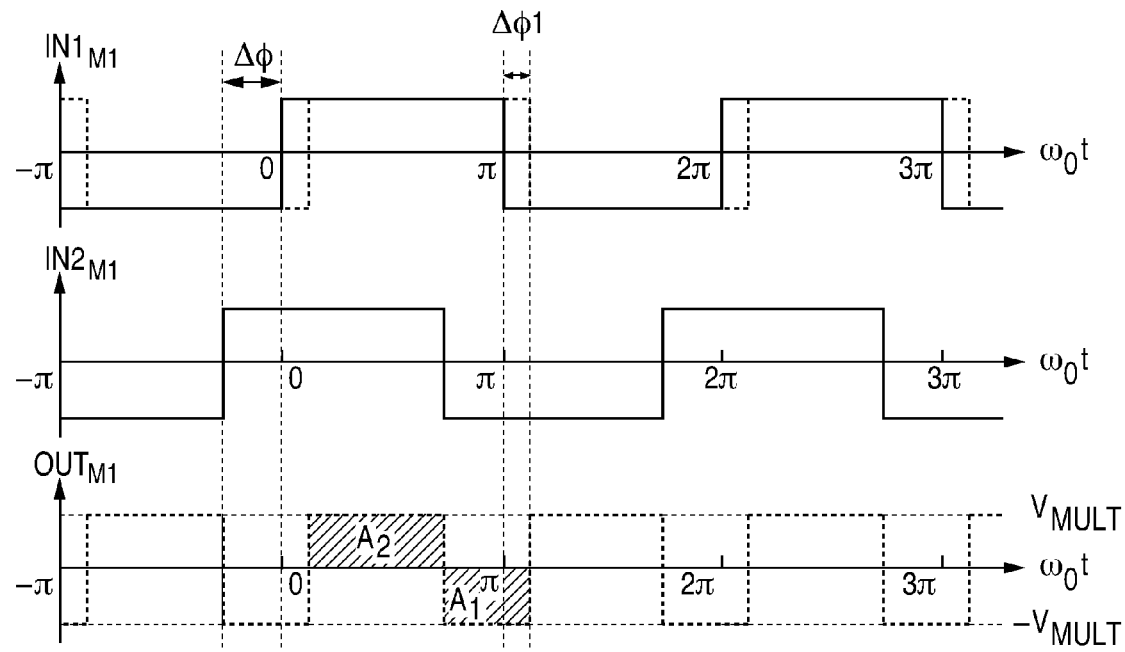
FIGS. 20A and 20B are timing diagrams illustrating operation of the FIG. 19 embodiment phase detector when the phase difference is between 0 and $\pi$ radians.
Figure 20B:
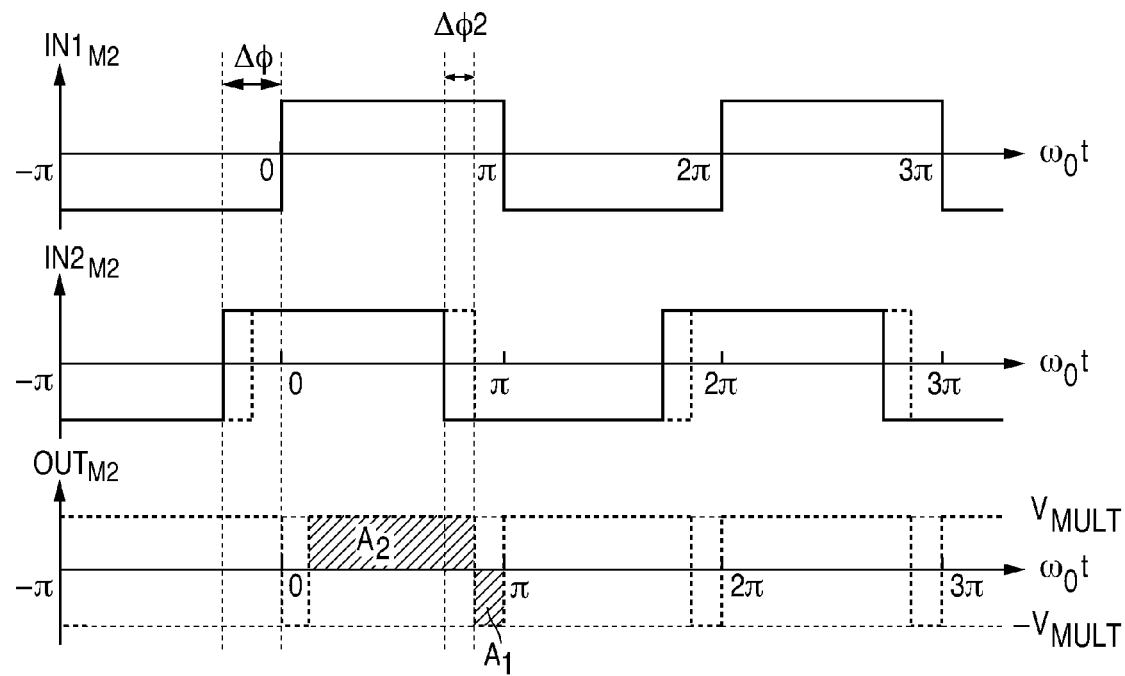

FIGS. 20A and 20B are timing diagrams which relate to detector operation where input signal IN2 is leading input signal IN1, so that by definition the phase difference Δϕ between inputs ($\phi_2-\phi_1$) is positive: $0 \le \Delta\phi \le \pi$. FIG. 20A relates to those signals associated with multiplier M1. The actual phase difference between inputs input signal IN1 and input signal IN2 is Δϕ. The phase shift introduced by amplifier stage AN+1 is $\Delta\phi_1$ with this shift being introduced in the signal path of input $IN1_{M1}$ as indicated by the top waveform of FIG. 20A. In this case, the two phase shifts Δϕ and $\Delta\phi_1$ add together to increase the apparent phase difference between inputs IN1 and IN2 as seen by multiplier M1. This is reflected by the output of multiplier M1, which is waveform $OUT_{M1}$. When the two signals at the inputs to the multiplier M1 are different, the output is low, with the output being high in all other cases. Thus when both inputs are high, $OUT_{M1}$ is high for a duration that corresponds to area A2. When the inputs are different, $OUT_{M1}$ is low for a duration that corresponds to area $A_1$. As shown in FIG. 19, $OUT_{M1}$ is passed through low pass filter F1 to produce an average value of $A_2$ and $A_1$ referred to as $V_{avg\_M1}$.

As can be seen by inspection of signal $OUT_{M1}$ of FIG. 20A, the average output of multiplier M1 after filtering is as follows:

$$V_{avg\_M1} = (A_2 - A_1)/\pi$$

or $$V_{avg\_M1} = V_{MULT}[(\pi - (\Delta\phi + \Delta\phi_1))/\pi - (\Delta\phi + \Delta\phi_1)/\pi]$$

or $$V_{avg\_M1} = V_{MULT}[1 - 2(\Delta\phi + \Delta\phi_1)/\pi] \qquad (12)$$

As previously noted, the timing diagram of FIG. 20B is also for positive values of Δϕ and relates to those signals associated with multiplier M2. The actual phase difference between inputs input signal IN1 and input signal IN2 remains Δϕ. The phase shift introduced by amplifier stage BN+1 is $\Delta\phi_2$ with this shift being introduced in the signal path of input $IN2_{M2}$. Since the phase shift $\Delta\phi_2$ is introduced in the opposite amplification channel as compared to shift $\Delta\phi_1$, shift $\Delta\phi_2$ subtracts from the actual phase shift Δϕ so as to decrease the apparent phase shift seen by multiplier M2. This is reflected by the output of multiplier M2, which is waveform $OUT_{M2}$. Once again, when both multiplier inputs are high, $OUT_{M2}$ is high for a duration that corresponds to area A2. When the inputs are different, $OUT_{M2}$ is low for a duration that corresponds to area $A_1$. As shown in FIG. 19, $OUT_{M2}$ is passed through low pass filter F2 to produce an average value of $A_2$ and $A_1$ referred to as $V_{avg\_M2}$.

As can be seen by inspection of signal $OUT_{M2}$ of FIG. 20B, the average output of multiplier M2 after filtering is as follows:

$$V_{avg\_M2} = (A_2 - A_1)/\pi$$

or $$V_{avg\_M2} = V_{MULT}[(\pi - (\Delta\phi - \Delta\phi_2))/\pi - (\Delta\phi - \Delta\phi_2)/\pi]$$

or $$V_{avg\_M2} = V_{MULT}[1 - 2(\Delta\phi - \Delta\phi_2)/\pi] \qquad (13)$$

As can be seen in FIG. 19, an adder A1 is provided for adding the filtered output of multiplier M1 and the filtered output of multiplier M2. The sum is as follows:

$$V_{avg} = 2V_{MULT}[(1 - (2\Delta\phi)/\pi) - (\Delta\phi_1 - \Delta\phi_2)/\pi] \qquad (14)$$

The above value of $V_{avg}$ alone would provide a fairly accurate measurement of Δϕ but only if the inputs IN1 and IN2 are of similar magnitude so as they have the same propagation delay through the two amplification channels. However, the relative magnitudes of IN1 and IN2 will vary substantially which, as previously established, results in widely varying propagation delays through the two channels. A further term Vsat is computed to address this problem. The filtered output of multiplier M1 is added by adder A2 to the filtered and inverted output of multiplier M2 to produce the following:

$$V_{sat} = -2V_{MULT}[(\Delta\phi_1 + \Delta\phi_2)/\pi] \qquad (15)$$

As will be seen, $V_{SAT}$ of equation (15) is used with other terms to provide a correction factor to be combined with Vavg to produce a corrected phase measurement.

Figure 21A:
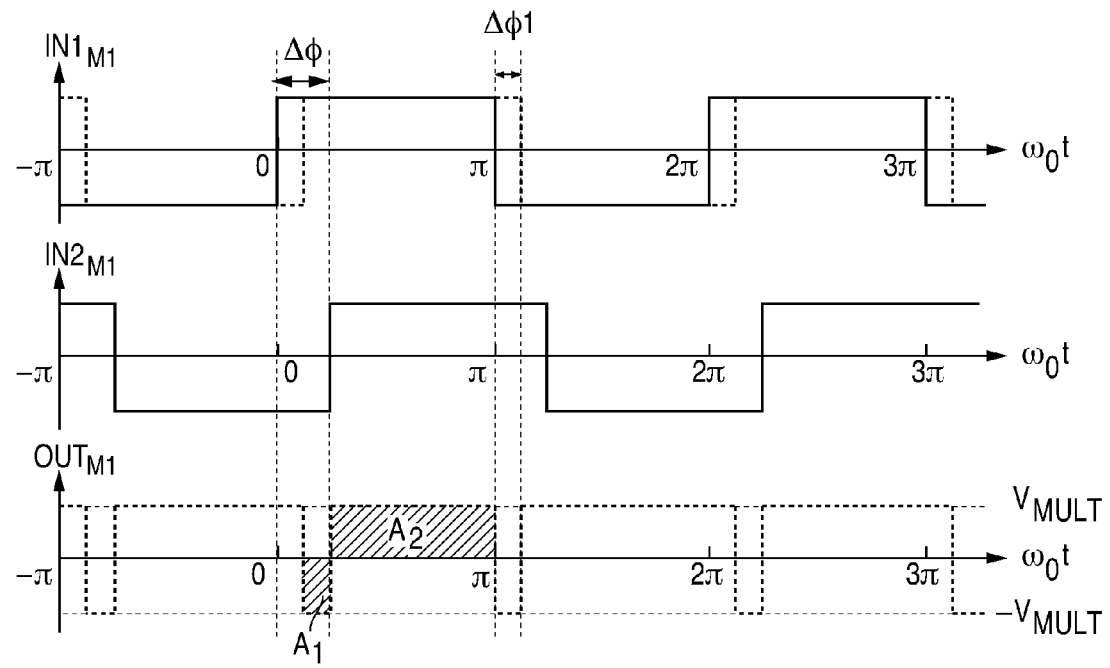
FIGS. 21A and 21B are timing diagrams illustrating operation of the FIG. 19 embodiment phase detector when the phase difference is between 0 and $-\pi$ radians.
Figure 21B:
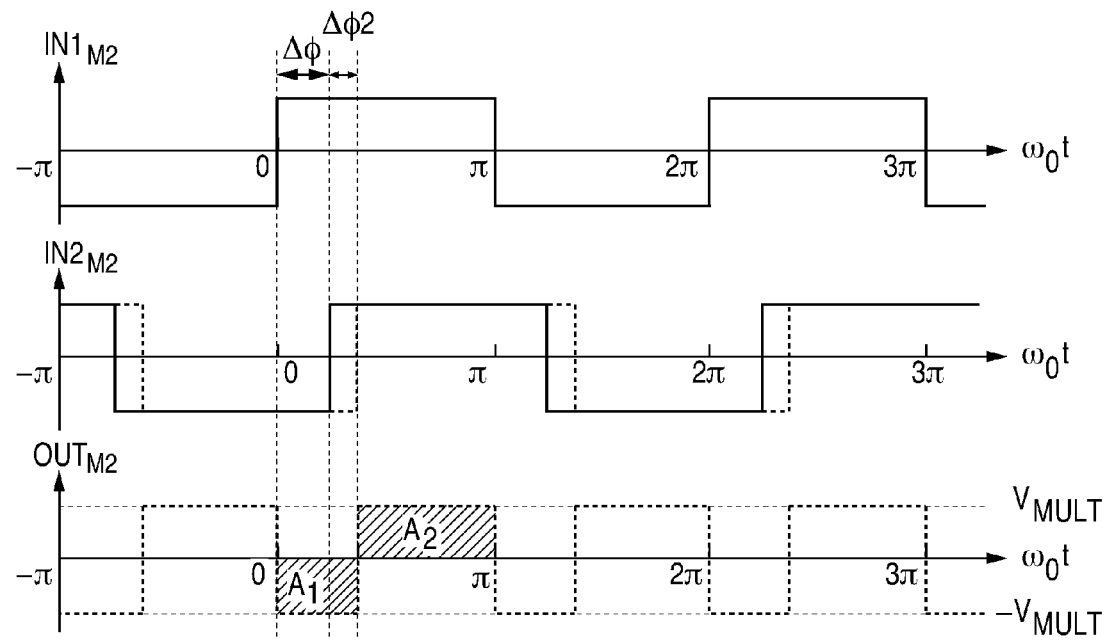

The above analysis is for $0 \le \Delta\phi \le \pi$. A similar analysis of the phase detector of FIG. 19 is carried out when $-\pi \le \Delta\phi \le 0$ as shown in the waveforms of FIGS. 21A and 21B. Referring to the timing diagram of FIG. 21A, this diagram relates to the signals associated with multiplier M1. The actual phase difference between IN1 and IN2 at the input of the respective amplifier channels is −Δϕ where $IN1_{M1}$ is leading $IN2_{M1}$. Once again, amplification stage AN+1 introduces a phase delay $\Delta\phi_1$ in the channel for $IN1_{M1}$. As can be seen by inspection of the three waveforms $IN1_{M1}$, $IN2_{M1}$ and $OUT_{M1}$ of FIG. 21A, the average output of multiplier M1 (FIG. 19) after filtering is as follows:

$$V_{avg\_M1} = (A_2 - A_1)/\pi$$

or $$V_{avg\_M1} = V_{MULT}[(\pi - (-\Delta\phi - \Delta\phi_1))/\pi - (-\Delta\phi - \Delta\phi_1)/\pi]$$

or $$V_{avg\_M1} = V_{MULT}[1 + 2(\Delta\phi + \Delta\phi_1)/\pi] \qquad (16)$$

Referring to the timing diagram of FIG. 21B, this diagram relates to the signals associated with multiplier M2 when $-\pi \le \Delta\phi \le 0$. In this case the actual phase difference between IN1 and IN2 at the input of the respective amplifier channels is −Δϕ where $IN1_{M2}$ is leading $IN2_{M2}$. Once again, amplification stage BN+1 introduces a phase delay $\Delta\phi_2$ in the channel for $IN2_{M2}$. As can be seen by inspection of waveforms $IN1_{M2}$, $IN2_{M2}$ and $OUT_{M2}$ of FIG. 21B, the average output of multiplier M2 (FIG. 19) after filtering is as follows:

$$V_{avg\_M2} = (A_2 - A_1)/\pi$$

or $$V_{avg\_M2} = V_{MULT}[(\pi - (-\Delta\phi + \Delta\phi_2))/\pi - (-\Delta\phi + \Delta\phi_2)\pi]$$

or $$V_{avg\_M2} = V_{MULT}[1 + 2(\Delta\phi - \Delta\phi_2)/\pi] \qquad (17)$$

Referring again to FIG. 19 and as previously noted, adder A1 is provided for adding the filtered output of multiplier M1 and the filtered output of multiplier M2. In this case, to sum is as follows:

$$V_{avg} = 2V_{MULT}[(1+2\Delta\phi/\pi)+(\Delta\phi_1-\Delta\phi_2)/\pi] \tag{18}$$

As previously described, the filtered output of multiplier M1 is added to the filtered and inverted output of M2 to produce $V_{sat}$. Note that $V_{sat}$ is negative for positive values of $\Delta\phi$ and positive for negative values of $\Delta\phi$. Thus, $V_{sat}$ is the same as the previous case described in connection with FIGS. 20A and 20B but opposite in sign:

$$V_{sat} = 2V_{MULT}[(\Delta\phi_1+\Delta\phi_2)/\pi] \tag{19}$$

As previously noted, $V_{phase}$ is equal to $V_{avg}$, with a correction factor added as follows:

$$V_{phase} = V_{avg} - \alpha*\beta*\text{Log}_{10}[V_{in2}/V_{in1}]*V_{sat} \tag{20}$$

It can be assumed that $\Delta\phi_1=\Delta\phi_2=\Delta\phi_S$ where $\Delta\phi_S$ is the phase shift attributable to $\text{tdr}_{saturated}$. In that case, $\Delta\phi_S$ can be defined as follows:

$$\Delta\phi_S = 180*(tdr_{saturated})/(\pi*f_{ratio})[°] \tag{21}$$

Substituting the values of $V_{avg}$ of equation (14) and $V_{sat}$ of equation (15) into equation (20) for $V_{phase}$, the following results for the case where $0 \leq \Delta\phi \leq \pi$:

$$V_{phase} = 2V_{MULT}[(1-2\Delta\varphi/\pi)-(\Delta\varphi_1-\Delta\varphi_2)/\pi + \\ \alpha*\beta\text{Log}_{10}(V_{in2}/V_{in1})*(\Delta\varphi_1+\Delta\varphi_2)/\pi] \tag{22}$$

Since $\Delta\phi_1=\Delta\phi_2=\Delta\phi_S$, equation (22) for Vphase can be rewritten as follows:

$$V_{phase} = 2V_{MULT}[(1-2\Delta\phi/\pi)+\alpha*\beta*\text{Log}_{10}(V_{in2}/V_{in1})*(2\Delta\phi_S)/\pi] \tag{23}$$

A similar substitution of $V_{avg}$ of equation (18) and $V_{sat}$ of equation (19) into equation (20) for the case where $-\pi \leq \Delta\phi \leq 0$ results in the following:

$$V_{phase} = 2V_{MULT}[(1+2\Delta\phi/\pi)-\alpha*\beta*\text{Log}_{10}(V_{in2}/V_{in1})*(2\Delta\phi_S)/\pi] \tag{24}$$

Figure 4:
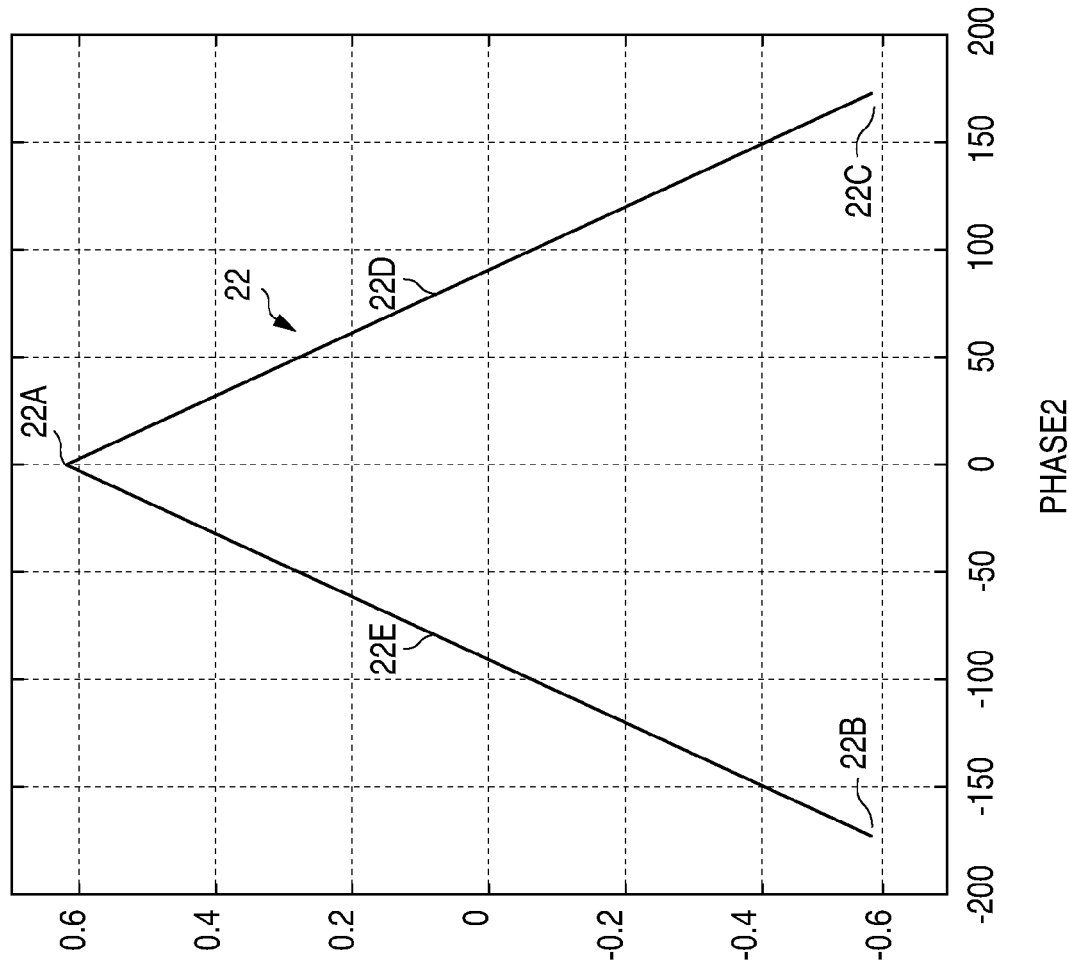
FIG. 4 shows an ideal phase detector output signal after low pass filtering.
Figure 22:
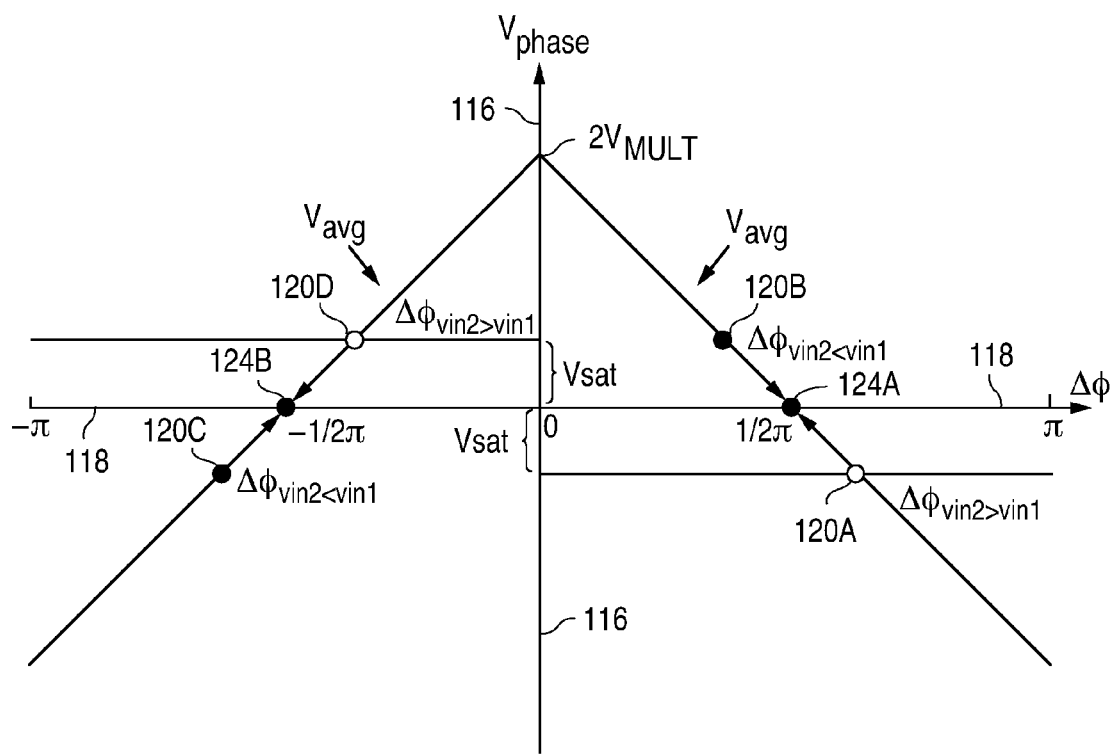
FIG. 22 is a diagram showing four separate examples of phase error correction.

FIG. 22 shows a phase detector output characteristic similar to that shown in FIG. 4. The transfer characteristics are shown for $V_{avg}$ which has the shape of an inverted "V". The horizontal axis is the phase difference $\Delta\phi$ in radians and the vertical axis is the corrected phase detector output voltage $V_{phase}$ is expressed in volts per radian. When the phase difference $\Delta\phi$ is zero, $V_{phase}$ is ideally at the maximum value of $2V_{MULT}$. Further, when the phase difference $\Delta\phi$ is $\pm 90°$ or $\pi/2$, the value of $V_{phase}$ should ideally be 0 volts.

FIG. 22 shows four separate examples of phase error correction. In two of the examples, $\Delta\phi$ is positive meaning that IN2 is leading IN1 ($\Delta\phi=\phi_2-\phi_1$). In one of those two examples, the amplitude dispersion $\Delta$tdr is such that the uncorrected value of $\Delta\phi$ is larger than it should be as indicated by node 120A. The actual value of $\Delta\phi$ should be $\pi/2$ in this example. The value of $\Delta\phi$ is too large due to the fact that $V_{in2}$ is larger than $V_{in1}$, with signal IN2 thus propagating through the amplifier channel more rapidly than signal IN1. In the case of the second example, $\Delta\phi$ is still positive but now $V_{in1}$ is much larger than $V_{in2}$. Thus, signal IN1 will propagate more rapidly so that the positive value of $\Delta\phi$ is smaller than it should be as indicated by node 120B. Once again, the actual value of $\Delta\phi$ should be $\pi/2$ in this second example.

In the case of the other two examples of FIG. 22, the value of $\Delta\phi$ is negative. In both of these examples, the actual value of $\Delta\phi$ should be $-\pi/2$. In one case the ratio of $V_{in2}/V_{in1}$ is relatively small so that the uncorrected value of $\Delta\phi$ is low as indicated, by way of example, node 120C. In the other case, the ratio of $V_{in2}/V_{in1}$ is relatively large so that the uncorrected value of $\Delta\phi$ is high as indicated, by way of example, by node 120D.

FIG. 22 further depicts the manner in which each of these four examples is corrected. The correction factor for adjusting the uncorrected value of $V_{phase}$ is $\alpha*\beta*\text{log}_{10}[V_{in2}/V_{in1}]*V_{sat}$ as previously discussed in connection with equation (20). Addressing the example noted above regarding node 120B of FIG. 22 and assuming that $V_{in2}/V_{in1}$ is 0.01, $\alpha$ is 1.0 and $\beta$ is 0.5, the correction factor is $-1*V_{SAT}$. Taking into account that $V_{sat}$ is negative for a positive $\Delta\phi$ and that the correction value is subtracted from the uncorrected value of $V_{phase}$, $V_{phase}$ is moved from node 120B to node 124A, which corresponds to the correct value of $\Delta\phi$, namely $\pi/2$. If the ratio is reversed as in the case of the example associated with node 120A where $V_{in2}/V_{in1}$ is 100, the log value changes sign so that the correction factor is $+1*V_{SAT}$. Thus, $V_{phase}$ moves from node 120A to 124A. The same analysis applies to the examples associated with nodes 120C and 120D.

Figure 23A:
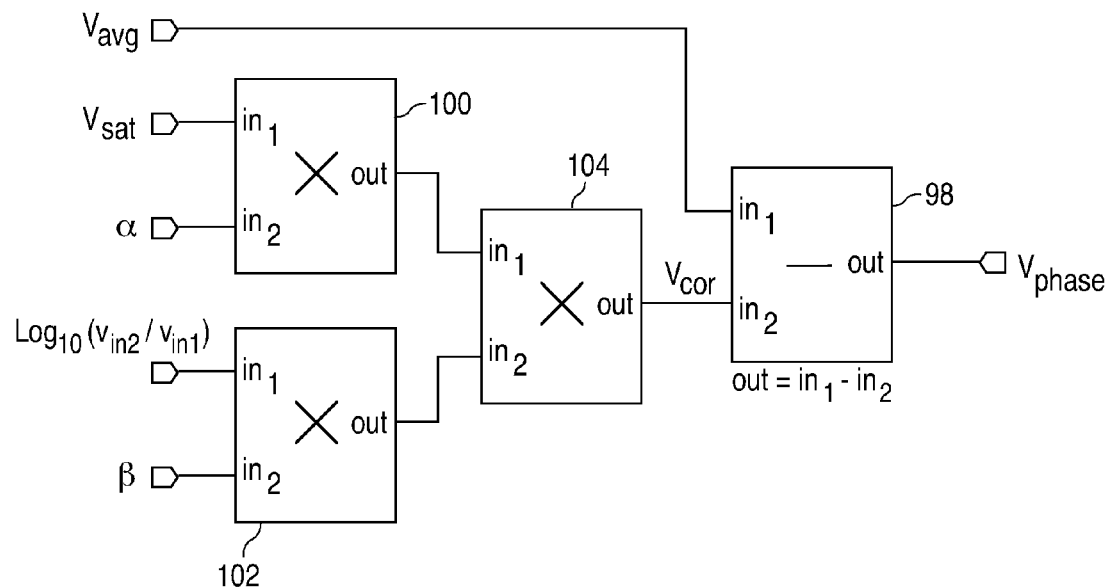
FIGS. 23A and 23B are block diagrams for producing corrected phase error measurements.

A simplified block diagram for implementing equation (24) so as to produce output $V_{phase}$ is shown in FIG. 23A. The basic circuit blocks shown in FIG. 23A are all conventional. As previously described, signal $V_{avg}$ represents the uncompensated phase measurement in accordance with equation (18) while using $\Delta\phi_1=\Delta\phi_2=\Delta\phi_s$, and is produced by adder A1 of FIG. 19. As can be seen in FIG. 23A, $V_{avg}$ is coupled to one input of a subtractor circuit 98.

A correction voltage $V_{cor}$ is applied to the other input of the subtractor circuit 98. $V_{cor}$ is produced, as indicated by equation (20) using the terms $\alpha$, $\beta$, $\text{log}_{10}[V_{in2}/V_{in1}]$ and $V_{sat}$. The value $V_{sat}$ is produced by adder circuit A2 of FIG. 19. As previously described, the $\alpha$ term typically has a value near 1.0, but can be adjusted depending upon various factors, including stage gain, as explained in the previous discussion relating to FIGS. 15A to 15C. $V_{sat}$ and $\alpha$ are multiplied together using a multiplier 100 to produce an intermediate term. As also previously discussed, the $\text{Log}_{10}[V_{in2}/V_{in1}]$ term is produced using a prior art circuit similar to circuit 24 of FIG. 5. The log term along with the $\beta$ term, typically 0.5, are applied to the respective inputs of a second multiplier 102 to produce another intermediate term. The two intermediate terms from multipliers 100 and 102 are applied to the respective inputs of a third multiplier circuit 104 to produce value $V_{cor}$. Finally, Vcor is subtracted from $V_{avg}$ by subtractor circuit 98 to produce output $V_{phase}$.

Figure 23B:
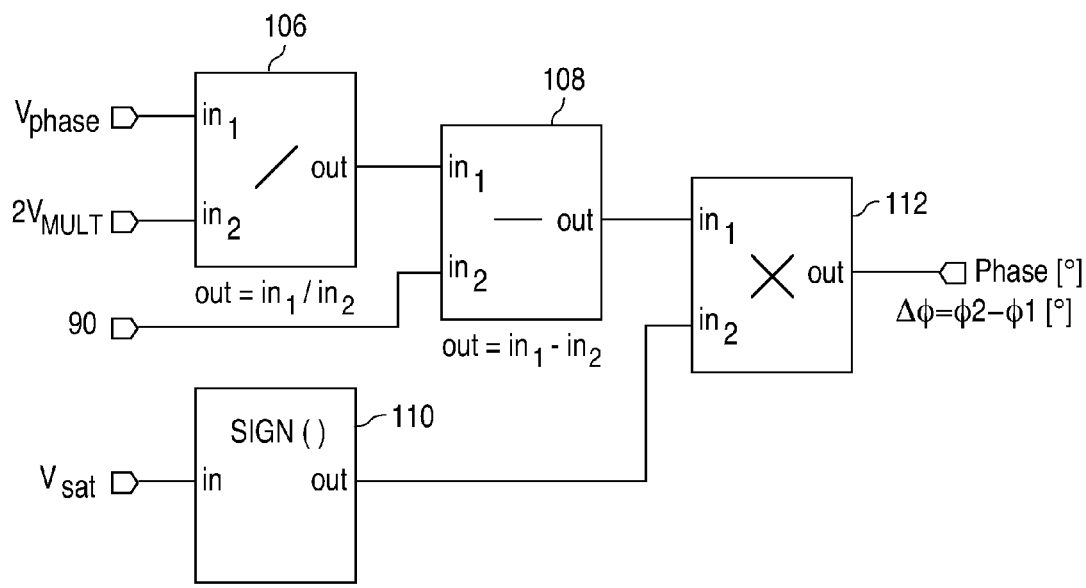

FIG. 23B shows the manner in which the Vphase output of subtractor 98 is converted to a corresponding phase difference $\Delta\phi=\phi_2-\phi_1$. One exemplary Vphase output is shown in FIG. 22. The peak value (node 116) of $V_{phase}$ is $2V_{mult}$ which is ideally at a phase difference $\Delta\phi$ of zero degrees. A $V_{phase}$ value of 0 mV ideally indicates a phase difference of either $+90°$ (node 124A) or $-90°$ (node 124B). To convert a Vphase value to a phase angle $\Delta\phi$, inspection of FIG. 22 shows the following two linear equations:

$$V_{phase} = -(2V_{mult}/90°)*\Delta\phi + 2V_{mult} \tag{25}$$

for $0 \leq \Delta\phi \leq \pi$, and $$V_{phase} = +(2V_{mult}/90°)*\Delta\phi + 2V_{mult} \tag{26}$$

for $-\pi \leq \Delta\phi \leq 0$.

The value $V_{phase}$ is divided by 2*Vmult as indicated by divider 106. An angle of 90° is then subtracted from the division step to produce Δϕ as indicated by subtractor block 108. Finally, $V_{sat}$ controls the sign of Δϕ as indicated by sign block 110. Sign block 110 has an output of 1 when the input is above a given threshold and an output of −1 when the input is below the threshold, with the threshold being zero in this case. Note that $V_{sat}$ inherently provides lead/lag information, thus enabling four quadrant phase detection.

Figure 24I:
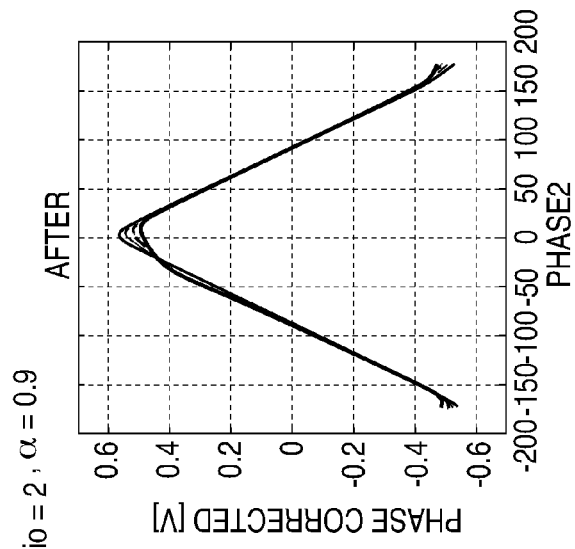
Figure 24J:
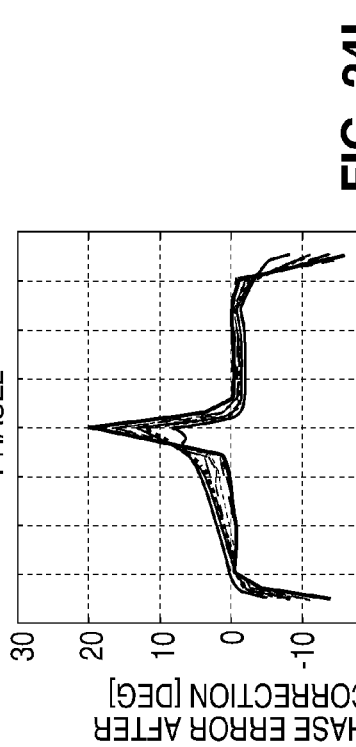

Simulation indicates that the first embodiment phase detector of FIG. 19, FIGS. 23A and 23B, sometimes referred to herein as "Type 1" provides substantially improved performance. This is particularly true when the amplification stages are implemented with relatively low bandwidth circuitry ($f_{ratio}°=2$). FIGS. 24A-24D show the relative performance to the Type 1 circuit assuming a value of α=0.9, a gain G=6, a value of β=0.5 and a relatively high bandwidth ($f_{ratio}=12$) for each of ten input ratios as set forth on the left hand side of Table 1. FIGS. 24A and 24B show the relatively similar high performance for the Vphase figure, but the FIGS. 24C and 24D phase error values show that ΔPhase is considerably improved. FIG. 24C indicates that for small input ratios (3.16/1, etc.) close to unity indicate by plot 81A/81B, for example, the errors may be on the order of ±1° but with the larger ratios (100/1) as indicated by plot 83A/83B, the errors can be around ±3°. As can be seen from FIG. 24D, the Type 1 circuit reduces the phase error value ΔPhase to around ±0.5° for all input ratios.

FIGS. 24E-24H are for an $f_{ratio}=4$ an indicate that the improvement is even more pronounced for the Type 1 detector. FIG. 24G shows that for even relatively small input ratios of 3.16 represented by plots 84A/84B, the phase error value ΔPhase to around ±3°. For the largest input ratios of 100 indicated by plots 85A/85B, the phase error value ΔPhase to around ±10°. FIG. 24H shows that the phase error value ΔPhase is corrected for all of the input magnitude ratios to around ±2°.

Figure 24K:
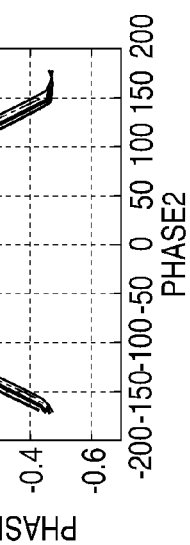
Figure 24L:
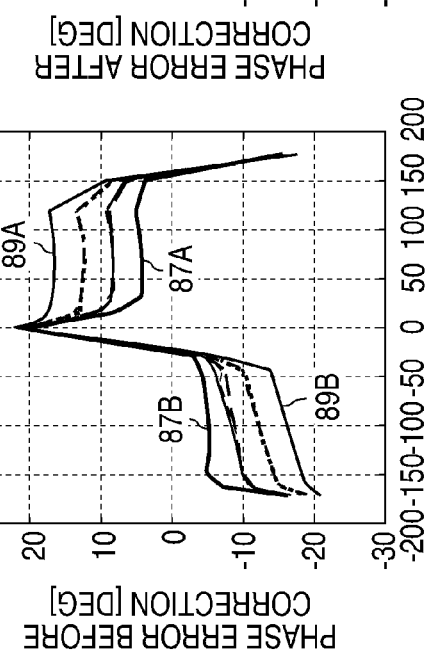

When the value of $f_{ratio}$ is reduced to only 2, as expected, the uncorrected phase error value ΔPhase increases substantially. In the example of FIG. 24K, the ΔPhase value is increased to around ±15° for high input ratios as indicated by plots 89A/89B and to around ±5° for the lower input ratios as indicated by plots 87A/87B. However, even for this low $f_{ratio}$, FIG. 24L shows reasonably good phase error values for all of the input magnitude ratios.

FIGS. 25A to 25C show the corrected phase angle ϕ measurements such as produced at the output of multiplier 112 of FIG. 23B for respective values of $f_{ratio}=2$, 4 and 12 for all ten input magnitude ratios.

Figure 26:
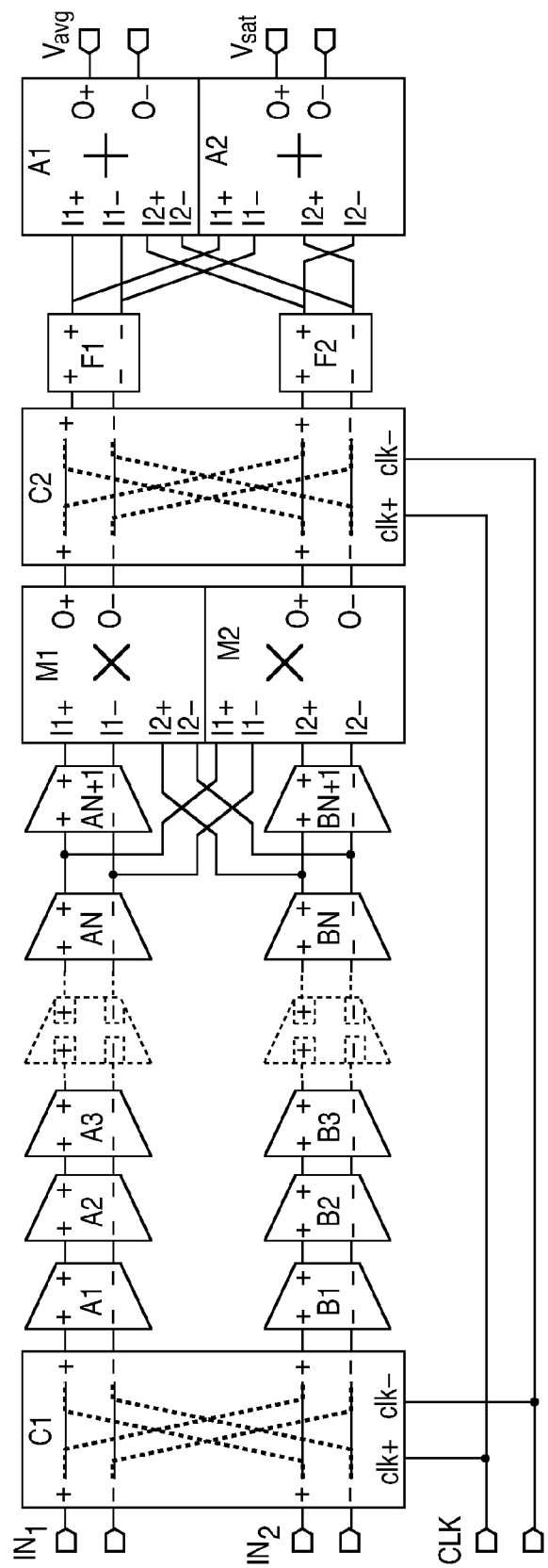
FIG. 26 is a diagram of a further embodiment phase detector in accordance with another aspect of the present invention.

A second embodiment of the present invention, referred to as "Type 2", is shown in FIG. 26. This embodiment is the same as that of FIG. 19 except for the presence of choppers C1 and C2 which are controlled by a clock signal CLK. When CLK is in a first (H) state, chopper C1 connects input IN1 to the input of amplifier stage A1 and connects input IN2 to the input of amplifier stage B1. In addition, the first state of CLK causes chopper C2 to connect the output of multiplier M1 to filter F1 and the output of multiplier M2 to filter F2. This is identical to the arrangement of FIG. 19. When CLK changes state (L), chopper C1 reverses the connections of IN1 and IN2 and chopper C2 reverses the connections of the outputs of multipliers M1 and M2. The bandwidth of low pass filters should be sufficiently lower than the chopping frequency (CLK) to reduce the ripple. The chopping frequency itself is lower than the input frequency and can be selected over a very wide range.

The equations previously provided in connection with the FIG. 19 embodiment apply equally to the embodiment of FIG. 26. The advantage of providing choppers C1 and C2 is the cancellation of multiplier M1 and M2 offsets and equalization of channel gains.

Figure 27A:
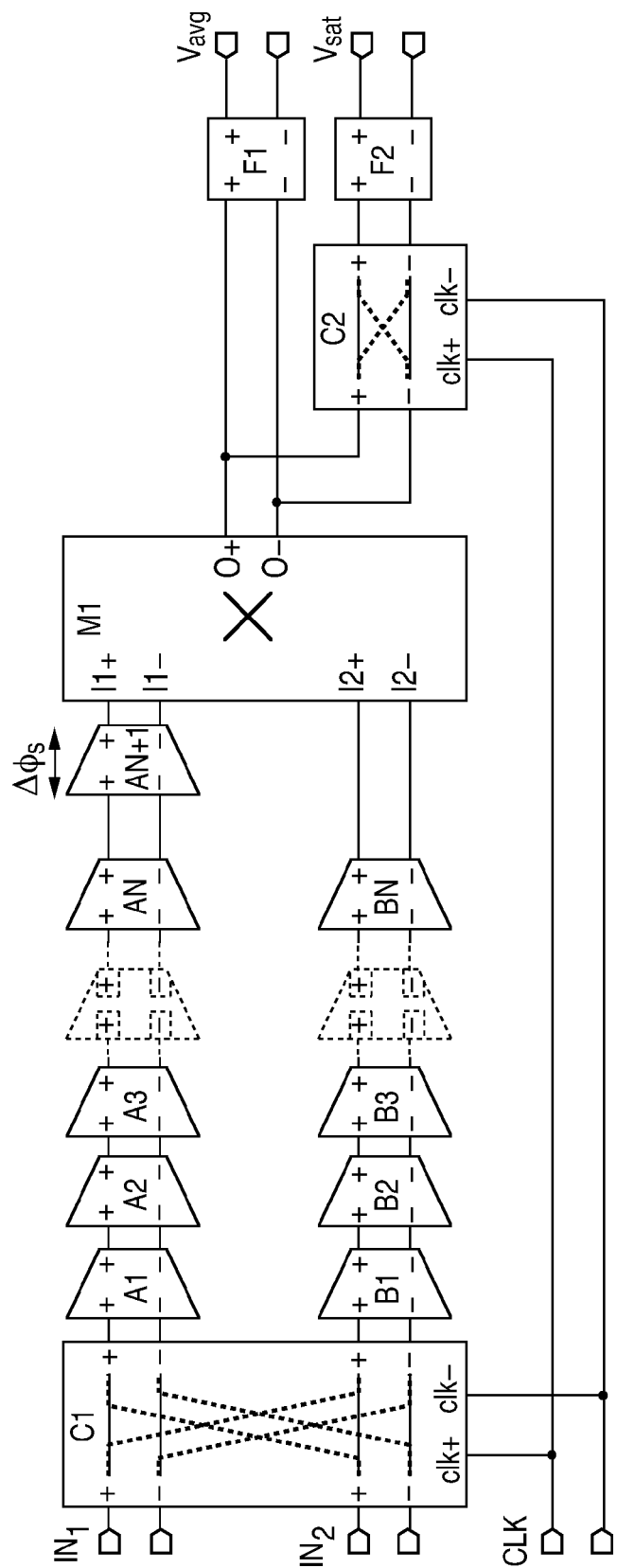
FIGS. 27A to 27C are diagrams of a further embodiment of the present invention in accordance with another aspect of the present invention.
Figure 27B:
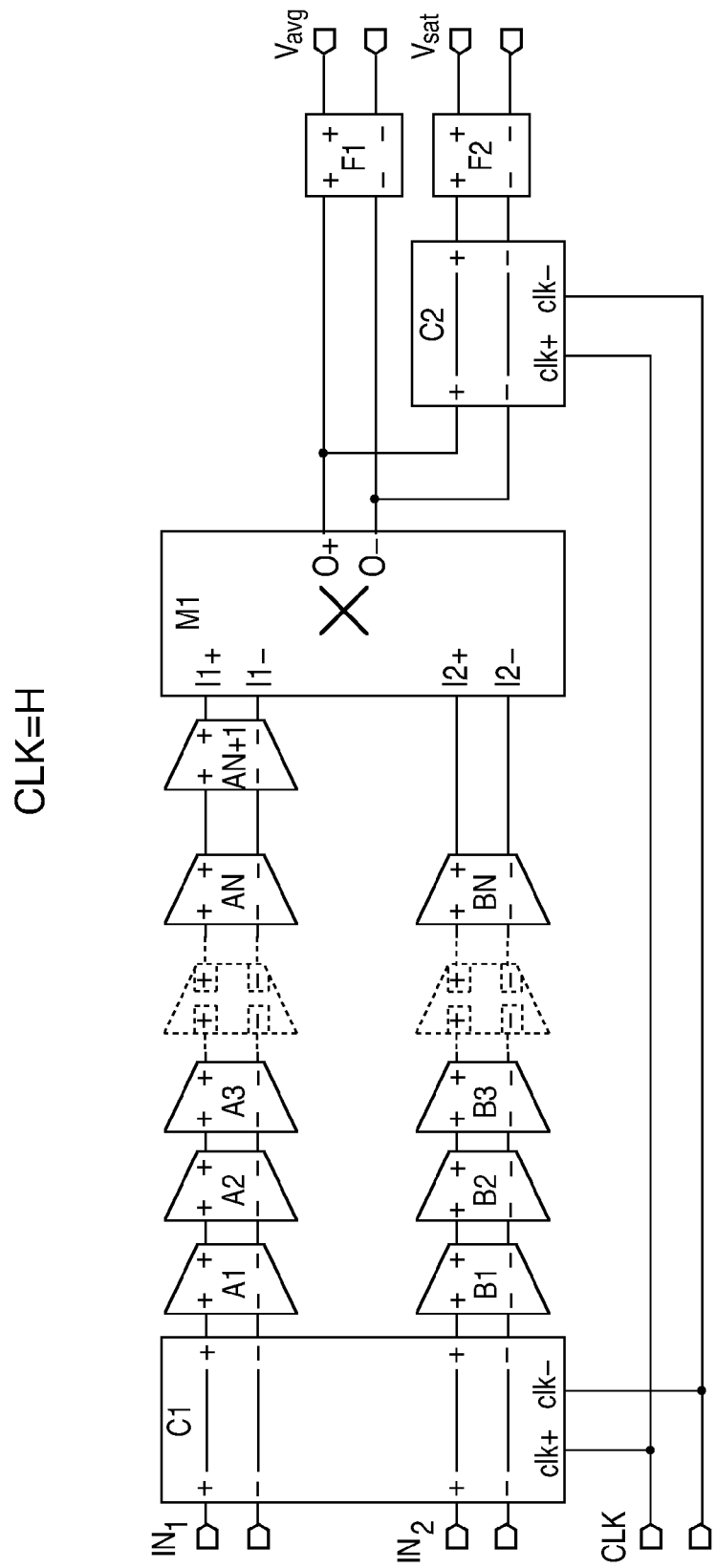
Figure 27C:
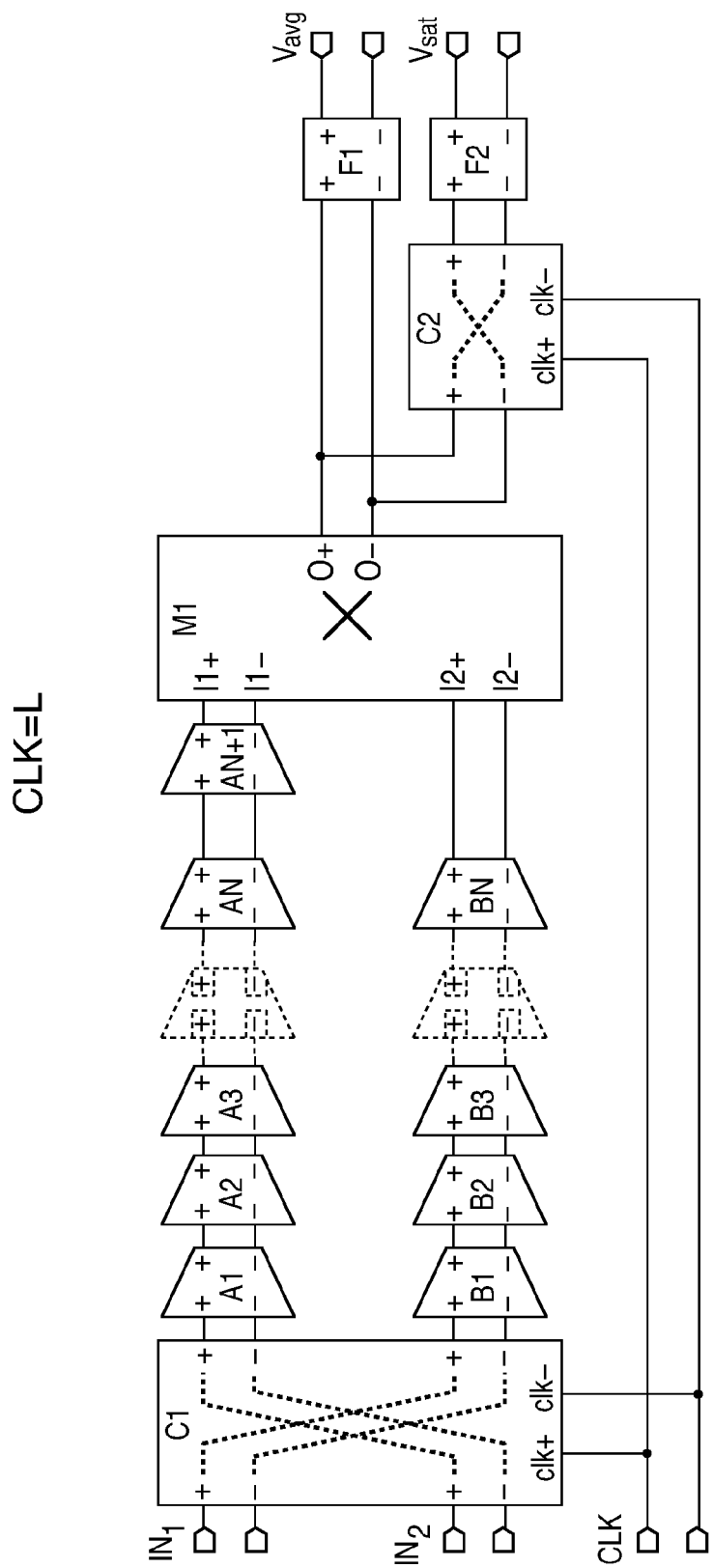

FIG. 27A shows a still further embodiment of the present invention referred to as "Type 3". In this case, only a single multiplier M1 is used. In addition, only one of the two amplifier channels includes an extra stage AN+1 to provide an additional phase shift $Δϕ_S$. Once again, a chopper C1 is provided which switches the inputs IN1 and IN2 between the two first amplifier stages A1 and B1. The output of multiplier is connected to filter F1 that produces $V_{avg}$. In addition, a second chopper C2 selectively connects the true output of multiplier M1 or the inverted output of the multiplier to filter F2 to produce $V_{sat}$. FIG. 27B shows the state of choppers C1 and C2 when CLK is in a first state (H) and FIG. 27C shows the state of choppers C1 and C2 when CLK is in a second state (L).

Figure 28A:
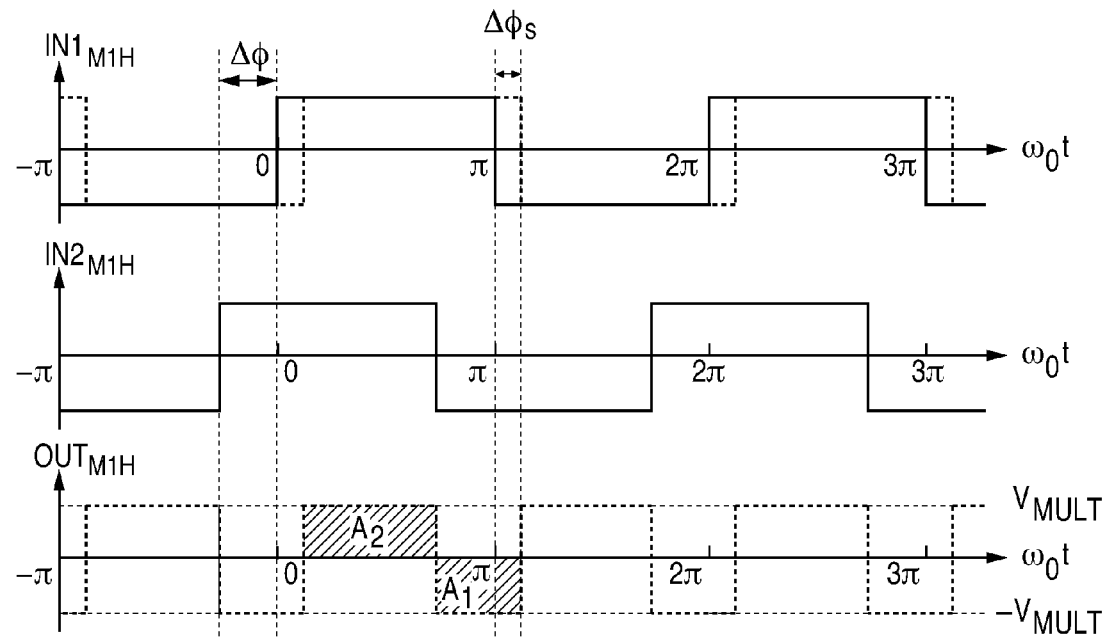
FIGS. 28A and 28B are timing diagrams illustrating operation of the FIG. 27A embodiment phase detector when the phase difference is between 0 and $\pi$ radians.
Figure 28B:
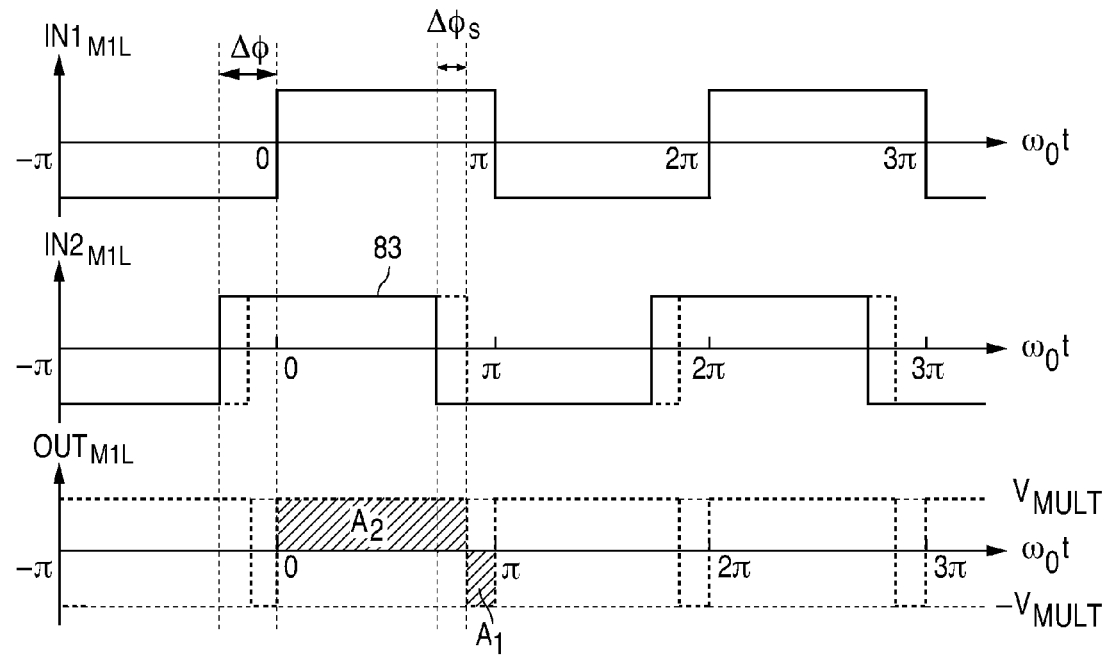

FIGS. 28A and 28B are timing diagrams illustrating the operation of the FIG. 27A embodiment when 0≤Δϕ≤π where input IN2 leads input IN1 by Δϕ. The FIG. 28A diagram applies when CLK is in the first state (H) shown in FIG. 27B. Input IN2 leads IN1 by Δϕ. In this case, due to the switch of input signals caused by chopper C1, the phase shift $Δϕ_s$ is applied to input IN1 so that the apparent phase difference between the two inputs is increased. Inspection of FIG. 28A indicates the following:

$$V_{avg\_M1}(H)=(A_2-A_1)/\pi$$

or $$V_{avg\_M1}(H)=V_{MULT}[(\pi-(\Delta\phi+\Delta\phi_S))/\pi-(\Delta\phi+\Delta\phi_S)/\pi]$$

or $$V_{avg\_M1}(H)=V_{MULT}[1-2(\Delta\phi+\Delta\phi_S)/\pi] \tag{27}$$

The FIG. 28B diagram applies when CLK is in the second state (L) shown in FIG. 27C. Input IN2 again leads IN1 by Δϕ. In this case, due to the switch of input signals caused by chopper C1, the phase shift $Δϕ_S$ is applied to input IN2 so that the apparent phase difference between the two inputs is reduced. Inspection of FIG. 28B indicates the following:

$$V_{avg\_M1}(L)=(A_2-A_1)/\pi$$

or $$V_{avg\_M1}(L)=V_{MULT}[(\pi-(\Delta\phi-\Delta\phi_S))/\pi-(\Delta\pi-\Delta\phi_S)/\pi]$$

or $$V_{avg\_M1}(L)=V_{MULT}[1-2(\Delta\phi-\Delta\phi_S)/\pi] \tag{28}$$

$V_{avg}$ is produced at the output of filter F1, with filter F1 averaging the output when CLK is in the first state (H) and in the second state (L) and can be expressed as follows:

$$V_{avg}=[V_{avg\_M1}(H)+V_{avg\_M1}(L)]/2$$

From equations (27) and (28), the value of $V_{avg}$ is as follows:

$$V_{avg}=V_{MULT}[1-2\Delta\phi/\pi] \tag{29}$$

$V_{sat}$ is produced at the output of filter F2, with filter F2 averaging the output when CLK is in the first state (H) and the inverse output when CLK is in the second state (L). Thus, $V_{sat}$ can be expresses as follows:

$$V_{sat}=[V_{avg\_M1}(H)-V_{avg\_M1}(L)]/2$$

From equations (27) and (28), the value of $V_{sat}$ is as follows:

$$V_{sat} = -V_{MULT}[2\Delta\phi_S/\pi] \quad (30)$$

Equations (29) and (30) can be used to combine $V_{avg}$ and $V_{sat}$ to produce Vphase and $\Delta\phi$ when $0 \leq \Delta\phi \leq \pi$. The circuitry of FIGS. 23A and 23B can be used for this purpose.

Figure 29A:
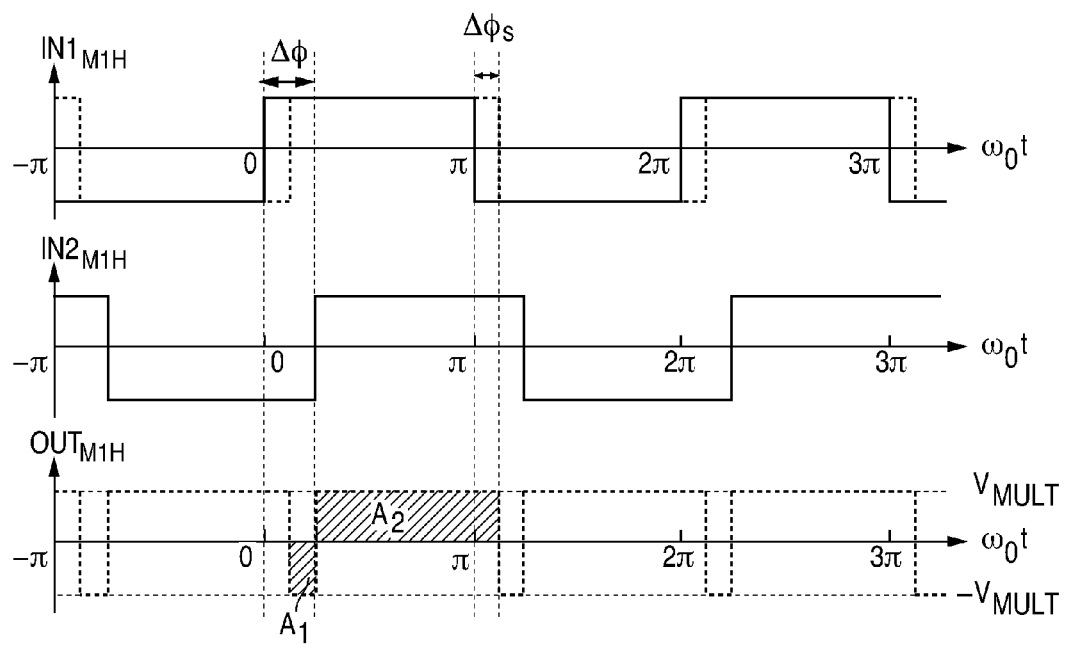
FIGS. 29A and 29B are timing diagrams illustrating operation of the FIG. 27A embodiment phase detector when the phase difference is between 0 and $-\pi$ radians.
Figure 29B:
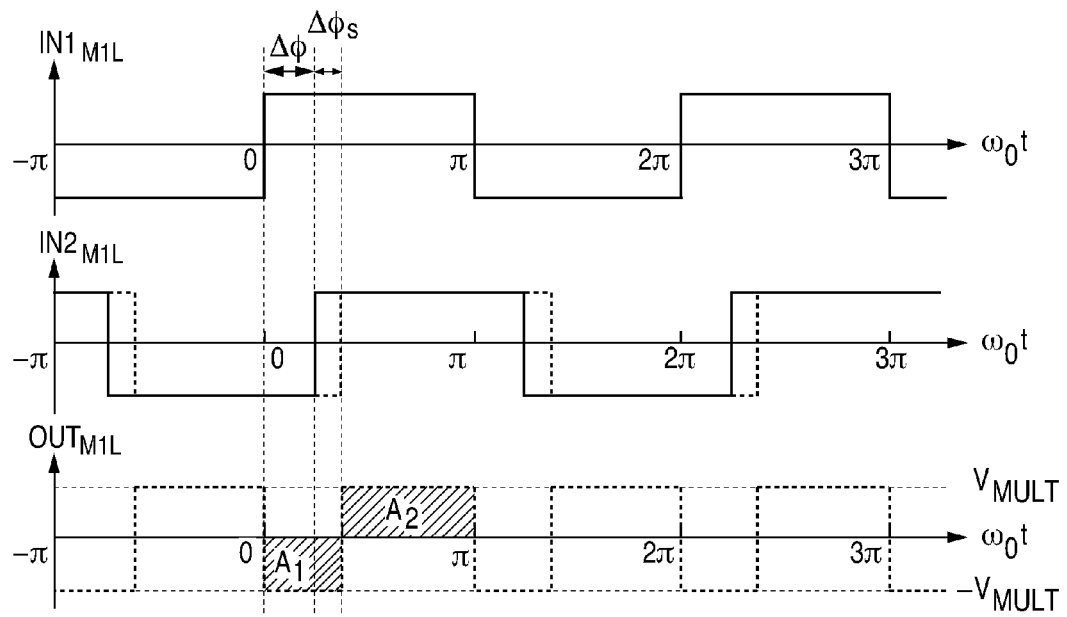

The timing diagrams of FIGS. 29A and 29B illustrate the operation of the FIG. 27A embodiment when $-\pi \leq \Delta\phi \leq 0$. FIG. 29A is directed to the FIG. 27A embodiment when signal CLK is in the first state (H). In that case, the phase delay $\Delta\phi_S$ introduced by stage AN+1 operates to delay input $IN1_{M1H}$. Inspection of the input waveforms $IN1_{M1H}$ and $IN2_{M1H}$ and the output waveform $OUT_{M1H}$ shows the following:

$$V_{avg\_M1}(H) = (A_2 - A_1)/\pi$$

or $$V_{avg\_M1}(H) = V_{MULT}[(\pi - (-\Delta\phi - \Delta\phi_S))/\pi - (-\Delta\phi - \Delta\phi_S)/\pi]$$

or $$V_{avg\_M1}(H) = V_{MULT}[1 + 2(\Delta\phi + \Delta\phi_S)/\pi] \quad (31)$$

FIG. 29B is directed to the FIG. 27A embodiment when signal CLK is in the second state (L). In that case, the phase delay $\Delta\phi_S$ introduced by stage AN+1 operates to delay input $IN2_{M1L}$. Inspection of the input waveforms $IN1_{M1L}$ and $IN2_{M1L}$ and the output waveform $OUT_{M1L}$ shows the following:

$$V_{avg\_M1}(L) = (A_2 - A_1)/\pi$$

or $$V_{avg\_M1}(L) = V_{MULT}[(\pi - (-\Delta\phi + \Delta\phi_S))/\pi - (-\Delta\phi + \Delta\phi_S)/\pi]$$

or $$V_{avg\_M1}(L) = V_{MULT}[1 + 2(\Delta\phi - \Delta\phi_S)/\pi] \quad (32)$$

As previously stated, $V_{avg}$ is produced at the output of filter F1, with filter F1 averaging the output when CLK is in the first state (H) and in the second state (L). For $-\pi \leq \Delta\phi \leq 0$, $V_{avg}$ can be expressed as follows:

$$V_{avg} = [V_{avg\_M1}(H) + V_{avg\_M1}(L)]/2$$

From equations (31) and (32), the value of $V_{avg}$ is as follows:

$$V_{avg} = V_{MULT}[1 + 2\Delta\phi/\pi] \quad (33)$$

As also previously stated, $V_{sat}$ is produced at the output of filter F2, with filter F2 averaging the output when CLK is in the first state (H) and the inverse output when CLK is in the second state (L). Thus, $V_{sat}$ can be expresses as follows:

$$V_{sat} = [V_{avg\_M1}(H) - V_{avg\_M1}(L)]/2$$

From equations (31) and (32), the value of $V_{sat}$ is as follows:

$$V_{sat} = V_{MULT}[2\Delta\phi_S/\pi] \quad (34)$$

The previously described circuitry of FIGS. 23A and 23B can then be used to convert $V_{avg}$ and $V_{sat}$ to $V_{phase}$ and Phase $\Delta\phi$.

Figure 30A:
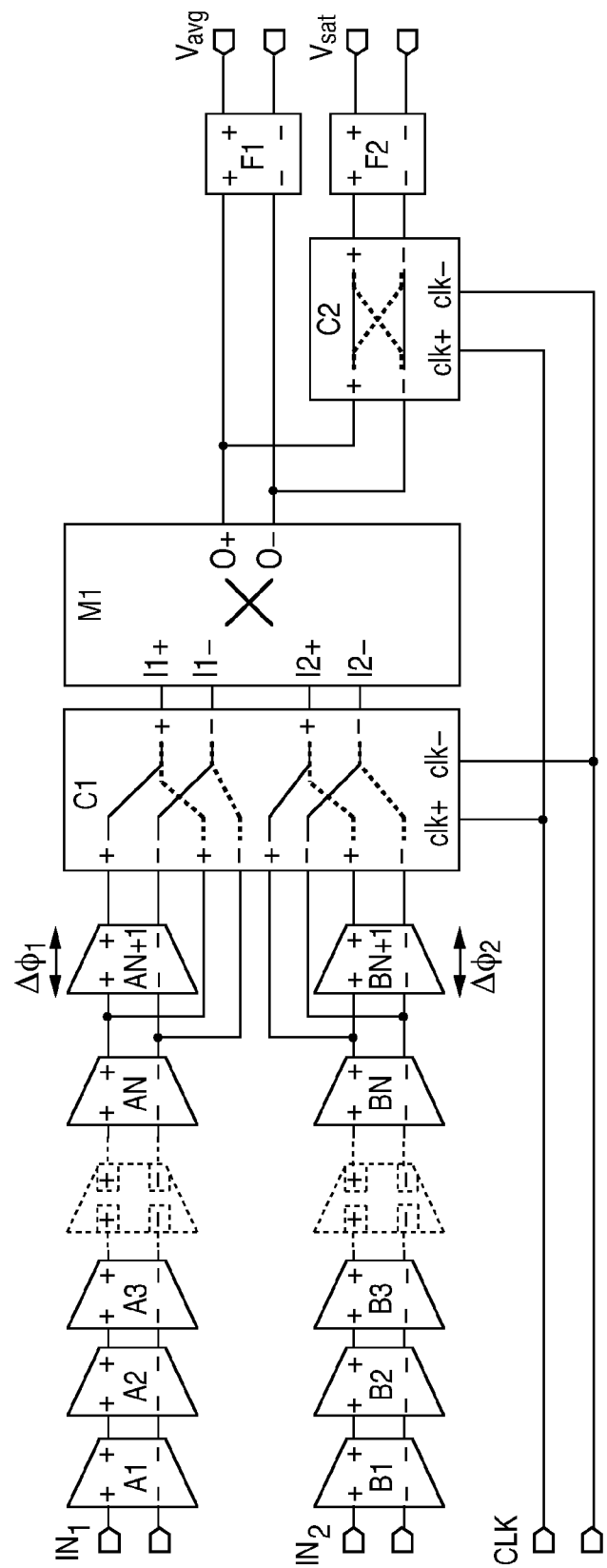
FIGS. 30A to 30C are diagrams of a further embodiment of the present invention in accordance with another aspect of the present invention.
Figure 30B:
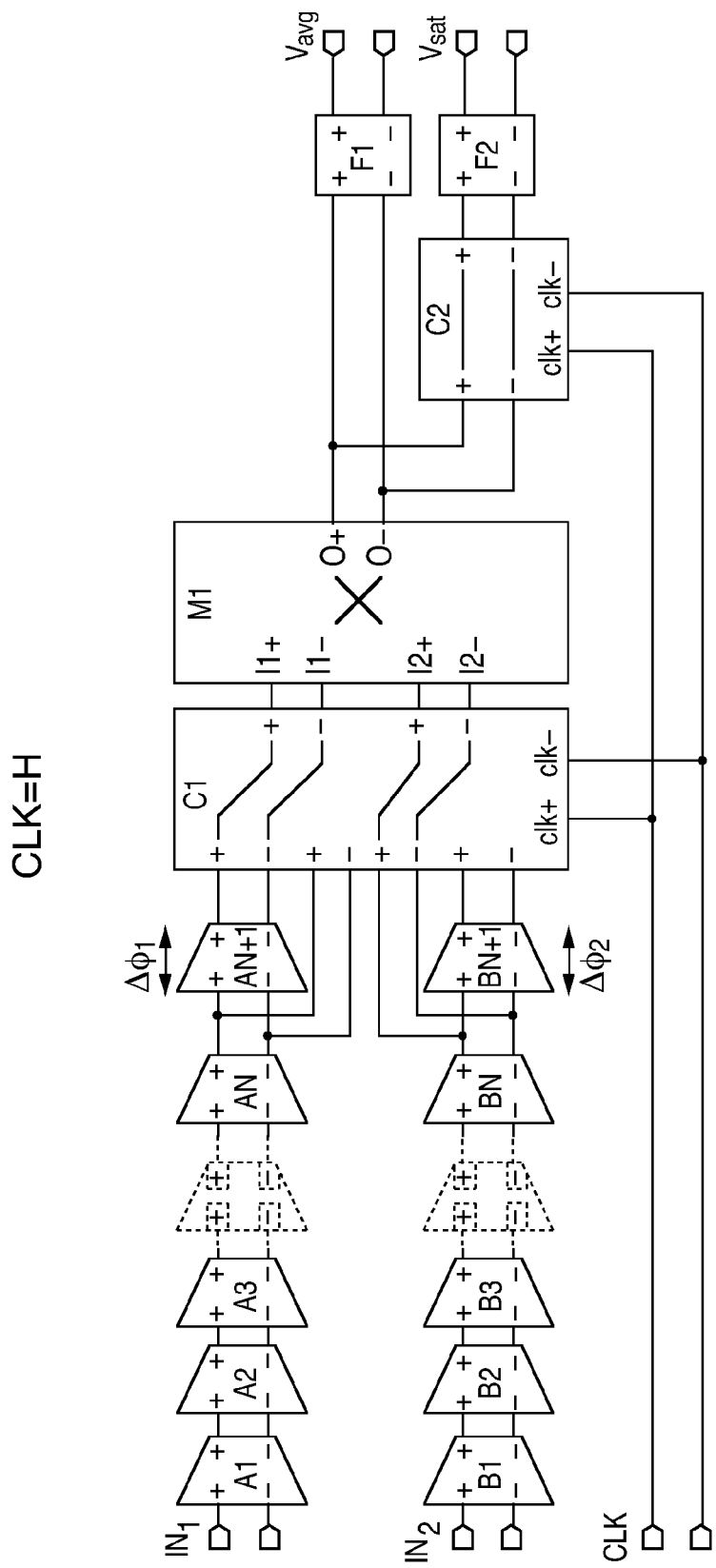
Figure 30C:
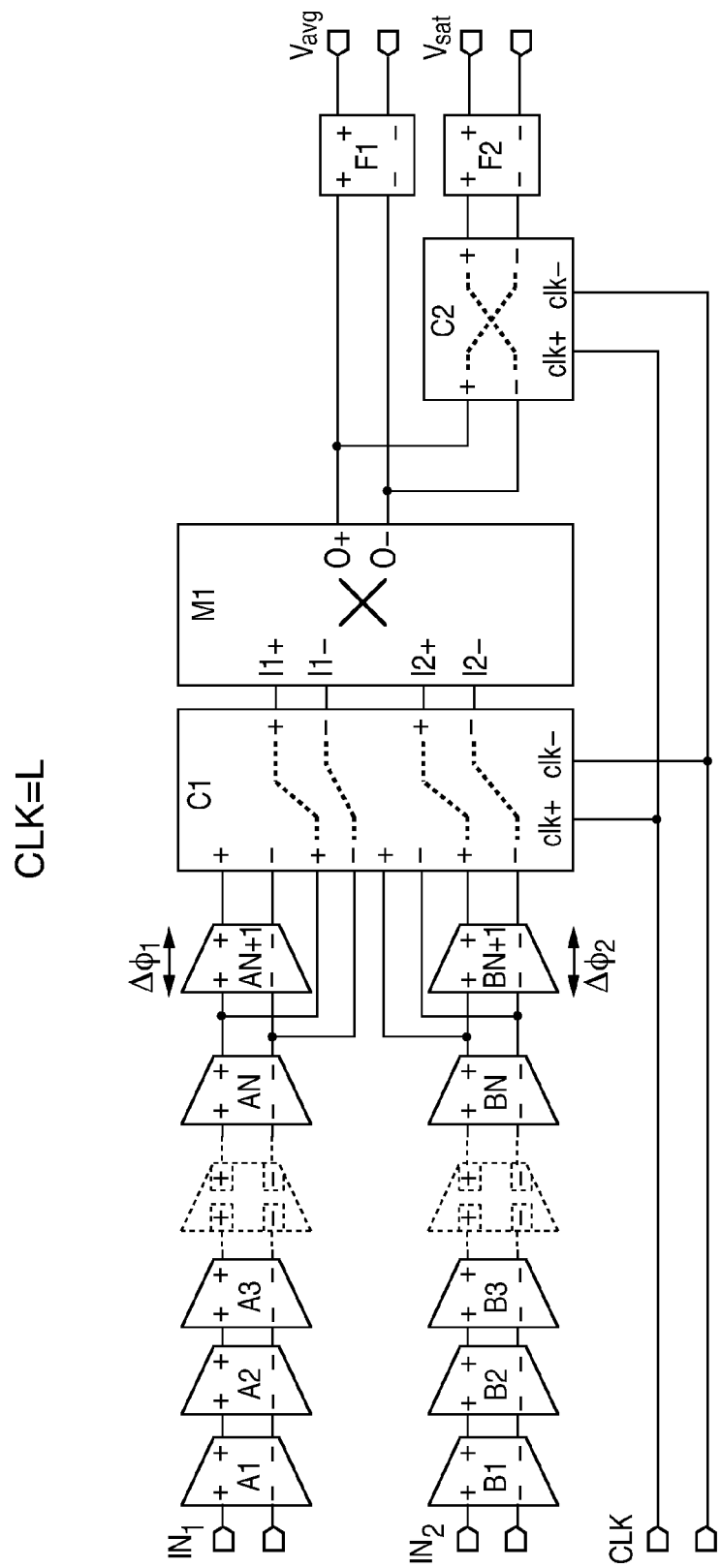

A fourth embodiment, referred to as "Type 4", is depicted in FIGS. 30A-30C. This embodiment is similar to the Type 3 embodiment of FIG. 27A except chopper C1 is moved from the inputs of the amplifier channels to the inputs of multiplier M1. Since stage AN+1 of FIG. 27A is no longer switched, it is necessary to use two delay stages AN+1 and BN+1 with each providing a respective phase delay $\Delta\phi_1 = \Delta\phi_2 = \Delta\phi_S$. The equations illustrating operation of the FIG. 30A embodiment are the same as those previously described in connection with the FIG. 27A embodiment.

Figure 31:
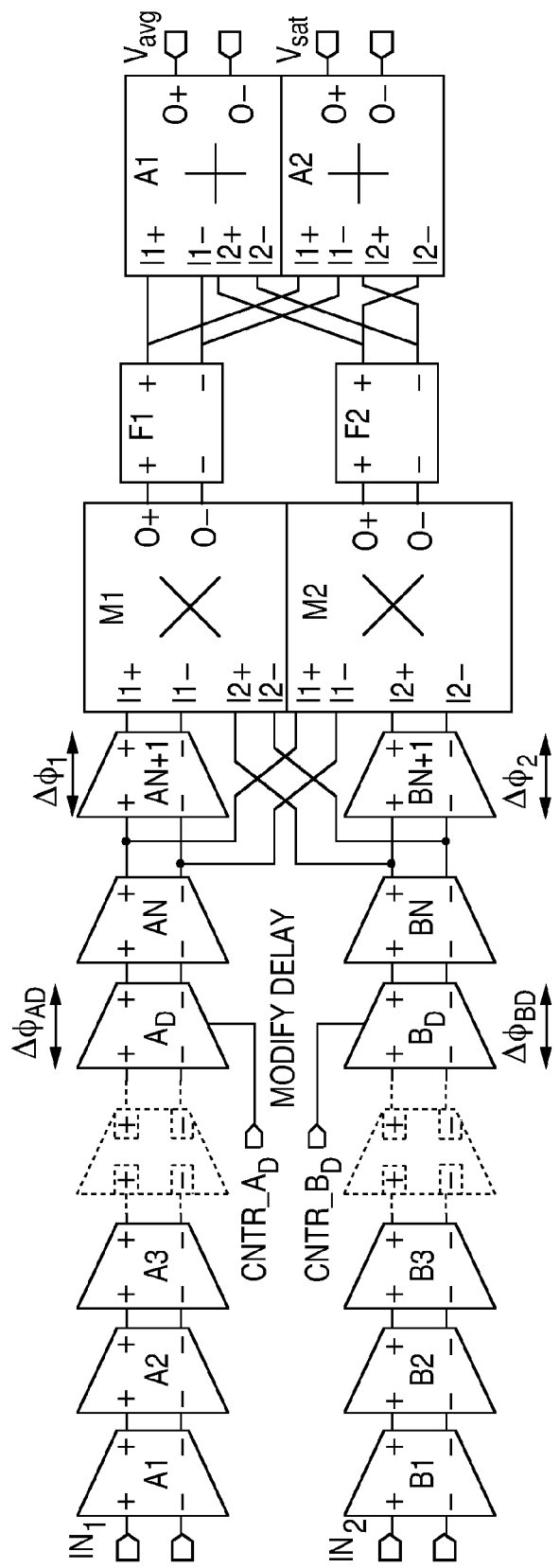
FIG. 31 is a diagram of a still further embodiment phase detector in accordance with another aspect of the present invention.

As can be seen in the phase plots of FIGS. 25A, 25B and 25C, phase detection accuracy is reduced around 0° and is also a problem around ±180°. A further embodiment of the present invention, referred to as "Type 5" is adapted to address these sources of measurement inaccuracy and is depicted in FIG. 31. The circuitry is similar to that of the Type 1 embodiment of FIG. 19 except for the presence of switchable variable delay stages, including stage $A_D$ in amplifier channel A and stage $B_D$ in amplifier channel B. Each stage $A_D$ and $B_D$ can comprise more than one delay (gain) stage. As will be explained, the delay of one of the two stages $A_D$ and $B_D$ is selectively modified by associated respective complementary single bit control signals $CNTR\_A_D$ and $CNTR\_B_D$ so as to introduce a known delay shift in one of the two amplification channels. This delay translates into a phase shift which is added to one channel or the other so that the multipliers M1 and M2 are only required to provide a phase measurement in those regions where measurement accuracy it optimal. For a typical multiplier operating at $f_{ratio}=4$, optimal accuracy is achieved for the following two ranges for the phase angle difference at the inputs to the multipliers ($\Delta\phi_M$): $-150° \leq \Delta\phi_M \leq -30°$ and $+30° \leq \Delta\phi_M \leq +150°$. Thus, stages $A_D$ and $B_D$ are controlled to ensure that the multiplier operation remains in these two ranges, with operation for a phase difference near 0°, +180° and −180° being avoided.

The phase shift $\Delta\phi_{AD}$ introduced by stage $A_D$ is as follows:

$$\Delta\phi_{AD} = \gamma(1 + CNTR\_A_D)*(tdr(A_D, IN1))/f_{ratio}[rad] \quad (35)$$

where $\gamma$ is the number of delay stages to be switched, $CNTR\_A_D$ is the associated control signal and is either a 1 or a 0.

The phase shift $\Delta\phi_{BD}$ introduced by stage $B_D$ is as follows:

$$\Delta\phi_{BD} = \gamma(1 + CNTR\_B_D)*(tdr(B_D, IN2))/f_{ratio}[rad] \quad (36)$$

where $CNTR\_B_D$ is the associated control signal and is the complement of $CNTR\_A_D$.

As will be described, during operation one or the other delay stages $A_D$ or $B_D$ is rendered operational so as to provide a specified delay. In the present example, each delay stage (comprising one or more gain stages), when activated, provides an increase phase shift of $\pi/6$ or 30°. In order to compensate for the added phase shift when calculating $V_{phase}$, the value $\gamma*V_{SAT}$ is either added or subtracted in the calculation.

Each delay stage includes a single stage which is always operational and an additional $\gamma$ number of individual delay stages which are either in-circuit or bypassed. Assuming that each individual stage provides a delay of about $0.7\tau$, the phase shift produced by each stage, assuming saturated operation (since the stages are located near the end of each channel) is as follows:

$$\Delta Phase_{saturated\_stage} = 180 * \tau / (\pi * f_{ratio})[°]$$

$$= 180 * (0.7)/(\pi * 4) = 10°$$

For a 30° phase shift $\gamma$ should be 3 such that the phase shift in each channel can be increased by 30° so that the total phase shift when switching from one channel to the other is 60°. The manner in which the states of delay stages AD and BD are controlled using signals $CNTR\_A_D$ and $CNTR\_B_D$ will be subsequently described in connection with FIGS. 33A and 33B.

The equations previously set forth describing Type 1 (FIG. 19) detector operation can be readily adapted to take into account the additional delay provided by either stage $A_D$ or $B_D$. Modifying equation (23) for $V_{phase}$, the new value of Vphase for $0 \leq \phi \leq \pi$ is as follows:

$$V_{phase} = 2V_{MULT}[(1 - 2\Delta\varphi/\pi) - 2(\Delta\varphi_{AD} - \Delta\varphi_{BD})/\pi) + \qquad (37)$$
$$(\alpha * \beta \text{Log}_{10}(V_{in2}/V_{in1}) + \gamma(\text{CNTR\_A}_D - \text{CNTR\_B}_D))(2\Delta\varphi_S)/\pi]$$

Similarly, modifying equation (24) for $V_{phase}$, the new value of Vphase for $-\pi \leq \phi \leq 0$ is as follows:

$$V_{phase} = 2V_{MULT}[(1 + 2\Delta\varphi/\pi) + 2(\Delta\varphi_{AD} - \Delta\varphi_{BD})/\pi) - \qquad (38)$$
$$(\alpha * \beta \text{Log}_{10}(V_{in2}/V_{in1}) + \gamma(\text{CNTR\_A}_D - \text{CNTR\_B}_D))(2\Delta\varphi_S)/\pi]$$

The values for $V_{sat}$, as is reflected in the last portion of the two expressions of Vphase set forth above, are not changed from the Type 1 embodiment. Those values of $V_{sat}$ are as follows:

for $0 \leq \phi \leq \pi$, $$V_{sat} = -2V_{MULT}[(\Delta\phi_1 + \Delta\phi_2)/\pi] \qquad (39)$$

and for $-\pi \leq \phi \leq 0$, $$V_{sat} = 2V_{MULT}[(\Delta\phi_1 + \Delta\phi_2)/\pi] \qquad (40)$$

Figure 32:
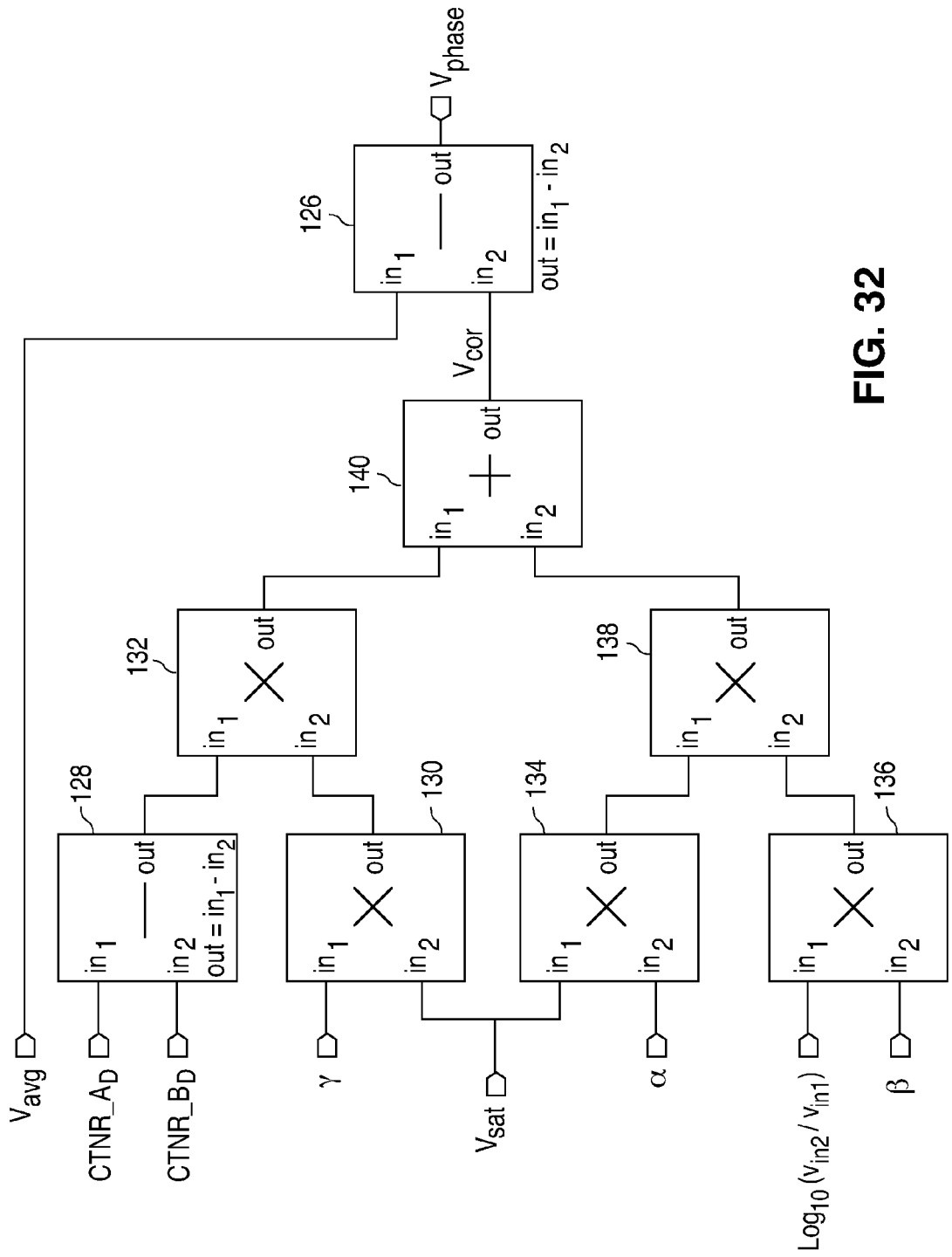
FIG. 32 is a diagram for circuitry used to correct the phase measurement error in the FIG. 31 embodiment phase detector.

The circuitry of FIG. 32 is used to convert the various factors previously discussed to produce $V_{phase}$. One input to the subtractor circuit 126 receives the $V_{avg}$ term of the $V_{phase}$ equation and the other input receives the correction term $V_{cor}$. The single bit CNTR\_$A_D$ and single bit CNTR\_$B_D$ terms are combined by a subtractor circuit so that the output is a +1 if delay CNTR\_$A_D$ is active and a –1 if CNTR\_$B_D$ is active. The $\gamma$ term and the $V_{sat}$ terms are multiplied together by circuit 130 with the sign of the product being controlled by the output of circuit 128 and multiplier 132. $V_{sat}$ is also multiplied by the $\alpha$ term by circuit 134, with the $\text{Log}_{10}(V_{IN2}/V_{IN1})$ and $\beta$ terms being multiplied together by circuit 136. The two products are then multiplied together by circuit 138 and then added with the output of multiplier 132 by adder circuit 140 to produce the correction term $V_{cor}$. Finally, $V_{cor}$ is subtracted from $V_{avg}$ to produce output $V_{phase}$ by subtractor circuit 126. The phase can be calculated using the previously described circuitry of FIG. 23B.

Figure 33A:
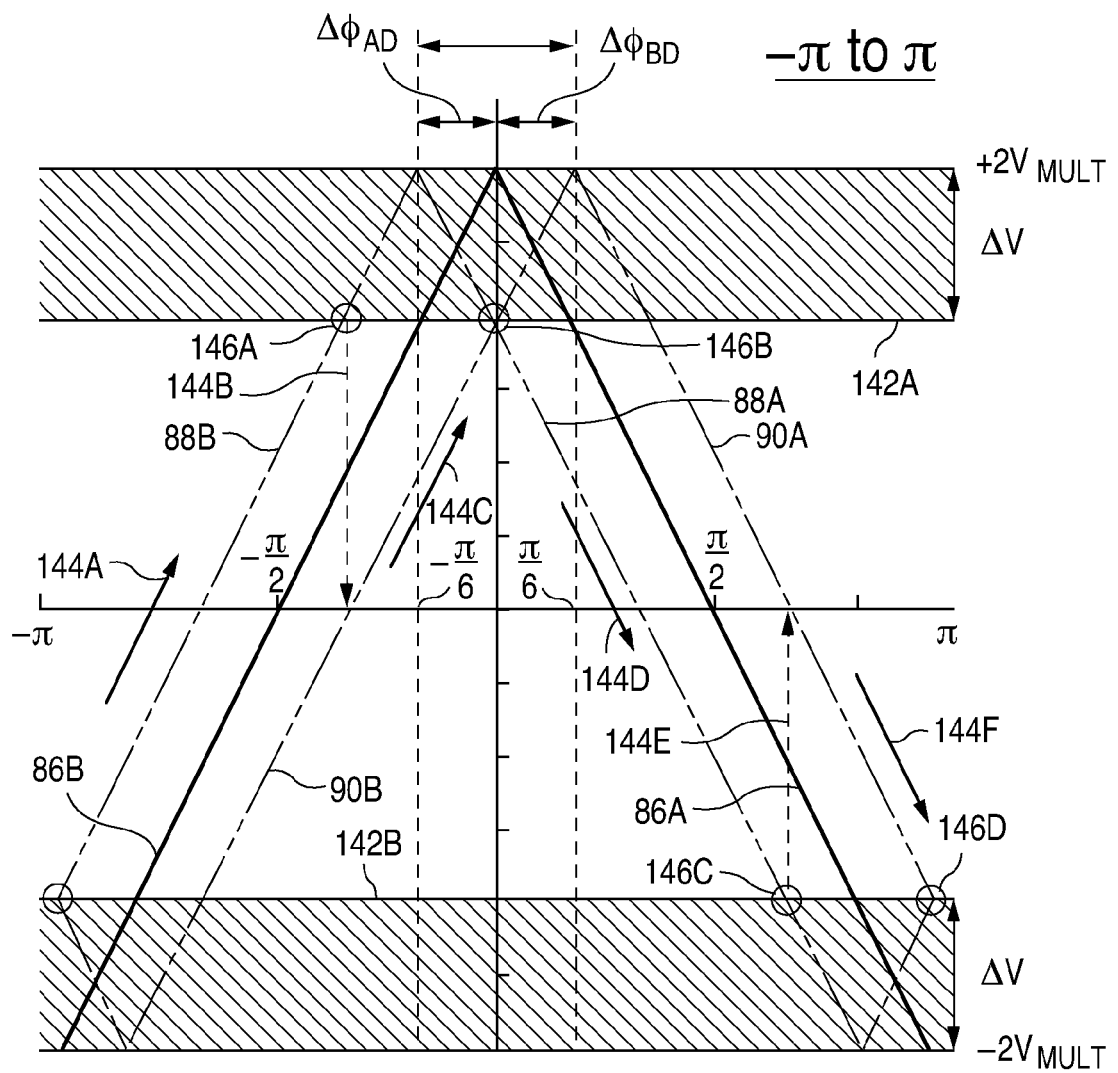
FIGS. 33A and 33B are diagrams illustrating the manner in which delay elements are switched in the FIG. 31 embodiment phase detector to avoid certain regions of multiplier operation.

The manner in which the two delay stages $A_D$ and $B_D$ are controlled is perhaps best illustrated graphically. FIG. 33A shows an ideal phase detector output 86A/86B plotted on a graph having a vertical axis for $V_{phase}$ in units of volts/division and a horizontal axis in $A_{phase}$ in units of radians per division. By way of example, when $V_{phase}$ is at the maximum value of $2V_{MULT}$ the value of $\Delta_{phase}$ is 0 radians. When $V_{phase}$ is zero, $\Delta_{phase}$ is $\pm\pi/2$ radians and when $V_{phase}$ is at a minimum value $A_{phase}$ is $\pm\pi$ radians. As previously noted, an actual conventional phase detector has reduced accuracy near 0 radians and near $\pm\pi$ radians. In accordance with one embodiment of the present invention, a controlled phase delay is introduced in either the A or the B amplifier channel. When delay stage $A_D$ is in an active state (delay stage $B_D$ will be inactive), a delay $\Delta\phi_{AD}$ is introduced into channel A, with the resultant phase detector output being represented by plot 88A/88B. When delay stage $B_D$ is in an active state (delay stage $A_D$ will be inactive), a delay $\Delta\phi_{BD}$ is introduced into channel B, with the resultant phase detector output being represented by plot 90A/90B. As will be seen, the two delay stages are controlled so that phase detector operation never occurs near the reduced accuracy regions near 0 radians and or near $\pm\pi$ radians. Thus, should the actual inputs to multipliers M1 or M2 approach one of the three regions associated with measurement inaccuracy, this condition is sensed and the presently active delay stage is made inactive and the presently inactive stage is made active. The phase shift introduced by this action is such that the inputs to the multipliers M1 or M2 will no longer be operating in an inappropriate region. Compensation circuitry following the multipliers will compensate for the introduced phase shift.

Figure 33B:
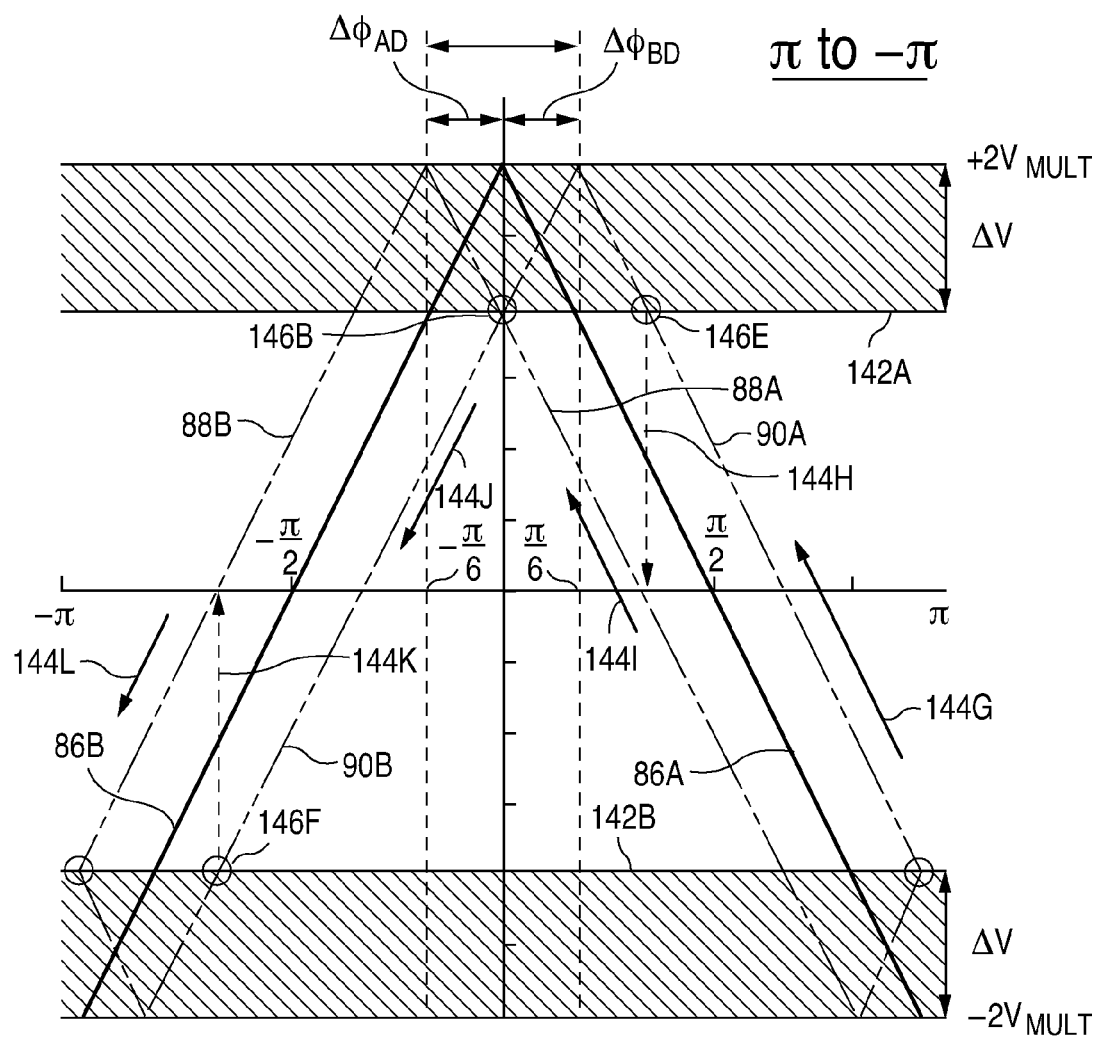

In a first example, phase detector operation will be described for $\Delta\phi$ transitioning from $-\pi$ to $+\pi$ as depicted in FIG. 33A. Next, operation will be described for $\Delta\phi$ transitioning in the opposite direction from $-\pi$ to $-\pi$ as depicted in FIG. 33B. It is necessary to provide initial conditions so that the point of operation on the two Vphase plots 88A/88B and 90A/90B can be determined. As will be seen, the phase detector switches activation of the delay stages $A_D$ and $B_D$ when Vphase is at one of two threshold voltages $V_{switch_{PLUS}}$ (142A of FIG. 33A) and $V_{switch_{MINUS}}$ (142B of FIG. 33A). These values are selected so that the multiplier circuits M1 and M2 only operate, in the present example, in the range of $-150° \leq \Delta\phi \leq -30°$ and $+30° \leq \Delta\phi \leq +150°$.

Referring to FIG. 33A, a $\Delta\phi$ transition from $-\pi$ to $+\pi$ will now be described. Assuming delay stage $A_D$ is active and that $\Delta\phi$ is at $-\pi$ ($-180°$), then $V_{phase}$ plot 88A/88B is relevant to operation. Since plot 88A/88B is offset by $+\pi/6$ ($+30°$), the multipliers actually see a $\Delta\phi$ that is $-5\pi/6$ ($-150°$) rather than $-\pi$ ($-180°$). Thus, the multipliers are operating in the desired high accuracy region rather than the low accuracy region of $-\pi$ ($-180°$). The compensation circuitry of FIG. 32 disposed after the multipliers converts the $+\pi/6$ ($+30°$) measurement back to the correct value of $-\pi$ ($-180°$). As $\Delta\phi$ transitions towards $+\pi$, the $V_{phase}$ value moves along plot 88B in the direction indicated by arrow 144A. As $\Delta\phi$ approaches $-\pi/3$ ($-60°$), the phase detector multiplier actually sees an angle approaching $-\pi/6$ ($-30°$). This is another region of multiplier operation to be avoided as previously noted since it includes the near 0° measurements. However, at this point, the value of Vphase on plot 88B will have increased to threshold voltage $V_{switch_{PLUS}}$ as indicated by point 146A at level 142A. The detection of this event will cause the delay stage $A_D$ to become inactive and delay stage $B_D$ to become active. This creates a total phase shift of $-\pi/3$ ($-60°$) which again will be compensated for by the circuitry of FIG. 32. Now Vphase plot 90A/90B is the relevant plot, with the actual multiplier now operating in a region removed from the $\pm 30°$ region to be avoided. This shift is indicated by arrow 144B.

As $\Delta\phi$ transitions closer to $+\pi$, the movement is along plot 90B as indicated by arrow 144C. Eventually, $\Delta\phi$ will approach the region of the Vphase plot 90B where actual multiplier input is at $-\pi/6$ ($-30°$), a region to be avoided. At this point on plot 90B, the threshold voltage VswitchPLUS (line 142A at point 146B) is again reached thereby causing delay stage $B_D$ to become inactive and delay stage $A_D$ to become active again. A transition from Vphase plot 90B Vphase plot 88A then Occurs.

As $\Delta\phi$ continues to transition closer to $+\pi$, the corresponding Vphase movement is along plot 88A as indicated by arrow 144D. Eventually, the value of $\Delta\phi$ actually applied to the multiplier inputs will approach $5\pi/6$ ($150°$) which is another region of operation to be avoided. When the Vphase reaches $5\pi/6$ ($150°$), the lower threshold voltage $V_{switch_{MINUS}}$ at level 142B is also reached. This event at point 146C will cause delay stage $A_D$ to switch to the inactive state and delay stage $B_D$ to become active again. As indicated by arrow 144E, phase plot 90A replaces phase plot 88A. A further movement of $\Delta\phi$ towards it is indicated by arrow 144F. When $\Delta\phi$ reaches $+\pi$, the actual phase angle at the input to the multipliers is only $5\pi/6$ (150°) so that accurate operation is achieved.

The reverse sequence for $\Delta\phi$ shifting from $+\pi$ to $-\pi$ is illustrated in FIG. 33B. The transition sequence is similar to that for $-\pi$ to $+\pi$ of FIG. 33A in that there are a total of three changes in delay stage operation, but the changes are at different locations. Starting near $+\pi$ and assuming that delay $B_D$ is active, operation is on the phase plot 90A. Once again, accurate operation is achieved since the inputs to the multipliers are actually at $5\pi/6$ (150°). As $\Delta\phi$ transitions towards $-\pi$, movement is along plot 90A as indicated by arrow 144G. Once Vphase reaches threshold 142A at point 146E (Vswitch$_{PLUS}$) where the actual input to the multipliers is approaching $+\pi/6$ (+30°). When the threshold is reached, delay stage $A_D$ becomes active and there is a transition to plot 88A as indicated by arrow 144H. As $\Delta\phi$ moves up plot 88A as indicated by arrow 144I, Vphase eventually again reaches threshold 142A. At this point (146B) delay stage $B_D$ becomes active. As $\Delta\phi$ moves along plot 90B as indicated by arrow 144J, the lower threshold 142B Vswitch$_{MINUS}$ will eventually be reached at point 146F. At this point delay stage $A_D$ becomes active and Vphase transitions to plot 88B as indicated by arrow 144K. $\Delta\phi$ moves along plot 88B as indicated by arrow 144L until the actual multiplier inputs are at $-5\pi/6$ (-150°) which produces an output of $-\pi(-180°)$ after compensation.

The values of thresholds Vswitch$_{PLUS}$ and Vswitch$_{MINUS}$ for switching between delay stages $A_D$ and $B_D$ should be at the appropriate values of Vphase. The maxim value of Vphase is $+2V_{MULT}$, with the threshold voltage Vswitch$_{PLUS}$ being the maximum value less $\Delta V$. The minimum value of Vphase is $-2V_{MULT}$, with the threshold voltage Vswitch$_{MINUS}$ being the minimum value plus $\Delta V$. By inspection of FIG. 33A it can be seen that $\Delta V$ is as follows:

$$\Delta V = 2V_{MULT} * abs[2(\Delta\phi_{AD} - \Delta\phi_{BD})/\pi] \quad (41)$$

Thus, Vswitch$_{PLUS}$ is as follows:

$$Vswitch_{PLUS} = 2V_{MULT} - 2V_{MULT} * abs[2(\Delta\phi_{AD} - \Delta\phi_{BD})/\pi]$$

or $$Vswitch_{PLUS} = 2V_{MULT} - 2V_{MULT} * \gamma * [abs(CNTR\_A_D - CNTR\_B_D)*(2\Delta\phi_S)/\pi] \quad (42)$$

where
$\gamma$ is the number of stages for each delay stage;
CNTR\_$A_D$ and CNTR\_$B_D$ are respective control bits for delay stages $A_D$ and $B_D$; and $$2\Delta\phi_S = \Delta\phi_{AD} - \Delta\phi_{BD}.$$

Thus, $$Vswitch_{PLUS} = 2*V_{MULT} - \gamma * abs(V_{sat}) \quad (43)$$

A similar analysis shows the following:

$$Vswitch_{MINUS} = -2*V_{MULT} + \gamma * abs(V_{sat}) \quad (44)$$

As can be seen from equations (43) and (44), the switching levels Vswitch$_{PLUS}$ and Vswitch$_{MINUS}$ are dependent on $f_{ratio}$ and can be set using $V_{sat}$. Also, the switching points around $0\pi$(point 146B) and around $+\pi$ (point 146D) should be provided with a small amount of hysteresis to prevent any switching between modes due to noise. The other switching points 146A, 146C, 146E and 146F can be shifted the same amount to simplify implementation.

One advantage of the above-described approach for controlling the states of delay stages $A_D$ and $B_D$ is that the phase measurements are continuous. Another approach for controlling the states of delay stages can be used but continuous measurements are not made. That approach is to make a pair of measurement, one with a different one of delay stages $A_D$ and $B_D$ being active. The measurement with the lowest absolute $V_{avg}$ value will be the most accurate, so that the other measurement can be discarded. The lowest absolute $V_{avg}$ will always be outside the undesired region, as long as the implemented phased shift is sufficiently large.

A variation of the above approach is to first determine which delay stage setting provides the most accurate measurement by determining which setting provides the lowest value of $V_{avg}$. Once the optimum setting has been determined, then this setting can be used to make an accurate measurement. The advantage of first determining the lowest value of $V_{avg}$ is due to the fact that it is not necessary to wait for the low pass filter to fully settle in order to make this determination. Once the optimum setting has been determined, then that setting can be used to make an accurate measurement. Thus, the total time is less than when two accurate measurements must be made.

Figure 34A:
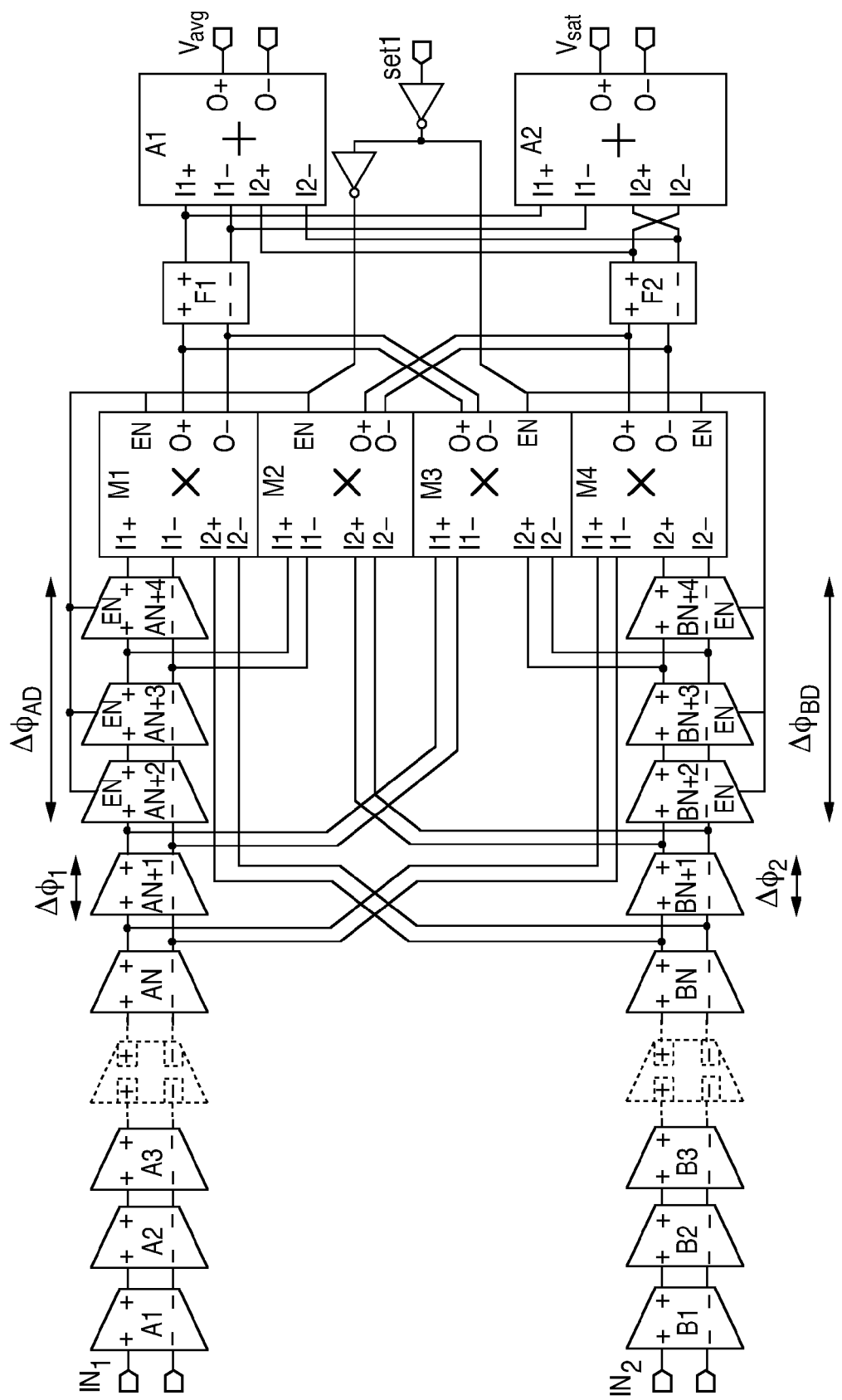
FIGS. 34A to 34C are diagrams of a still further embodiment of the present invention in accordance with another aspect of the present invention.

A still further embodiment, referred to as Type 6, is shown in FIGS. 34A, B and C. This embodiment is similar to the embodiment of FIGS. 33A, B and C except that the controlled delay stages are disposed after the gain stages AN+1 and BN+1 which provide respective phase information $\Delta\phi_1$ and $\Delta\phi_2$ used to provide compensation for delay dispersion due to input amplitude differences. One consequence of this approach is that the number of multipliers must be doubled to M1 to M4. However, all of the gain stages in each channel are identical and provide equal delays so that implementation is easier.

A signal Set1 is used to introduce a delay ($\Delta\phi_{AD}$) in either channel A or a delay ($\Delta\phi_{BD}$) in channel B. Each channel can provide $\gamma$ number of additional delays ($A_{N+2, 3, ...}$ or $B_{N+2, 3, ...}$) depending on the state of Set1. Compensating for the added phase can be provided when calculating $V_{phase}$ by adding or subtracting the value $\gamma * V_{SAT}$.

Figure 34B:
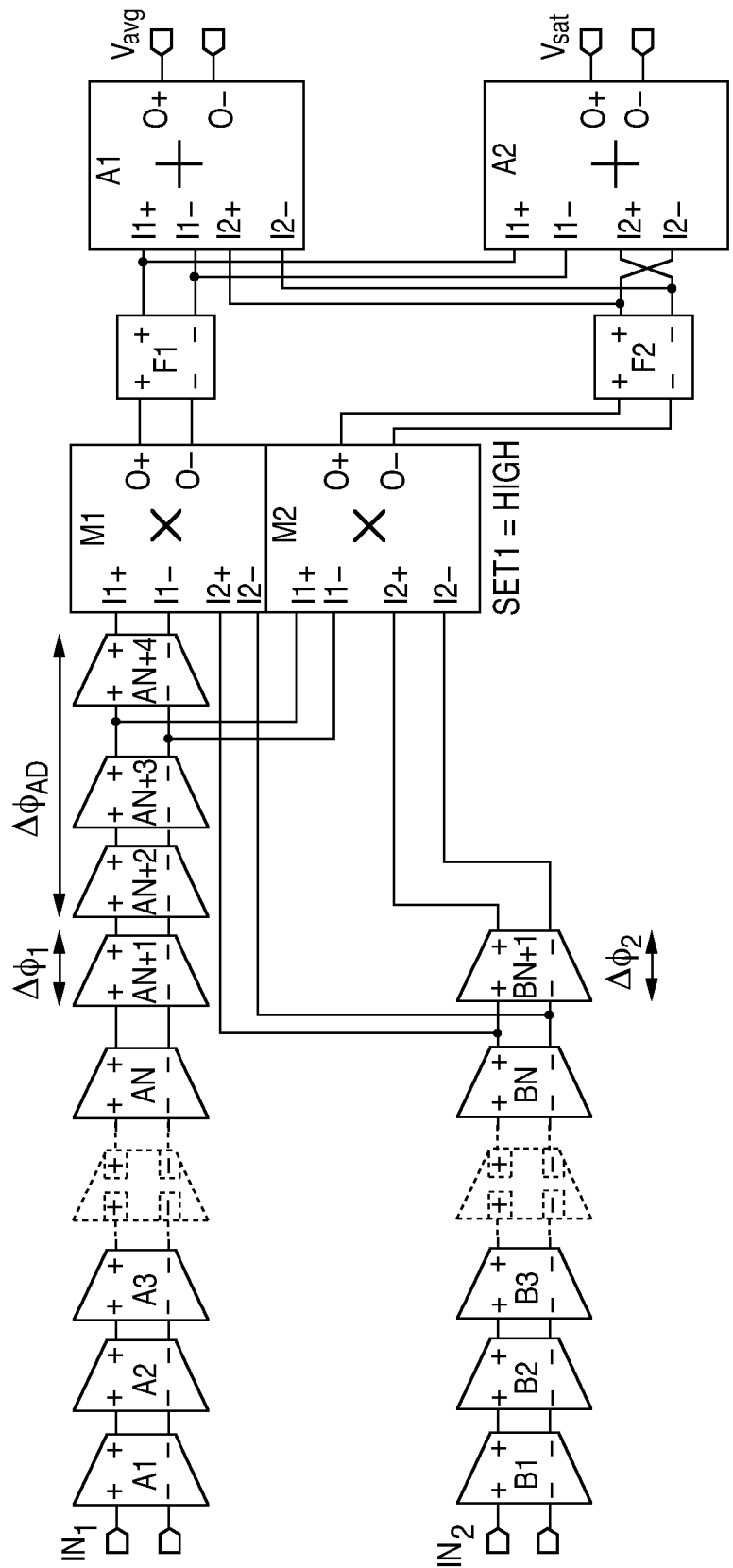

FIG. 34B shows the active components of the FIG. 34A embodiment when Set1 is high. First, multipliers M3 and M4 are disabled as are stages BN+2, BN+3 and BN+4, typically by shutting them down to save power. Thus, none of the connections to M3 and M4 are depicted in FIG. 34B. In this case, stage AN+4 provides two functions including providing part of delay $\Delta\phi_{AD}$ and providing delay dispersion information along with stage BN+1. Thus, the input of stage AN+4 is provided to one input of multiplier M2, with the output of stage BN+1 providing the other input to M2. The input of stage BN+1 is applied to one input of multiplier M1, with the other input of M1 coming from the output of stage AN+4.

Figure 34C:
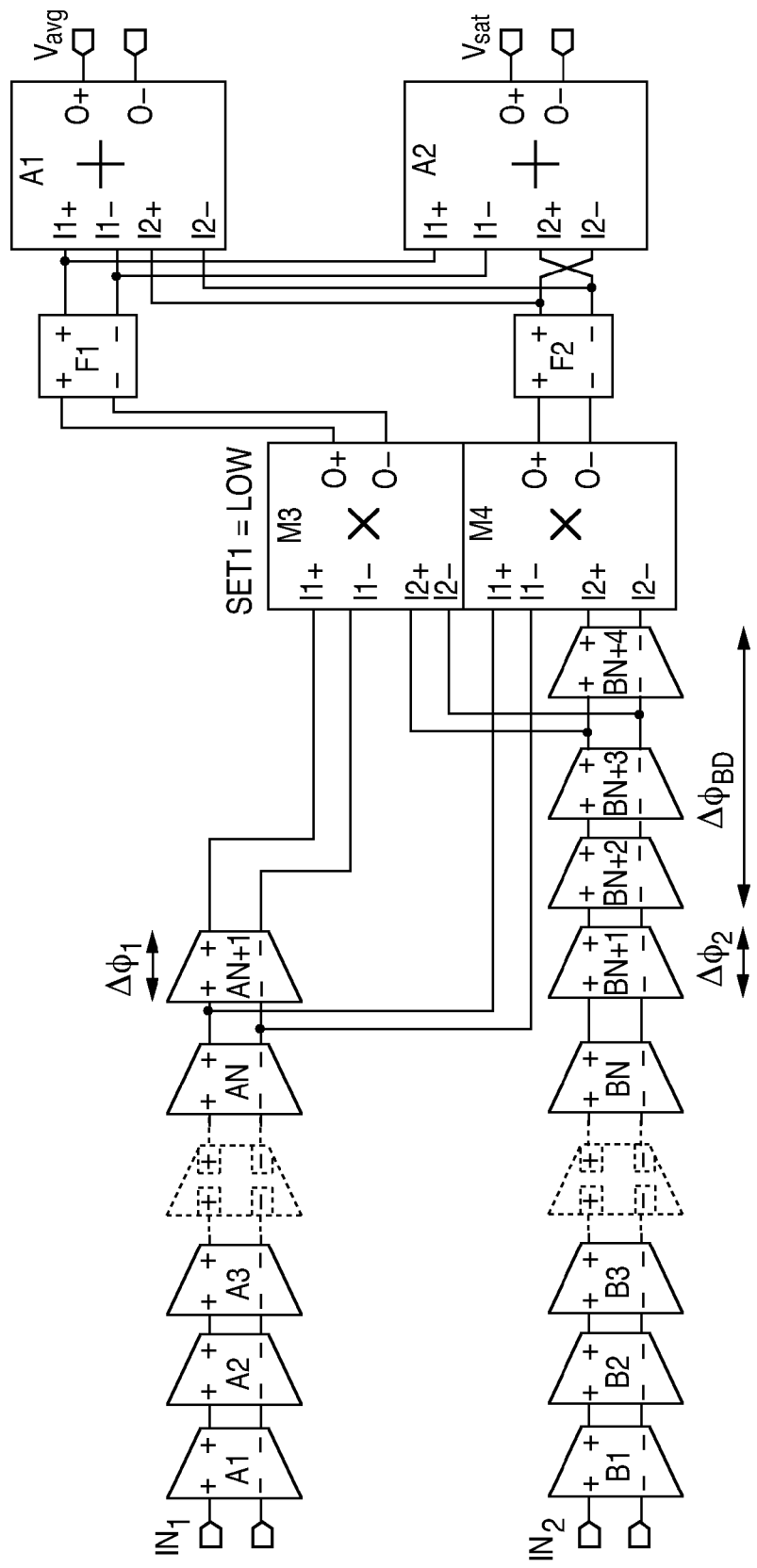

FIG. 34C shows the active components of the FIG. 34A embodiment when Set1 is low. Multipliers M1 and M2 are disabled as are stages AN+2, AN+3 and AN+4, with M3 and M4 being operative. Stage BN+4 provides two functions including providing part of delay $\Delta\phi_{BD}$ and providing delay dispersion information along with stage AN+1. Thus, the input of stage BN+4 is provided to one input of multiplier M3, with the output of stage AN+1 providing the other input to M3. The input of stage AN+1 is applied to one input of multiplier M4, with the other input to M4 coming from the output of stage BN+4.

The equations (22) and (23) previously set forth in connection with the Type 1 embodiment of FIG. 19 can be readily adapted to the FIG. 34A embodiment to take into account the additional delay. For the case where $0 \leq \Delta\phi \leq \pi$, $V_{phase}$ can be expressed as follows:

$$V_{phase} = 2V_{MULT}[(1 - 2\Delta\varphi/\pi) - \gamma*(2*Set1 - 1)(2\Delta\varphi_S)/\pi + \quad (45)$$
$$(\alpha*\beta\text{Log}_{10}(V_{in2}/V_{in1}) + \gamma*(2*Set1 - 1))*(2\Delta\varphi_S)/\pi]$$

For the case where $-\pi \leq \Delta\phi \leq 0$ $V_{phase}$ is as follows:

$$V_{phase} = 2V_{MULT}[(1 + 2\Delta\varphi/\pi) + \gamma*(2*Set1 - 1)(2\Delta\varphi_S)/\pi - \quad (46)$$
$$(\alpha*\beta\text{Log}_{10}(V_{in2}/V_{in1}) + \gamma*(2*Set1 - 1))*(2\Delta\varphi_S)/\pi]$$

The values of $V_{sat}$ are unchanged from the Type 1 embodiment. For $0 \leq \Delta\phi \leq \pi$, $V_{sat}$ is as follows:

$$V_{sat} = -2V_{MULT}[(\Delta\phi_1 + \Delta\phi_2)/\pi] \quad (47)$$

For $\pi \leq \Delta\phi \leq 0$, $V_{sat}$ is as follows:

$$V_{sat} = 2V_{MULT}[(\Delta\phi_1 + \Delta\phi_2)/\pi] \quad (48)$$

Figure 35:
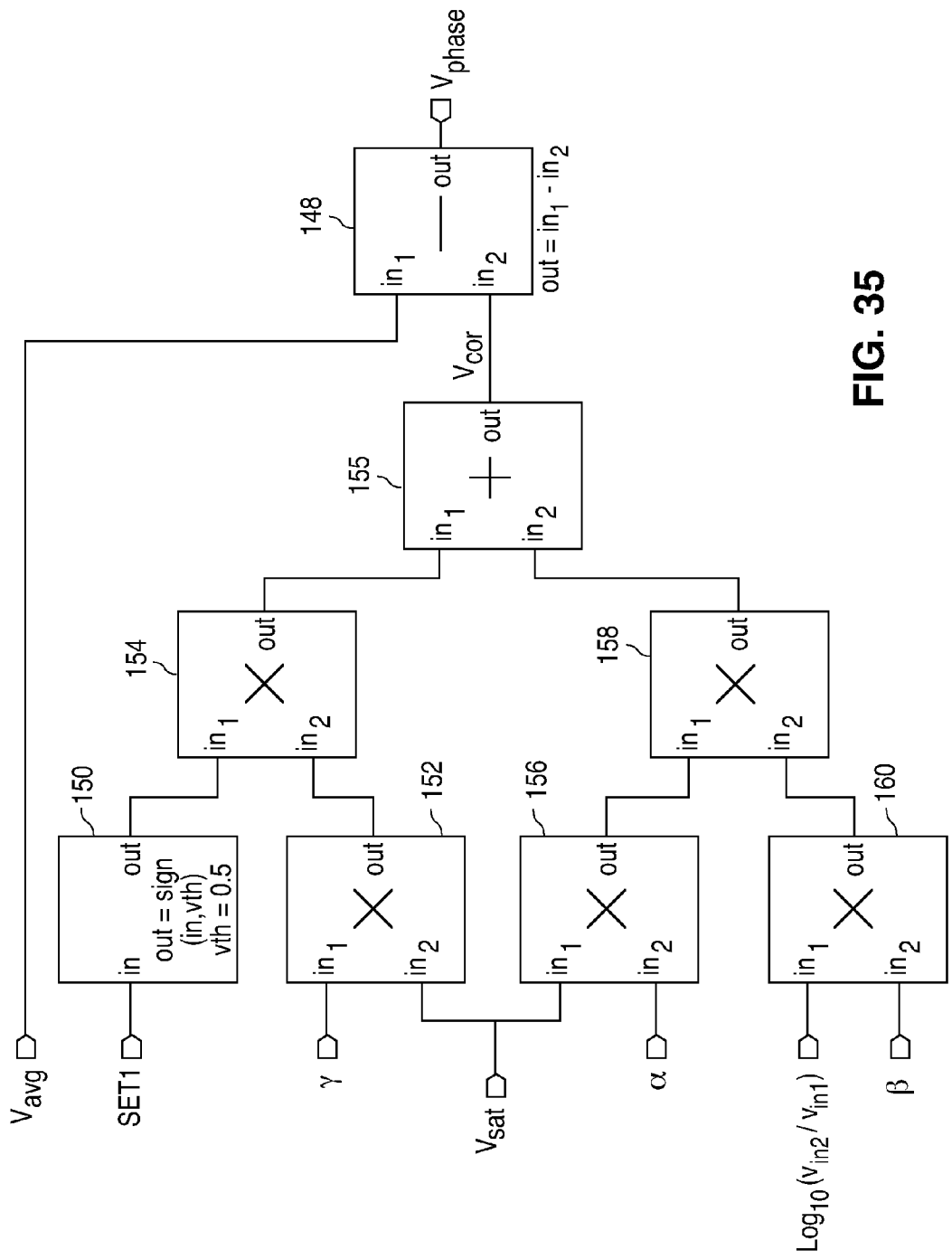
FIG. 35 is a diagram for circuitry used to correct the phase measurement error in the FIGS. 34A to 34C embodiment.

FIG. 35 is a simplified diagram for producing $V_{phase}$. The $V_{avg}$ term produced by adder A1 of FIGS. 34A, B and C is provided to an input of a subtractor circuit 148. For the case where $0 \leq \Delta\phi \leq \pi$, $V_{avg}$ can be expressed as follows:

$$V_{avg} = 2V_{MULT}[(1-2\Delta\phi\pi)-\gamma*(2*Set1-1)(2\Delta\phi_s)/\pi] \quad (49)$$

For the case where $-\pi \leq \Delta\phi \leq 0$, $V_{avg}$ can be expressed as follows:

$$V_{avg} = 2V_{MULT}[(1+2\Delta\phi/\pi)+\gamma*(2*Set1-1)(2\Delta\phi_s)/\pi] \quad (50)$$

A correction value $V_{cor}$ is provided to another input of subtractor circuit 148 to produce $V_{phase}$. $V_{cor}$ is produced first by extracting the sign of Set1 as indicated by element 150. The output of element 150 is +1 if Set1>0.5 and is −1 if Set1<0.5. The value of γ (3 in the present example) is multiplied by $V_{sat}$ by multiplier 152. The product is multiplied by the output of element 150 to produce a further product by multiplier 154 which is sent to one input of an adder circuit 155. $V_{sat}$ is also sent to another multiplier 156 where it is multiplied by the α term, with the product being sent to a still further multiplier 158. The log term and the β terms are multiplied together by multiplier 160, where the product is then sent to the other input of multiplier 158. The outputs of multipliers 154 and 158 are added by adder 155 to produce $V_{cor}$, the correction voltage subtracted from $V_{avg}$ to produce $V_{phase}$.

Thus, various embodiments of the present invention have been disclosed. Although these embodiments have been described in some detail, it is to be understood that certain changes can be made by those skilled in the art without departing from the spirit and scope of the present invention as defined by the appended claims.

What is claimed is:

1. A phase detection system for providing a phase signal indicative of a phase difference between first and second input signals, said system comprising:
a first amplification channel which includes a plurality of amplifier gain stages followed by a delay segment including a plurality of amplifier delay stages, with the first amplification channel having an input for receiving one of the first and second input signals;
a second amplification channel which includes a plurality of amplifier gain stages followed by a delay segment including a plurality of amplifier delay stages, with the second amplification channel having an input for receiving another one of the first and second input signals;
a multiplier arrangement including first, second, third and fourth multiplier circuits, the multiplier arrangement coupled to receive an output of the first amplification channel and an output of the second amplification channel;
switching circuitry configured to switch between
a first state where an output of and an input to a final amplifier delay stage of the first amplification channel are coupled to respective first inputs of the first and second multiplier circuits, and where an input to and an output of a selected amplifier delay stage other than the final amplifier delay stage of the second amplification channel are coupled to respective second inputs of the first and second multiplier circuits, and
a second state where an output of and an input to a final amplifier delay stage of the second amplification channel are coupled to respective first inputs of the third and fourth multiplier circuits, and where an input to and an output of a selected amplifier delay stage other than the final amplifier delay stage of the first amplification channel are coupled to respective second inputs of the third and fourth multiplier circuits;
the multiplier arrangement and the switching circuitry configured to produce an uncompensated phase signal output relating to a phase difference between the first and second input signals; and
compensation circuitry configured to receive a magnitude signal indicative of relative magnitudes of the first and second input signals and to produce the phase signal from the uncompensated phase signal using at least the magnitude signal.

2. The phase detection system of claim 1 wherein the compensation circuitry is further configured to produce the phase signal from the uncompensated phase signal using at least a propagation delay signal extracted from at least one amplifier delay stage of one of the first and second amplification channels.

3. The phase detection system of claim 2 wherein the propagation delay signal is extracted from the selected amplifier delay stage of the first amplification channel and from the selected amplifier delay stage of the second amplification channel.

4. The phase detection system of claim 2 wherein the propagation delay signal is extracted from the selected amplifier delay stages of the first and second amplification channels.

5. The phase detection system of claim 2 wherein the first, second, third and fourth multiplier circuits each has disfavored operating ranges and wherein the phase detection system further includes control circuitry configured to switch the switching circuitry segments between the first and second states so as to reduce operation of the first, second, third and fourth multiplier circuits in the disfavored operating ranges.

6. The phase detection system of claim 1 where when the switching circuitry is in the first state, the third and fourth multiplier circuits are disabled and when the switching circuitry is in the second state, the first and second multiplier circuits are disabled.

7. A phase detection system for providing a phase signal indicative of a phase difference between first and second input signals, said system comprising:

a first amplification channel which includes at least one amplifier gain stage followed by a delay segment comprising a plurality of amplifier delay stages, with the first amplification channel having an input for receiving the first input signal;

a second amplification channel which includes at least one amplifier gain stage followed by a delay segment comprising a plurality of amplifier delay stages, with the second amplification channel having an input for receiving the second input signal;

first, second, third and fourth multiplier circuits, each having first and second inputs and an output;

switching circuitry switchable between a first state where an output of and an input to a final amplifier delay stage of the delay segment of the first amplification channel are coupled to the respective first inputs of the first and second multiplier circuits and where an input to and an output of a selected amplifier delay stage other than the final amplifier delay stage of the second amplification channel are coupled to the respective second inputs of the first and second multiplier circuits and a second state where an input to and an output of a final amplifier stage of the delay segment of the second amplification channel are coupled to the respective first inputs of the third and fourth multiplier circuit, and where an output of and an input to a selected amplifier delay stage other than the final amplifier delay stage of the first amplification channel are coupled to the respective second inputs of the third and fourth multiplier circuits and, wherein the phase signal indicative of a phase difference between the first and second input signals is derived from the outputs of the first, second, third and fourth multiplier circuits.

8. The phase detector system of claim 7, wherein the multiplier circuits and the switching circuitry are configured to produce an uncompensated phase signal output relating to a phase difference between the first and second input signals; and further including compensation circuitry which receives a magnitude signal indicative of relative magnitudes of the first and second input signals and wherein the compensation circuitry is configured to produce the phase signal from the uncompensated phase signal utilizing, at least in part, the magnitude signal.

9. The phase detector system of claim 8 wherein the compensation circuitry is further configured to produce the phase signal utilizing, at least in part, propagation delay information derived from the first and second amplification channels.

10. The phase detector system of claim 9 wherein the first, second, third and fourth multiplier circuits each have disfavored regions of operation and wherein the phase detector system further includes control circuitry for switching the switching circuitry between the first and second states so as to reduce operation of the first, second, third and fourth multiplier circuits in the disfavored operating range.

* * * * *